United States Patent
Lee et al.

(10) Patent No.: US 12,087,793 B2
(45) Date of Patent: Sep. 10, 2024

(54) IMAGE SENSOR INCLUDING AN ANTI-REFLECTION ELEMENT AND ELECTRONIC APPARATUS INCLUDING THE SAME

(71) Applicant: SAMSUNG ELECTRONICS CO., LTD., Suwon-si (KR)

(72) Inventors: Sangyun Lee, Yongin-si (KR); Sookyoung Roh, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/993,639

(22) Filed: Nov. 23, 2022

(65) Prior Publication Data

US 2023/0170365 A1 Jun. 1, 2023

(30) Foreign Application Priority Data

Nov. 29, 2021 (KR) .................. 10-2021-0167686

(51) Int. Cl.
*H01L 27/146* (2006.01)

(52) U.S. Cl.
CPC .... *H01L 27/14623* (2013.01); *H01L 27/1462* (2013.01); *H01L 27/14621* (2013.01); *H01L 27/14625* (2013.01); *H01L 27/14627* (2013.01); *H01L 27/1463* (2013.01)

(58) Field of Classification Search
None
See application file for complete search history.

(56) References Cited

U.S. PATENT DOCUMENTS

| | | | |
|---|---|---|---|
| 5,726,805 A * | 3/1998 | Kaushik | G02B 5/201 359/590 |
| 8,289,422 B2 | 10/2012 | Hiramoto et al. | |
| 2008/0011937 A1 | 1/2008 | Toshikiyo | |
| 2008/0272449 A1 | 11/2008 | Inaba et al. | |
| 2009/0250594 A1* | 10/2009 | Tanaka | H01L 27/14685 438/70 |
| 2011/0007179 A1 | 1/2011 | Hiramoto et al. | |

(Continued)

FOREIGN PATENT DOCUMENTS

| | | |
|---|---|---|
| EP | 3 745 459 A1 | 12/2020 |
| EP | 3 812 801 A1 | 4/2021 |

(Continued)

OTHER PUBLICATIONS

Communication issued Mar. 27, 2023 by the European Patent Office in counterpart European Patent Application No. 22208793.4.

(Continued)

*Primary Examiner* — Jennifer D Bennett
*Assistant Examiner* — Erin R Garber
(74) *Attorney, Agent, or Firm* — Sughrue Mion, PLLC

(57) ABSTRACT

An image sensor includes: a sensor substrate including a plurality of first pixels configured to sense light of a first wavelength and a plurality of second pixels configured to sense light of a second wavelength; and an anti-reflection element provided on the sensor substrate, wherein the anti-reflection element includes a plurality of low-refractive index patterns and a high-refractive index layer provided between the plurality of low-refractive index patterns and the sensor substrate.

20 Claims, 55 Drawing Sheets

(56) References Cited

U.S. PATENT DOCUMENTS

| | | | |
|---|---|---|---|
| 2012/0061553 A1* | 3/2012 | Yokogawa | H01L 27/14621 250/208.1 |
| 2012/0206637 A1 | 8/2012 | Hiramoto et al. | |
| 2019/0214418 A1* | 7/2019 | Sasaki | H01L 27/14621 |
| 2019/0244993 A1* | 8/2019 | Yamaguchi | H01L 27/14605 |
| 2020/0075656 A1 | 3/2020 | Lee et al. | |
| 2020/0344430 A1* | 10/2020 | Wang | H01L 27/14621 |
| 2021/0014394 A1* | 1/2021 | Han | G02B 5/286 |
| 2021/0126032 A1 | 4/2021 | Roh et al. | |
| 2021/0126035 A1 | 4/2021 | Roh et al. | |
| 2021/0134868 A1* | 5/2021 | Tsujio | H01L 27/14618 |
| 2021/0183920 A1* | 6/2021 | Lee | H01L 27/14605 |
| 2021/0191141 A1* | 6/2021 | Park | G02B 27/288 |
| 2021/0265408 A1 | 8/2021 | Huang et al. | |
| 2021/0288095 A1* | 9/2021 | Delga | H01L 27/1465 |
| 2022/0165770 A1 | 5/2022 | Ogasahara et al. | |
| 2023/0113261 A1* | 4/2023 | Augur | H01L 23/53295 257/734 |

FOREIGN PATENT DOCUMENTS

| | | |
|---|---|---|
| JP | 2006261238 A | 9/2006 |
| JP | 2008258367 A | 10/2008 |
| KR | 10-2020-0013572 A | 2/2020 |
| KR | 10-2021-0048401 A | 5/2021 |
| KR | 10-2021-0127159 A | 10/2021 |
| WO | 2006046421 A1 | 5/2006 |

OTHER PUBLICATIONS

Communication issued Apr. 20, 2023 by the Korean Intellectual Property Office in counterpart Korean Patent Application No. 10-2021-0167686.

* cited by examiner

IMAGE SENSOR INCLUDING AN ANTI-REFLECTION ELEMENT AND ELECTRONIC APPARATUS INCLUDING THE SAME

CROSS-REFERENCE TO RELATED APPLICATIONS

This application is based on and claims priority under 35 U.S.C. § 119 to Korean Patent Application No. 10-2021-0167686, filed on Nov. 29, 2021, in the Korean Intellectual Property Office, the disclosure of which is incorporated by reference herein in its entirety.

BACKGROUND

1. Field

The disclosure relates to an image sensor and an electronic apparatus including the same.

2. Description of the Related Art

Image sensors generally sense the color of incident light by using a color filter. However, a color filter may have low light utilization efficiency because the color filter absorbs light of colors other than the intended color of light. For example, when an RGB color filter is used, only ⅓ of the incident light is transmitted therethrough and the other part of the incident light, that is, ⅔ of the incident light, is absorbed. Thus, the light utilization efficiency is only about 33%. Thus, in a color display apparatus or a color image sensor, most light loss occurs in the color filter. Also, an image sensor includes multiple layers having different refractive indices from one another, and incident light may be reflected by an interfacial layer. In order to improve the light utilization efficiency of the image sensor, the image sensor needs to have a low reflectivity with respect to the incident light.

SUMMARY

One or more example embodiments include an image sensor having a low reflectivity and an improved quantum efficiency and an electronic apparatus including the image sensor.

One or more example embodiments include an image sensor manufactured at low costs and an electronic apparatus including the image sensor.

However, the objectives are not limited to the above disclosure.

Additional aspects will be set forth in part in the description which follows and, in part, will be apparent from the description, or may be learned by practice of the presented embodiments of the disclosure.

According to an aspect of an example embodiment, an image sensor includes: a sensor substrate including a plurality of first pixels sensing light of a first wavelength and a plurality of second pixels sensing light of a second wavelength; and an anti-reflection element provided on the sensor substrate, wherein the anti-reflection element includes a plurality of low-refractive index patterns and a high-refractive index layer provided between the plurality of low-refractive index patterns and the sensor substrate.

A thickness of the high-refractive index layer may be in a range from about 5 nm to about 50 nm.

The sensor substrate may include a first region on which light is incident at a first chief ray angle (CRA), and a second region on which light is incident at a second CRA that is greater than the first CRA, an arrangement period and a fill factor of the plurality of low-refractive index patterns on the second region are greater than an arrangement period and a fill factor of the plurality of low-refractive index patterns on the first region, respectively, and the fill factor of the plurality of low-refractive index patterns is defined as a ratio of a width of the low-refractive index pattern to the arrangement period of the plurality of low-refractive index patterns.

The image sensor may further include a color separating lens array configured to condense the light of the first wavelength on the plurality of first pixels after changing a phase of the light of the first wavelength and configured to condense the light of the second wavelength on the plurality of second pixels after changing a phase of the light of the second wavelength.

The color separating lens array may be provided between the sensor substrate and the anti-reflection element.

The anti-reflection element may be provided between the color separating lens array and the sensor substrate.

The image sensor may further include a color filter array provided between the anti-reflection element and the color separating lens array, wherein the color filter array may include: a plurality of first color filters arranged to respectively correspond to the plurality of first pixels and configured to selectively transmit the light of the first wavelength; and a plurality of second color filters arranged to respectively correspond to the plurality of second pixels and configured to selectively transmit the light of the second wavelength.

The color separating lens array may include a plurality of nanoposts and a peripheral material layer surrounding the plurality of nanoposts, and the plurality of nanoposts and the plurality of low-refractive index patterns may be aligned with each other in a direction perpendicular to an upper surface of the sensor substrate.

The color separating lens array may include a plurality of nanoposts and a peripheral material layer surrounding the plurality of nanoposts, and the plurality of nanoposts and the plurality of low-refractive index patterns may be arranged to be deviated from each other in a direction perpendicular to an upper surface of the sensor substrate.

The color separating lens array may include a lower array and an upper array provided on the lower array, and each of the lower array and the upper array may include a plurality of nanoposts and a peripheral material layer surrounding the plurality of nanoposts.

The plurality of nanoposts of the upper array and the plurality of low-refractive index patterns may be aligned with each other in a direction perpendicular to an upper surface of the sensor substrate.

The plurality of low-refractive index patterns may include $SiO_2$, and the high-refractive index layer may include at least one from AlO, SiN, and HfO.

The image sensor may further include a plurality of cell isolation films provided on each of the plurality of first pixels and the plurality of second pixels.

The cell isolation films provided on corresponding first pixels or second pixels, which are at a center portion of the sensor substrate, may be respectively on centers of corresponding pixels, and the cell isolation films provided on corresponding first pixels or second pixels, which are at an edge portion of the sensor substrate, may be respectively shifted toward the center portion of the sensor substrate from centers of corresponding pixels.

According to another embodiment, an image sensor includes: a sensor substrate including a plurality of first pixels sensing light of a first wavelength and a plurality of second pixels sensing light of a second wavelength; and an anti-reflection element provided on the sensor substrate, wherein the anti-reflection element includes a low-refractive index layer having a plurality of anti-reflection holes, and a high-refractive index layer provided between the low-refractive index layer and the sensor substrate.

A thickness of the high-refractive index layer may be in a range from about 5 nm to about 50 nm.

The sensor substrate may include a first region on which light is incident at a first chief ray angle (CRA), and a second region on which light is incident at a second CRA that is greater than the first CRA, an arrangement period and a fill factor of the plurality of anti-reflection holes in the second region are greater than an arrangement period and a fill factor of the plurality of anti-reflection holes in the first region, respectively, and the fill factor of the plurality of anti-reflection holes may be defined as a ratio of a width of the anti-reflection hole to the arrangement period of the plurality of anti-reflection holes.

According to another embodiment, an electronic apparatus includes: an image sensor for converting an optical image into an electrical signal; a processor configured to control operations of the image sensor and to store and output a signal generated by the image sensor; and a lens assembly for providing light to the image sensor, wherein the image sensor includes: a sensor substrate including a plurality of first pixels sensing light of a first wavelength and a plurality of second pixels sensing light of a second wavelength; and an anti-reflection element provided on the sensor substrate, and the anti-reflection element includes a plurality of low-refractive index patterns and a high-refractive index layer provided between the plurality of low-refractive index patterns and the sensor substrate.

A thickness of the high-refractive index layer may be in a range from about 5 nm to about 50 nm.

The sensor substrate may include a first region on which light is incident at a first chief ray angle (CRA), and a second region on which light is incident at a second CRA that is greater than the first CRA, an arrangement period and a fill factor of the plurality of low-refractive index patterns on the second region are greater than an arrangement period and a fill factor of the plurality of low-refractive index patterns on the first region, respectively, and the fill factor of the plurality of low-refractive index patterns is defined as a ratio of a width of the low-refractive index pattern to the arrangement period of the plurality of low-refractive index patterns.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
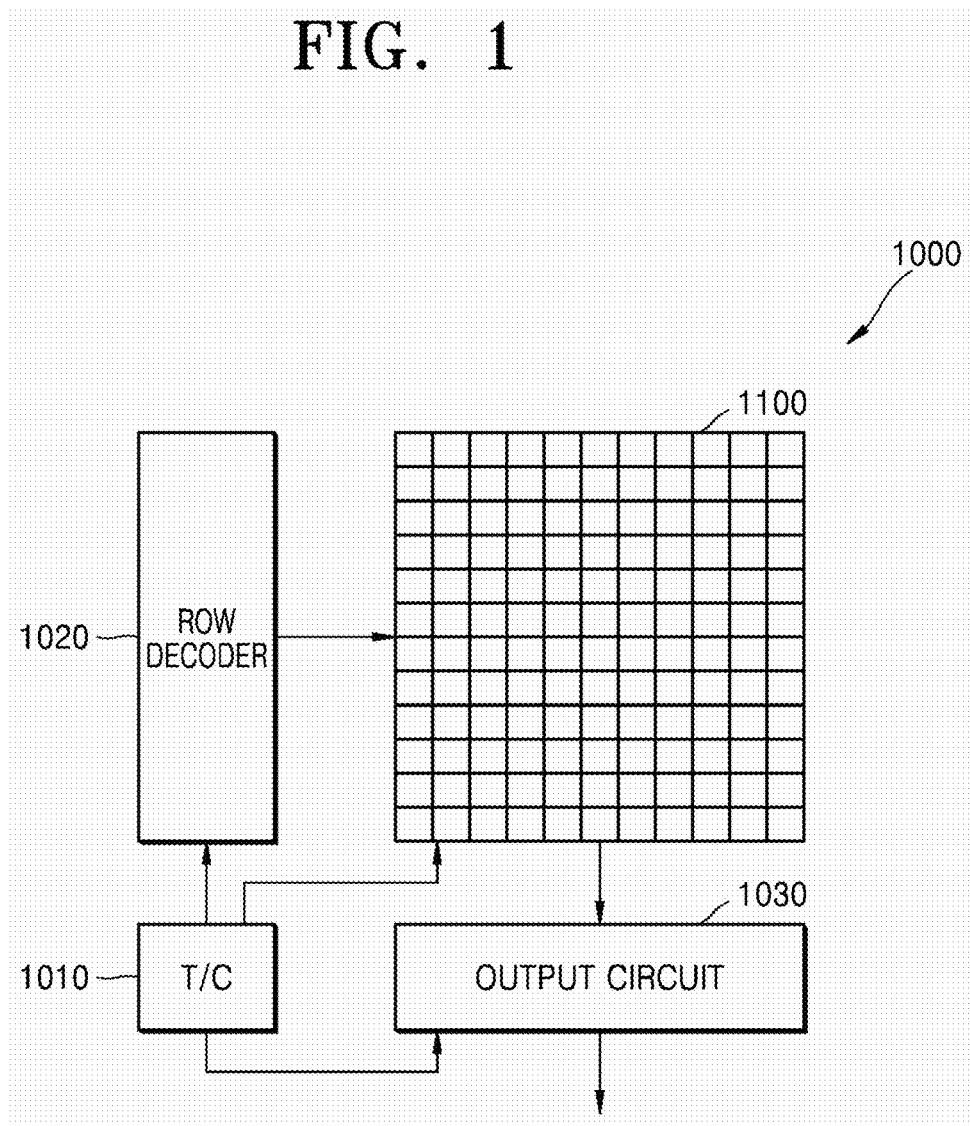
FIG. 1 is a block diagram of an image sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects of the disclosure. As used herein, the term "and/or" includes any and all combinations of one or more of the associated listed items. Expressions such as "at least one of," when preceding a list of elements, modify the entire list of elements and do not modify the individual elements of the list.

Hereinafter, one or more example embodiments of the disclosure will be described in detail with reference to accompanying drawings. In the drawings, like reference numerals denote like components, and sizes of components in the drawings may be exaggerated for convenience of explanation. The embodiments of the disclosure are capable of various modifications and may be embodied in many different forms.

Hereinafter, it will be understood that when a layer, region, or component is referred to as being "above" or "on" another layer, region, or component, it may be in contact with and directly on the other layer, region, or component, and intervening layers, regions, or components may be present.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", etc. provided herein indicates a unit performing at least one function or operation.

Hereinafter, "at least one of a, b, and c" includes 'only a', 'only b', 'only c', 'a and b', 'a and c', 'b and c', or 'a, b, and c'.

Figure 2:
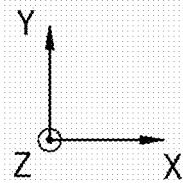
FIG. 2 is a diagram showing an example of a pixel arrangement in a pixel array of FIG. 1.

FIG. 1 is a block diagram of an image sensor 1000 according to an example embodiment. FIG. 2 is a diagram showing an example of a pixel arrangement in a pixel array 1100 of FIG. 1.

Referring to FIG. 1, the image sensor 1000 may include a pixel array 1100, a timing controller 1010, a row decoder 1020, and an output circuit 1030. The image sensor 1000 may include, for example, a charge-coupled device (CCD) image sensor or a complementary metal oxide semiconductor (CMOS) image sensor.

The pixel array 1100 includes pixels that are two-dimensionally arranged in a plurality of rows and a plurality of columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a column decoder and a plurality of ADCs disposed respectively for the columns in the pixel array 1100 or one ADC disposed at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and/or the output circuit 1030.

The pixel array 1100 may include a plurality of pixels that sense light of different wavelengths. The pixel arrangement may be implemented in various ways. Hereinafter, an example of the pixel arrangement will be described with reference to FIG. 2.

FIG. 2 shows a Bayer pattern that is generally adopted in the image sensor 1000. One unit pattern includes four quadrant regions, and first through fourth quadrants may be a blue pixel B, a green pixel G, a red pixel R, and another green pixel G, respectively. The unit patterns may be repeatedly and two-dimensionally arranged in a first direction (X direction) and a second direction (Y direction). In other words, two green pixels G are arranged in one diagonal direction and one blue pixel B and one red pixel R are arranged in another diagonal direction in a unit pattern of a 2×2 array. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged in a second direction. Hereinafter, for illustrative purposes, it will be described that the pixel array 1100 of the image sensor 1000 has a Bayer pattern, but the operating principles may be applied to other patterns of pixel arrangement than the Bayer pattern.

Figure 3:
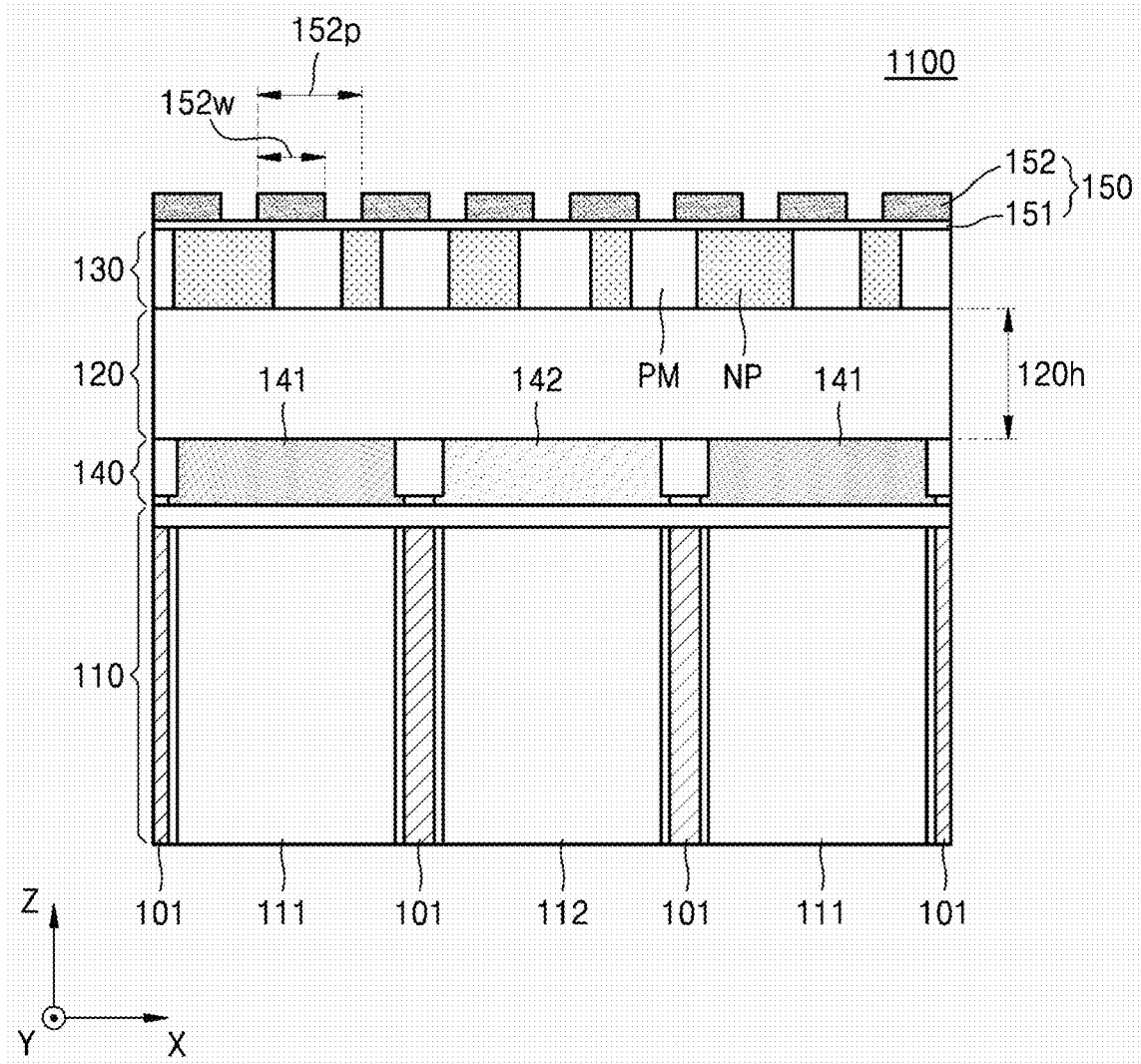
FIGS. 3 and 4 are cross-sectional views of a pixel arrangement in an image sensor according to an example embodiment.
Figure 4:
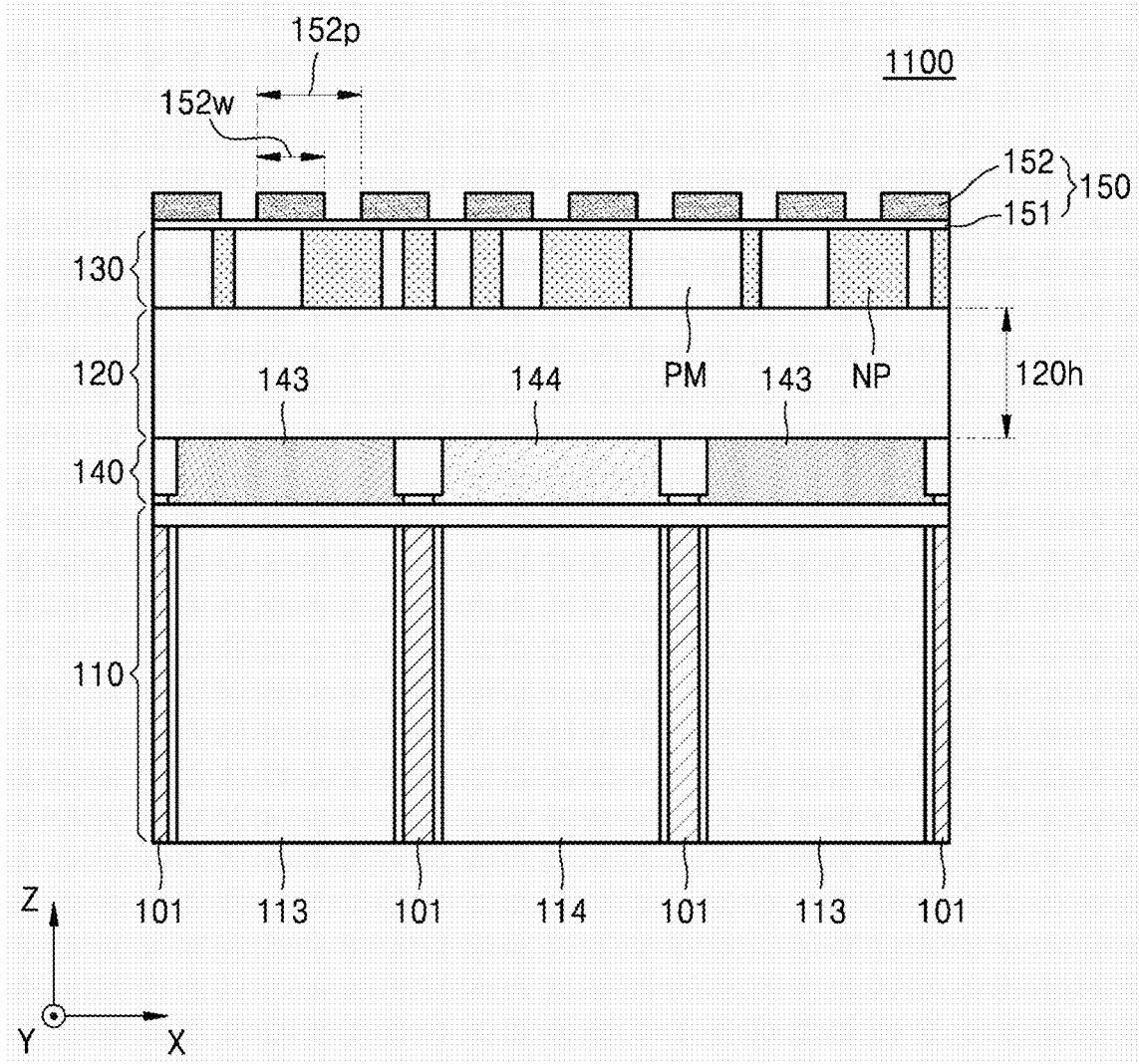
Figure 5:
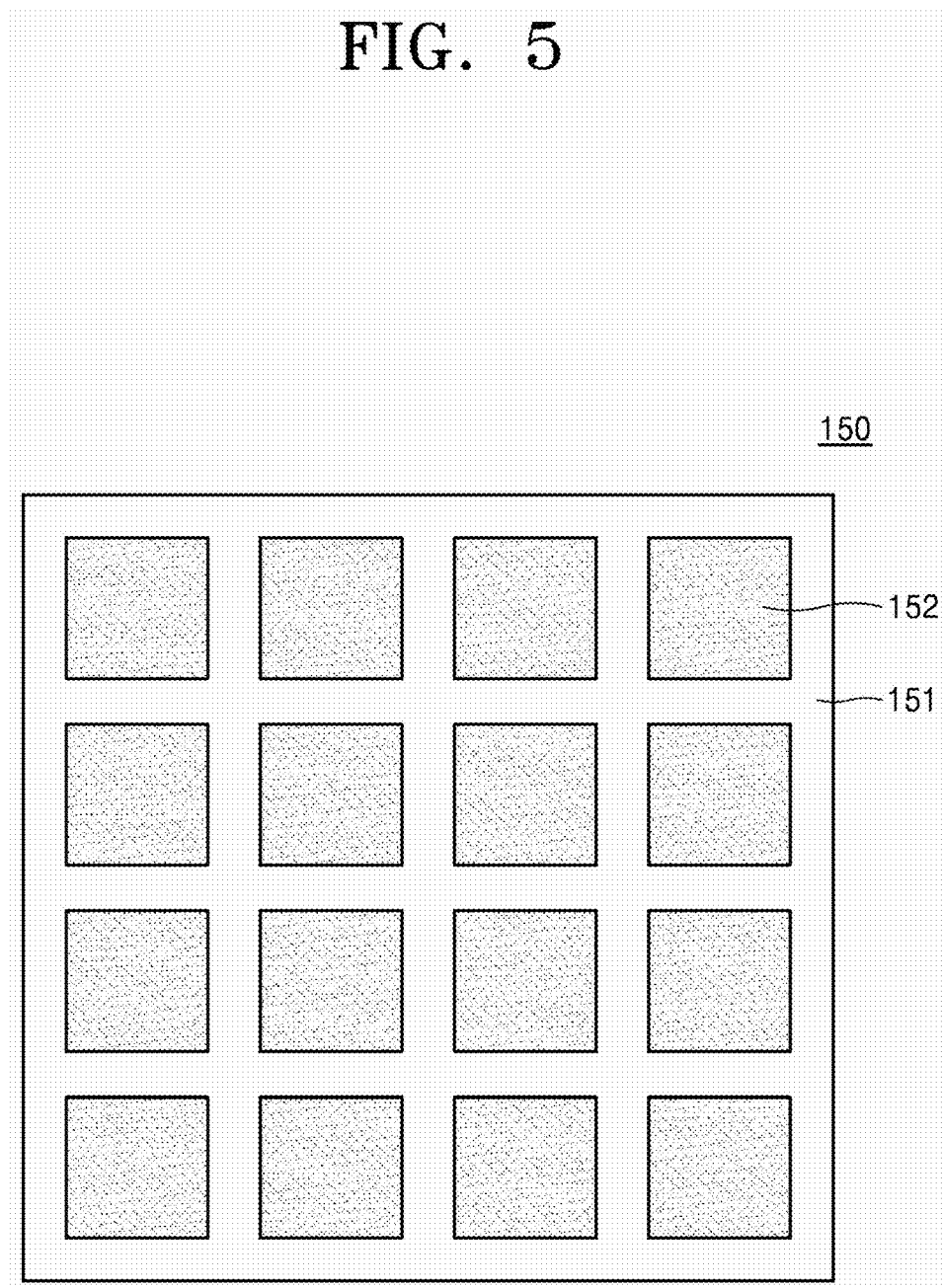
FIGS. 5 and 6 are plan views showing examples of an anti-reflection element of FIGS. 3 and 4.
Figure 6:
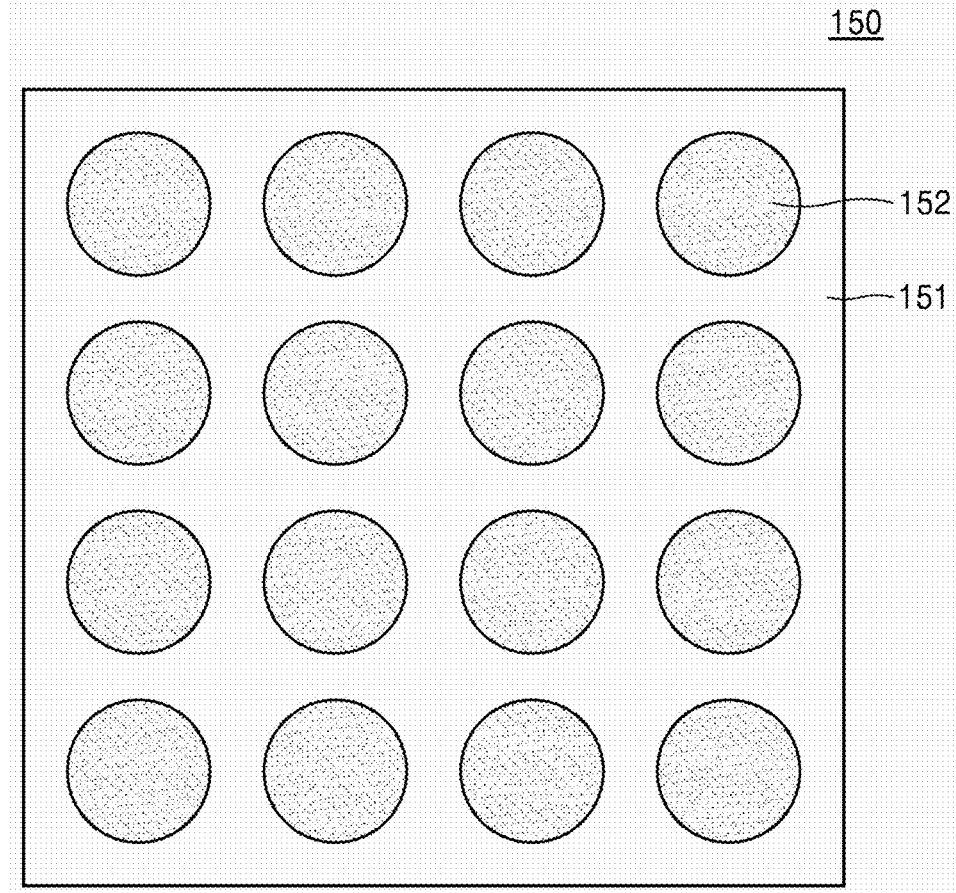

FIGS. 3 and 4 are cross-sectional views of the pixel array 1100 in the image sensor 1000 according to an example embodiment. FIGS. 5 and 6 are plan views showing examples of an anti-reflection element of FIGS. 3 and 4.

Referring to FIGS. 3 and 4, the pixel array 1100 of the image sensor 1000 includes a sensor substrate 110 including a plurality of pixels 111, 112, 113, and 114 for sensing light, a color filter array 140 provided on the sensor substrate 110, a spacer layer 120 that is transparent and disposed on the color filter array 140, a color separating lens array 130 on the spacer layer 120, and an anti-reflection element 150 provided on the color separating lens array 130.

The sensor substrate 110 may include a first pixel 111, a second pixel 112, a third pixel 113, a fourth pixel 114 that convert light into electrical signals, and pixel isolation films 101 provided between the first to fourth pixels 111, 112, 113, and 114. As shown in FIG. 3, the first pixel 111 and the second pixel 112 may be alternately arranged in the first direction (X direction). In a cross-section as shown in FIG. 4, which is cut along at a location different from FIG. 3, the third pixel 113 and the fourth pixel 114 may be alternately arranged in the first direction (X direction). The third pixel 113 and the first pixel 111 may be sequentially arranged in the second direction (Y direction). The fourth pixel 114 and the second pixel 112 may be sequentially arranged in the second direction (Y direction). In an example embodiment, the first to fourth photosensitive cells 111, 112, 113, and 114 may be arranged in the Bayer pattern as shown in FIG. 2. For example, the first and fourth pixels 111 and 114 may sense green light, the second pixel 112 may sense blue light, and the third pixel 113 may sense red light. Two green pixels, e.g., the first pixel 111 and the fourth pixel 114, are arranged in one diagonal direction, and the blue pixel and the red pixel, e.g., the second pixel 112 and the third pixel 113, may be arranged in another diagonal direction in a unit pattern of a 2×2 array.

The pixel isolation films 101 separate the first to fourth photosensitive cells 111, 112, 113, and 114 from one another to prevent generation of cross talk among the first to fourth photosensitive cells 111, 112, 113, and 114. The pixel isolation film 101 may extend from an upper surface of the sensor substrate 110 to a lower surface of the sensor substrate 110 in a third direction (Z direction).

The color filter array 140 may be on the sensor substrate 110. The color filter array 140 may include a first color filter 141 on the first pixel 111, a second color filter 142 on the second pixel 112, a third color filter 143 on the third pixel 113, and a fourth color filter 144 on the fourth pixel 114. For example, the first color filter 141 and the fourth color filter 144 may be green color filters that transmit only the green light, the second color filter 142 may be a blue color filter that transmit only the blue light, and the third color filter 143 may be a red color filter that transmit only the red light. The light is then substantially color-separated by the color separating lens array 130 and proceed toward the first to fourth pixels 111, 112, 113, and 114, which will be described later. Accordingly, there may be a little light loss even when the color filter array 140 is used. When the color filter array 140 is used, a color purity of the image sensor 1000 may be further improved. However, the color filter array 140 is not an essential element, and may be omitted provided that a color separating efficiency of the color separating lens array 130 is sufficiently high.

The spacer layer 120 is disposed between the sensor substrate 110 and the color separating lens array 130 to maintain a distance between the sensor substrate 110 and the color separating lens array 130 constant. The spacer layer 120 may include a material transparent with respect to the visible ray, for example, a dielectric material having a lower refractive index than that of nanoposts NP of the color separating lens array 130 that will be described later and having a low absorption coefficient in the visible ray band, e.g., $SiO_2$, siloxane-based spin on glass (SOG), etc. A thickness 120h of the spacer layer 120 may be determined based on a focal distance of the light condensed by the color separating lens array 130, for example, may be about ½ of a focal distance of the light of a reference wavelength $\lambda_0$. A focal distance f of the reference wavelength light $\lambda_0$ condensed by the color separating lens array 130 may be expressed by equation 1 below, wherein n denotes a refractive index of the spacer layer 120 with respect to the reference wavelength $\lambda_0$ and p denotes a pitch between pixels.

$$f = \frac{np^2}{\lambda_0} - \frac{\lambda_0}{4n} \quad \text{[Equation 1]}$$

Assuming that the reference wavelength $\lambda_0$ is 540 nm, e.g., green light, the pitch of the pixels 111, 112, 113, and 114 is 0.8 μm, and a refractive index n of the spacer layer 120 at the wavelength of 540 nm is 1.46, the focal distance f of the green light, that is, a distance between a lower surface of the color separating lens array 130 and a point where the green light is converged, is about 1.64 μm and a thickness 120h of the spacer layer 120 may be about 0.82 μm. In another example, assuming that the reference wavelength $\lambda_0$ is 540 nm, e.g., green light, the pitch of the pixels 111, 112, 113, and 114 is 1.2 μm, and a refractive index n of the spacer layer 120 at the wavelength of 540 nm is 1.46, the focal distance f of the green light is about 3.80 μm and the thickness 120h of the spacer layer 120 may be about 1.90 μm. In other words, the thickness 120h of the spacer layer 120 described above may be about 70% to about 120% of the pixel pitch when the pixel pitch is about 0.5 μm to about 0.9 μm, and may be about 110% to about 180% of the pixel pitch when the pixel pitch is about 0.9 μm to about 1.3 μm.

The color separating lens array 130 is supported by the spacer layer 120, and may include nanoposts NP that change a phase of incident light and a peripheral material layer PM surrounding the nanoposts NP. The peripheral material layer PM may include a dielectric material having a lower refractive index than that of the nanoposts NP, e.g., air or $SiO_2$. The color separating lens array 130 will be described later.

The anti-reflection element 150 may be provided on the color separating lens array 130. The anti-reflection element 150 may include a high-refractive index film 151 and low-refractive index patterns 152 on the high-refractive index film 151. The high-refractive index film 151 may include a material having a higher refractive index than that of the low-refractive index patterns 152. For example, the high-refractive index film 151 may include at least one of AlO, SiN, and HfO, and the low-refractive index patterns 152 may include $SiO_2$. In an example embodiment, the high-refractive index film 151 may function as an etch stop layer during the process of forming the low-refractive index patterns 152. In detail, when the low-refractive index patterns 152 are formed by patterning a low-refractive index material film deposited on the high-refractive index film 151, the high-refractive index film 151 may function as an etch stop layer in the patterning process on the low-refractive index material film. However, the high-refractive index film 151 may not be provided in an embodiment. For example, the low-refractive index patterns 152 may be provided directly on the color separating lens array 130.

A thickness of the low-refractive index patterns 152 may be greater than that of the high-refractive index film 151. In an example embodiment, the thickness of the low-refractive index patterns 152 may be about 100 nm to about 180 nm. In an example embodiment, the thickness of the high-refractive index film 151 may be about 5 nm to about 50 nm. For example, the thickness of the high-refractive index film 151 may be about 50 nm, and the thickness of the low-refractive index patterns 152 may be about 100 nm. The low-refractive index patterns 152 may be arranged on the high-refractive index film 151. For example, the low-refractive index patterns 152 may be arranged in the first direction (X direction) and the second direction (Y direction). However, one or more embodiments are not limited to the above example. The low-refractive index patterns 152 may be variously arranged. The low-refractive index patterns 152 may each have a column shape. For example, as shown in FIGS. 5 and 6, the low-refractive index patterns 152 may each have a square column shape or a circular column shape. However, one or more embodiments are not limited to the above example. In another example, the low-refractive index patterns 152 may each have a polygonal column shape (e.g., a triangular column shape or a pentagonal column shape), rather than the square column shape.

An effective refractive index of the low-refractive index patterns 152 may be substantially equal to a square root of the effective refractive index of the color separating lens array 130. In an example embodiment, the effective refractive index of the low-refractive index patterns 152 may be defined by a fill factor of the low-refractive index patterns 152. The fill factor of the low-refractive index patterns 152 may denote a ratio of a width 152w of the low-refractive index pattern 152 to an arrangement period 152p of the low-refractive index patterns 152. For example, when the low-refractive index patterns 152 are in contact with one another, the fill factor is 1. For example, when the width 152w of the low-refractive index pattern 152 is half the arrangement period 152p of the low-refractive index patterns 152, the fill factor is 0.5.

The effective refractive index of the low-refractive index patterns 152 may be less than an effective refractive index of a low-refractive index material layer that is not patterned. As described above, the effective refractive index of the low-refractive index patterns 152 may be determined by the fill factor of the low-refractive index patterns 152. For example, the effective refractive index of the color separating lens array 130 may be about 1.6. In this case, the fill factor of the low-refractive index patterns 152 may be determined as about 1.26 that is the square root of the effective refractive index, e.g., 1.6, of the low-refractive index material layer that is not patterned. For example, when the low-refractive index patterns 152 are $SiO_2$ patterns, a $SiO_2$ layer that has an effective refractive index of about 1.48 and is not patterned may be patterned to form the low-refractive index patterns 152 having the fill factor of about 0.5 (that is, the low-refractive index patterns 152 remaining after removing about half of an $SiO_2$ layer that is not patterned). However, in an example embodiment, the fill factor of the low-refractive index patterns 152 may vary depending on its position, as described later.

Figure 7:
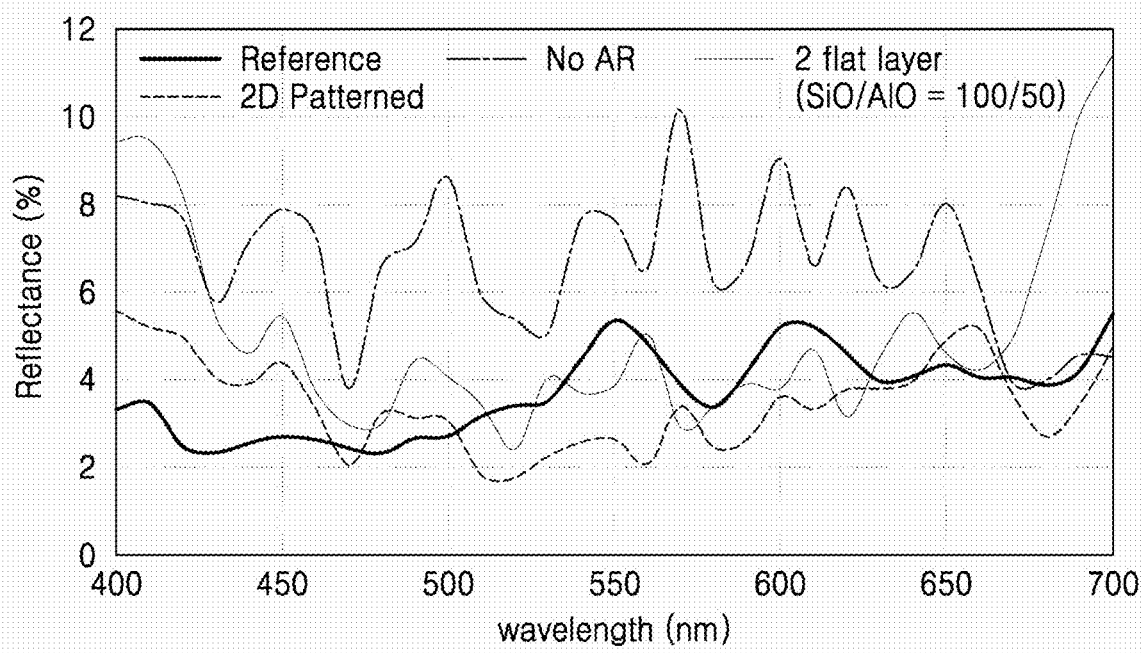
FIG. 7 is a graph for describing an effect of an anti-reflection element according to an example embodiment.

FIG. 7 is a graph for describing an effect of an anti-reflection element according to an example embodiment.

Referring to FIG. 7, first, second, third, and fourth graphs with respect to reflectivity of an anti-reflection element are shown. The first graph (reference) denotes a reflectivity when, instead of using the spacer layer 120, the color separating lens array 130, and the anti-reflection element 150, a micro-lens array is applied on the color filter array 140 in the pixel array 1100 shown in FIGS. 3 and 4. The second graph (No AR) denotes a reflectivity when the anti-reflection element 150 is not provided in the pixel array 1100 shown in FIGS. 3 and 4. The third graph (2 flat layer) denotes a reflectivity when the anti-reflection element 150 includes a low-refractive index material film stacked on the high-refractive index film 151, instead of the low-refractive index patterns 152, in the pixel array 1100 shown in FIGS. 3 and 4. Here, the high-refractive index film 151 was an AlO layer of a 50 nm thickness and the low-refractive index material film was a $SiO_2$ layer of a 100 nm thickness. The fourth graph (2D patterned) denotes a reflectivity when the high-refractive index film 151 has a thickness of 50 nm and the low-refractive index patterns 152 have a thickness of 100 nm in the pixel array 1100 shown in FIGS. 3 and 4. In a wavelength band of 400 nm to 700 nm, average reflectivities of the first to fourth graphs were 3.69%, 6.69%, 5.07%, and 3.44%. Therefore, according to the disclosure, the pixel array 1100 and the image sensor 1000 having the low reflectivity and improved quantum efficiency in the visible ray band may be provided.

Hereinafter, the color separating lens array 130 will be described in detail.

Figure 8:
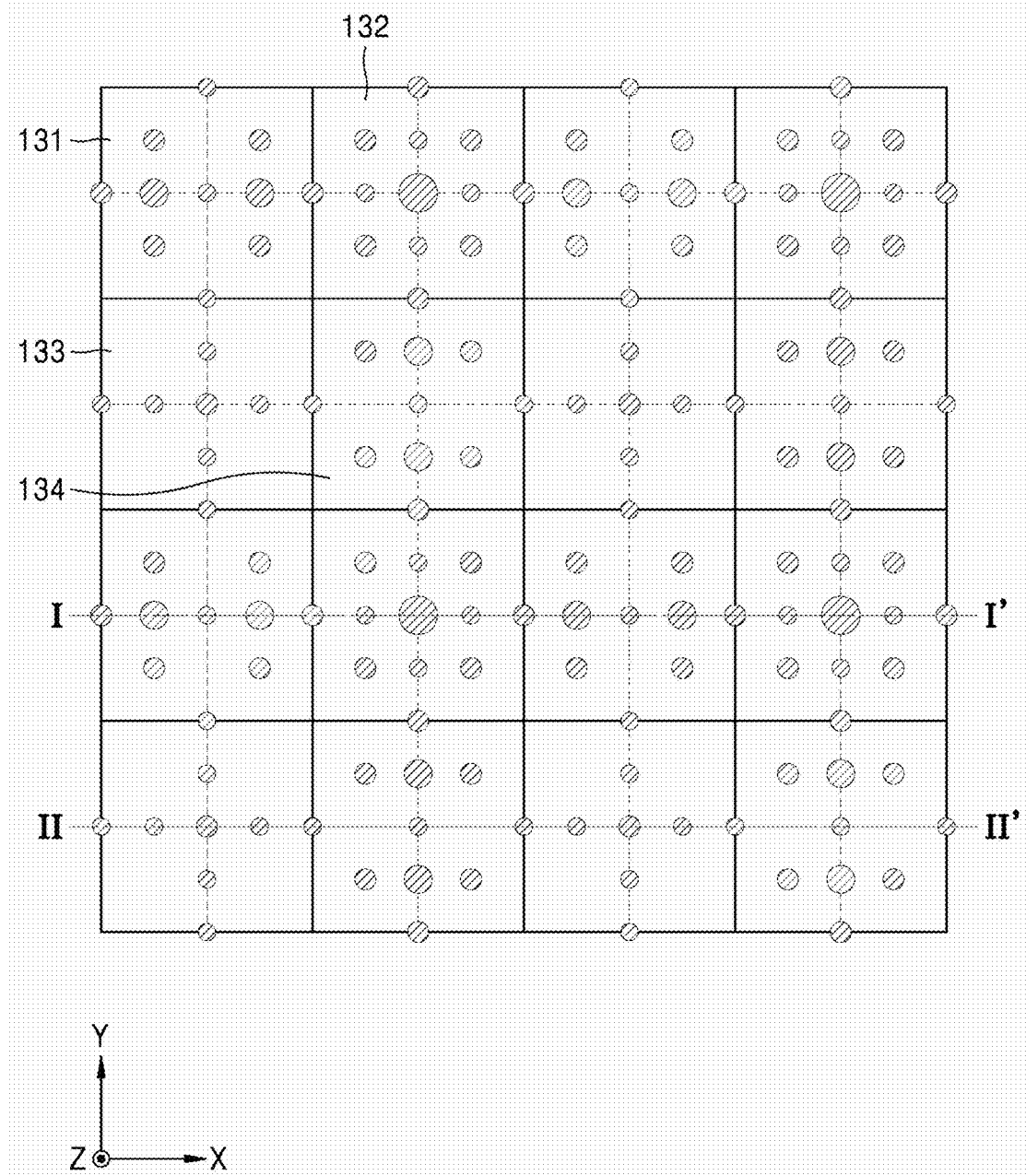
FIG. 8 is a plan view showing an arrangement of pixels in a pixel array according to an example embodiment.
Figure 9:
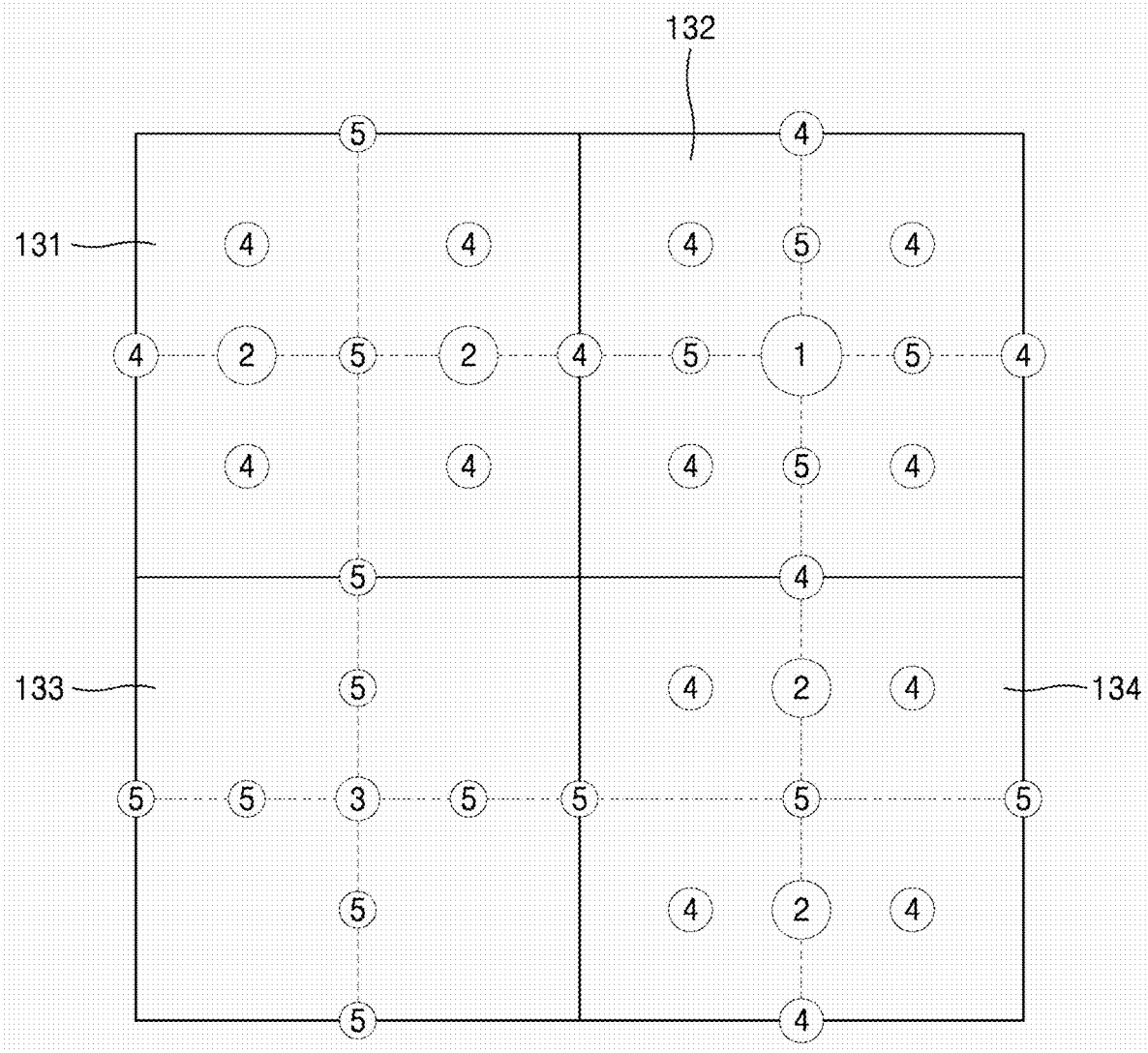
FIG. 9 is a plan view showing an example of arrangement of a plurality of nanoposts in a plurality of regions of a color separating lens array according to an example embodiment.
Figure 10:
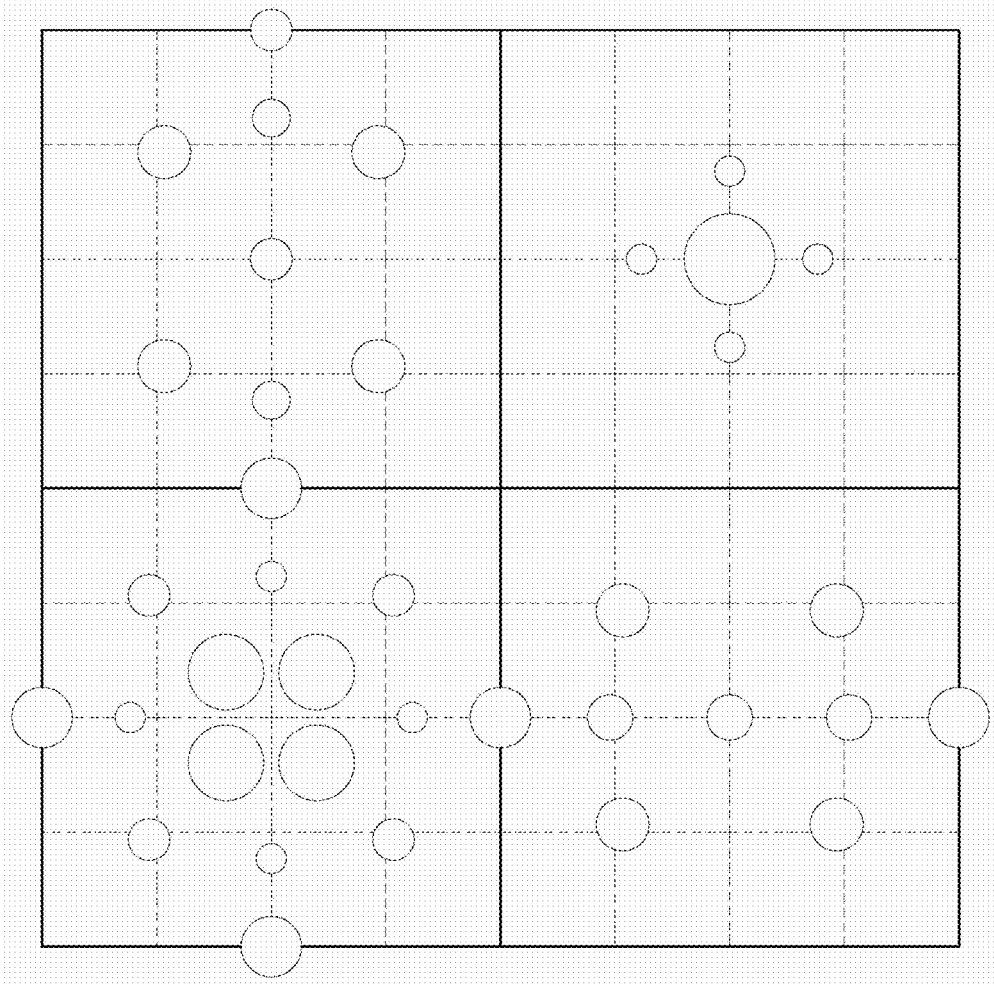
FIG. 10 is a plan view showing a partially enlarged view of FIG. 8.
Figure 11:
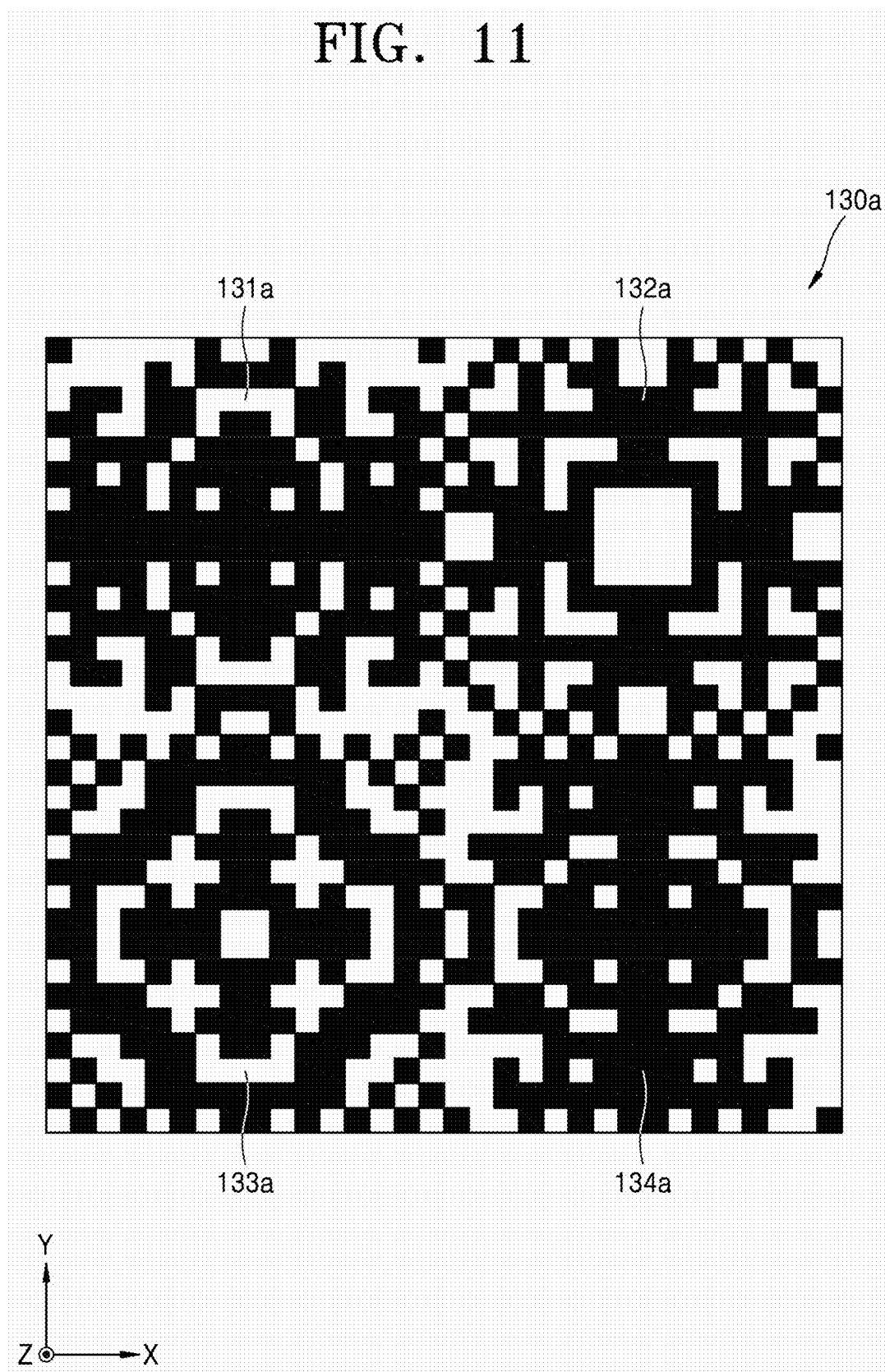
FIGS. 11 and 12 are plan views showing examples of various types of a color separating lens array according to example embodiments.
Figure 12:
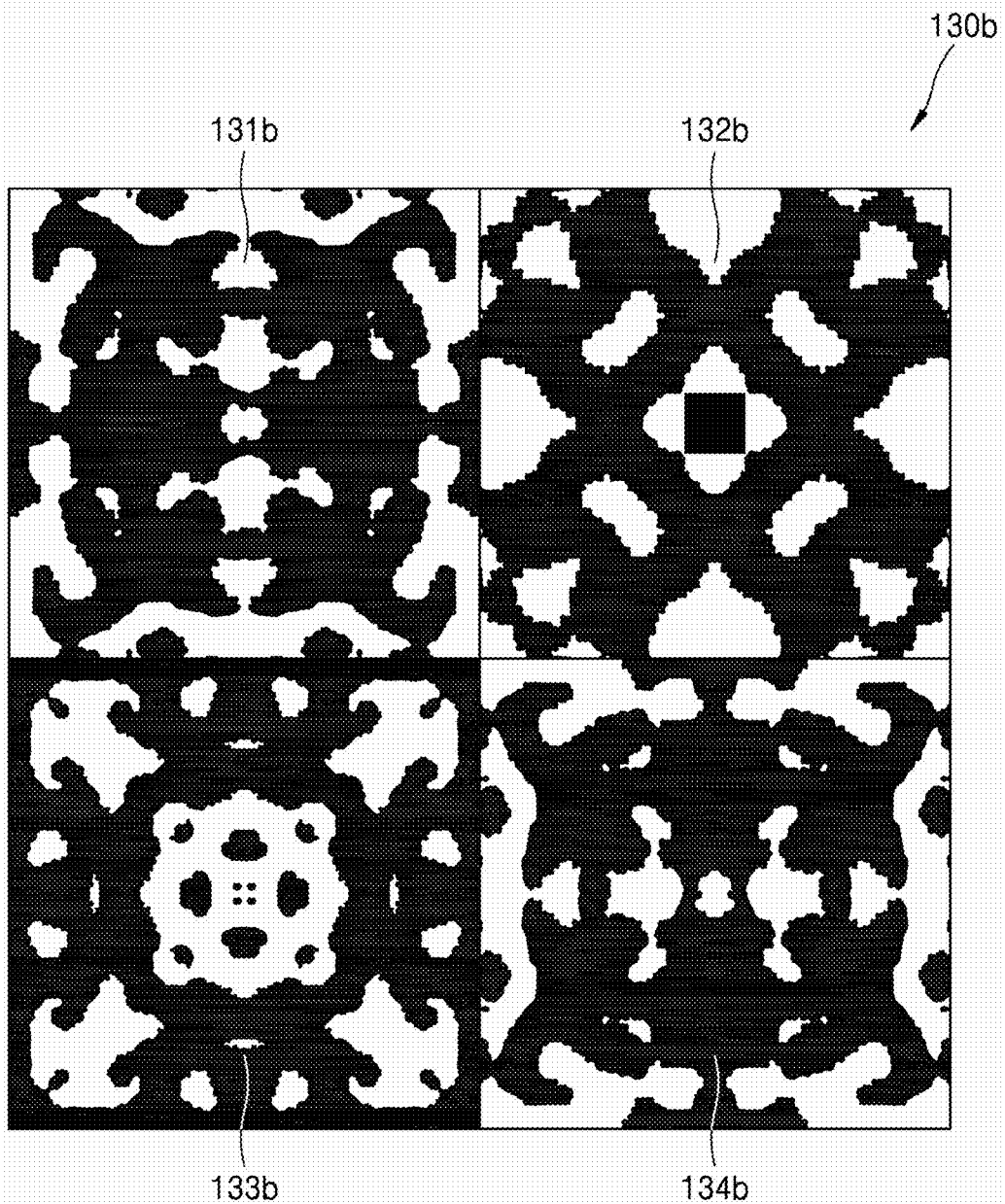

FIG. 8 is a plan view showing an arrangement of pixels in a pixel array according to an example embodiment. FIG. 9 is a plan view showing an example of arrangement of a plurality of nanoposts in a plurality of regions of a color separating lens array according to an example embodiment. FIG. 10 is a plan view showing a partially enlarged view of FIG. 8. FIGS. 11 and 12 are plan views showing examples of other various types of a color separating lens array according to example embodiments.

Referring to FIG. 8, the color separating lens array 130 may be partitioned into four pixel corresponding regions 131, 132, 133, and 134 corresponding to the pixels 111, 112, 113, and 114 of FIGS. 3 and 4. For example, a first pixel corresponding region 131 corresponds to the first pixel 111 and may be on the first pixel 111 in the third direction (Z direction), a second pixel corresponding region 132 corresponds to the second pixel 112 and may be on the second pixel 112 in the third direction (Z direction), a third pixel corresponding region 133 corresponds to the third pixel 113 and may be on the third pixel 113 in the third direction (Z direction), and a fourth pixel corresponding region 134 corresponds to the fourth pixel 114 and may be on the fourth pixel 114 in the third direction (Z direction). That is, the first to fourth pixel corresponding regions 131, 132, 133, and 134 of the color separating lens array 130 may be arranged to face the corresponding first to fourth pixels 111, 112, 113, and 114 of the sensor substrate 110 in the third direction (Z direction). The first to fourth pixel corresponding regions 131, 132, 133, and 134 may be two-dimensionally arranged such that a first row in which the first pixel corresponding region 131 and the second pixel corresponding region 132 are alternately arranged in the first direction (X direction) and a second row in which the third pixel corresponding region 133 and the fourth pixel corresponding region 134 are alternately arranged in the first direction (X direction) are alternately repeated in the second direction (Y direction). The color separating lens array 130 includes a plurality of unit patterns that are two-dimensionally arranged like the pixel array of the sensor substrate 110, and each of the unit patterns includes the pixel corresponding regions 131, 132, 133, and 134 arranged in a 2×2 array.

In an example, the color separating lens array 130 may be partitioned as a green light condensing region for condensing the green light, a blue light condensing region for condensing the blue light, and a red light condensing region for condensing the red light. For example, the color separating lens array 130 may include the nanoposts NP, of which sizes, shapes, intervals, and/or arrangements are defined, such that the green light is separately condensed to the first and fourth pixels 111 and 114, the blue light is separately condensed to the second pixel 112, and the red light is separately condensed to the third pixel 113. In addition, a thickness of the color separating lens array 130 in a third direction (Z direction) may be similar to heights of the nanoposts NP, and may be about 500 nm to about 1500 nm.

The first to fourth pixel corresponding regions 131, 132, 133, and 134 may include the nanoposts NP having cylindrical shapes each having a circular cross-section. In a center portion of each region, the nanoposts NP having different cross-sectional areas are arranged, and the nanoposts NP may be also arranged at the center on a boundary between pixels and a crossing point between the pixel boundaries.

FIG. 9 shows the arrangement of the nanoposts NP included in partial regions of FIG. 8, that is, the pixel corresponding regions 131, 132, 133, and 134 in the unit pattern. In FIG. 9, the nanoposts NP are indicated by 1 to 5 according to sizes of the cross-section of the unit pattern. Referring to FIG. 9, from among the nanoposts NP, a nanopost 1 having the largest cross-sectional area is at the center of the second pixel corresponding region 132, and a nanopost 5 having the smallest cross-sectional area may be arranged around the nanopost 1 and a nanopost 3 in the second and third pixel corresponding regions 132 and 133 and at centers of the first and fourth pixel corresponding regions 131 and 134. However, one or more embodiments are not limited to the above example, and depending on an embodiment, the nanoposts NP having various shapes, sizes, and arrangement may be applied.

The nanoposts NP included in the first and fourth pixel corresponding regions 131 and 134 may have different distribution rules in the first direction (X direction) and the second direction (Y direction). For example, the nanoposts NP arranged in the first and fourth pixel corresponding regions 131 and 134 may have different size arrangement in the first direction (X direction) and the second direction (Y direction). As shown in FIG. 9, from among the nanoposts NP, a cross-sectional area of a nanopost 4 located at a boundary between the first pixel corresponding region 131 and the second pixel corresponding region 132 that is adjacent to the first pixel corresponding region 131 in the first direction (X direction) may be different (e.g., different in size) from that of the nanopost 5 located at a boundary between the first pixel corresponding region 131 and the third pixel corresponding region 133 that is adjacent to the first pixel corresponding region 131 in the second direction (Y direction). Likewise, a cross-sectional area of the nanopost 5 located at a boundary between the fourth pixel corresponding region 134 and the third pixel corresponding region 133 that is adjacent to the fourth pixel corresponding region 134 in the first direction (X direction) may be different from that of the nanopost 4 located at a boundary between the fourth pixel corresponding region 134 and the second pixel corresponding region 132 that is adjacent to the fourth pixel corresponding region 134 in the second direction (Y direction).

On the other hand, the nanoposts NP arranged in the second pixel corresponding region 132 and the third pixel corresponding region 133 may have symmetrical arrangement rules along the first direction (X direction) and the second direction (Y direction). As shown in FIG. 9, from among the nanoposts NP, the cross-sectional areas of the nanoposts 4 at a boundary between the second pixel corresponding region 132 and adjacent pixels in the first direction (X direction) and the cross-sectional areas of the nanoposts 4 at a boundary between the second pixel corresponding region 132 and the adjacent pixels in the second direction (Y direction) may be the same (e.g., the same size) as each other, and in the third pixel corresponding region 133, the cross-sectional areas of the nanoposts 5 at a boundary between adjacent pixels in the first direction (X direction) and the cross-sectional areas of the nanoposts 5 at a boundary between the adjacent pixels in the second direction (Y direction) may be the same as each other.

The above distribution is based on the pixel arrangement in the Bayer pattern. Pixels adjacent to the second pixel 112 and the third pixel 113 in the first direction (X direction) and the second direction (Y direction) are the same, e.g., the green pixels. However, a pixel adjacent to the first pixel 111 in the first direction (X direction) is a blue pixel and a pixel adjacent to the first pixel 111 in the second direction (Y direction) is a red pixel, and a pixel adjacent to the fourth pixel 114 in the first direction (X direction) is a red pixel and a pixel adjacent to the fourth pixel 114 in the second direction (Y direction) is a blue pixel. In addition, adjacent pixels to the first and fourth pixels 111 and 114 in two diagonal directions are green pixels, adjacent pixels to the second pixel 112 in the two diagonal directions are the red pixels, and adjacent pixels to the third pixel 113 in the two diagonal directions are the blue pixels. Therefore, in the second and third pixel corresponding regions 132 and 133, the nanoposts NP are arranged in a four-fold symmetry, and in the first and fourth pixel corresponding regions 131 and 134, the nanoposts NP may be arranged in a two-fold symmetry. In particular, the first pixel corresponding region 131 and the fourth pixel corresponding region 134 are rotated by 90° angle with respect to each other.

The nanoposts NP may be arranged in other various arrangements than those of FIGS. 8 and 9. For example, FIG. 10 shows another arrangement of the nanoposts NP in the first to fourth pixel corresponding regions 131, 132, 133, and 134 of the color separating lens array 130. The principles of arranging the nanoposts NP described above may be also applied to the first to fourth pixel corresponding regions 131, 132, 133, and 134 in the color separating lens array 130 shown in FIG. 10.

The plurality of nanoposts NP have symmetrical circular cross-sectional shapes in FIGS. 8 to 10. However, some nanoposts having asymmetrical cross-sectional shapes or polygonal cross-sectional shapes may be included. For example, the first and fourth pixel corresponding regions 131 and 134 may adopt the nanoposts having asymmetrical cross-sections, each of which has different widths in the first direction (X direction) and the second direction (Y direction), and the second and third pixel corresponding regions 132 and 133 may adopt the nanoposts having symmetrical cross-sections, each of which has the same widths in the first direction (X direction) and the second direction (Y direction). The arrangement rule of the nanoposts NP is an example, and is not limited thereto.

The color separating lens array 130 shown in FIGS. 8 to 10 is an example, and the color separating lens arrays of various shapes may be obtained through the above-described optimized design according to the size and thickness of the color separating lens array, a color characteristic, the pixel pitch of the image sensor to which the color separating lens array is to be applied, a distance between the color separating lens array and the image sensor, an incident angle of the incident light, etc. Also, the color separating lens array may be implemented by other various patterns, instead of the nanoposts.

FIGS. 11 and 12 are plan views showing examples of various types of a color separating lens array according to example embodiments. For example, each of first to fourth pixel corresponding regions 131a, 132a, 133a, and 134a in a color separating lens array 130a shown in FIG. 11 is optimized in a digitalized binary form of 16×16 rectangular arrays, and the unit pattern of FIG. 11 has a shape of 32×32 rectangular arrays. As another example, each of first to fourth pixel corresponding regions 131b, 132b, 133b, and 134b in a color separating lens array 130b shown in FIG. 12 may be optimized in a non-digitalized continuous curve shape.

Figure 13:
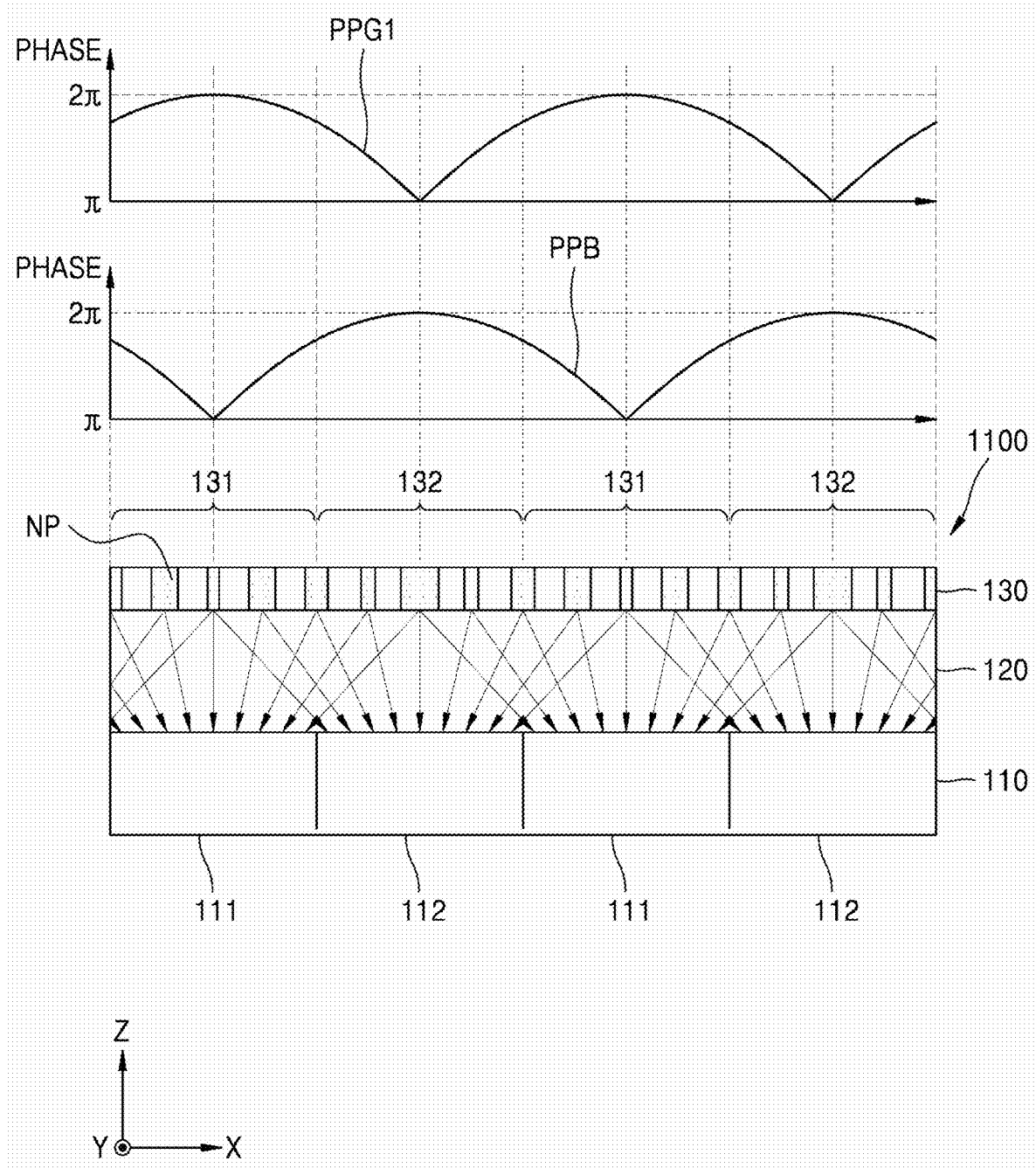
FIG. 13 is a diagram showing phase profiles of green light and blue light that have passed through a color separating lens array along line I-I' of FIG. 8.
Figure 14:
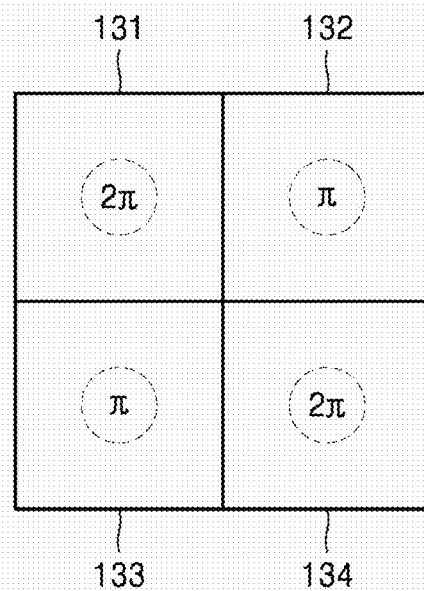
FIG. 14 is a diagram showing a phase of green light at a center of pixel corresponding regions, after passing through a color separating lens array, according to an example embodiment.
Figure 15:
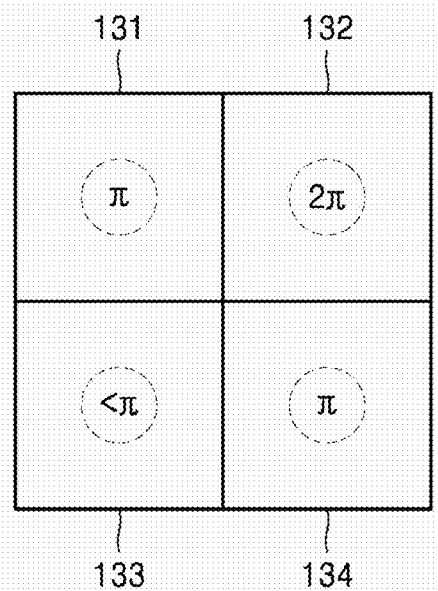
FIG. 15 is a diagram showing a phase of blue light at a center of pixel corresponding regions, after passing through a color separating lens array, according to an example embodiment.

FIG. 13 is a diagram showing phase profiles of green light and blue light that have passed through a color separating lens array 130 along line I-I' of FIG. 8. FIG. 14 is a diagram showing phases of green light at centers of the pixel corresponding regions 131, 132, 133, and 134, the green light passing through the color separating lens array 130. FIG. 15 is a diagram showing phases of blue light at centers of the pixel corresponding regions 131, 132, 133, and 134, the blue light passing through the color separating lens array 130.

Referring to FIGS. 13 and 14, the green light that has passed through the color separating lens array 130 may have a first green light phase profile PPG1 that is the largest at the center of the first pixel corresponding region 131 and is reduced away from the center of the first pixel corresponding region 131. In detail, immediately after passing through the color separating lens array 130, that is, at a lower surface of the color separating lens array 130 or an upper surface of the spacer layer 120, the phase of the green light is the largest at the center of the first pixel corresponding region 131 and reduced as a concentric circle away from the center of the first pixel corresponding region 131. Thus, the phase is the smallest at the centers of the second and third pixel corresponding regions 132 and 133 in the X and Y directions, and at contact points between the first pixel corresponding region 131 and the fourth pixel corresponding region 134 in the diagonal direction.

When a phase of the green light is set as $2\pi$ based on the phase of light emitted from the center of the first pixel corresponding region 131, the light having a phase of about $0.9\pi$ to about $1.1\pi$ may be emitted from the centers of the second and third corresponding regions 132 and 133, and the green light having a phase of about $1.1\pi$ to about $1.5\pi$ may be emitted from a contact point between the first pixel corresponding region 131 and the fourth pixel corresponding region 134. Therefore, a difference between the phase of the green light that has passed through the center of the first pixel corresponding region 131 and the phase of the green light that has passed through the centers of the second and third pixel corresponding regions 132 and 133 may be about $0.9\pi$ to about $1.1\pi$.

In addition, the first green light phase profile PPG1 does not denote that the phase delay amount of the light that has passed through the center of the first pixel corresponding region 131 is the largest, but when the phase of light that has passed through the first pixel corresponding region 131 is set to $2\pi$ and a phase delay amount of the light that has passed through another point is greater and has a phase value of $2\pi$ or greater, the first green light phase profile PPG1 may denote a value remaining after subtracting $2n\pi$, that is, wrapped phase profile. For example, when the phase of light that has passed through the first pixel corresponding region 131 is $2\pi$ and the phase of light that has passed through the center of the second pixel corresponding region 132 is $3\pi$, the phase in the second pixel corresponding region 132 may be remaining $\pi$ after subtracting $2\pi$ (n=1) from $3\pi$.

Referring to FIGS. 13 and 15, the blue light that has passed through the color separating lens array 130 may have a blue light phase profile PPB that is the largest at the center of the second pixel corresponding region 132 and is reduced away from the center of the second pixel corresponding region 132. In detail, immediately after passing through the color separating lens array 130, the phase of the blue light is the largest at the center of the second pixel corresponding region 132 and reduced as a concentric circle away from the center of the second pixel corresponding region 132, the phase is the smallest at the centers of the first and fourth pixel corresponding regions 131 and 134 in the first direction (X direction) and the second direction (Y direction) and the smallest at the center of the third pixel corresponding region 133 in the diagonal direction. When the phase of the blue light at the center of the second pixel corresponding region 132 is $2\pi$, the phase at the centers of the first and fourth pixel corresponding regions 131 and 134 may be about, for example, about $0.9\pi$ to about $1.1\pi$, and the phase at the center of the third pixel corresponding region 133 may be less than that at the centers of the first and fourth pixel corresponding regions 131 and 134, for example, about $0.5\pi$ to about $0.9\pi$.

Figure 16:
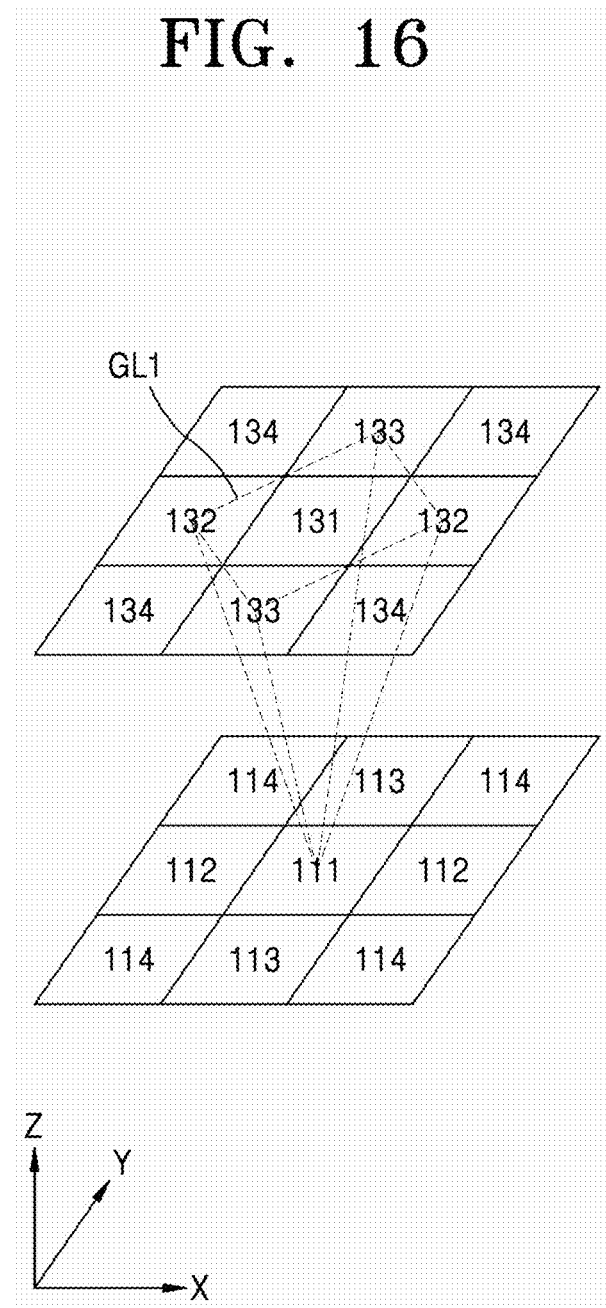
FIG. 16 is a diagram showing an example of a proceeding direction of green light incident on a first green light condensing region according to an example embodiment.
Figure 17:
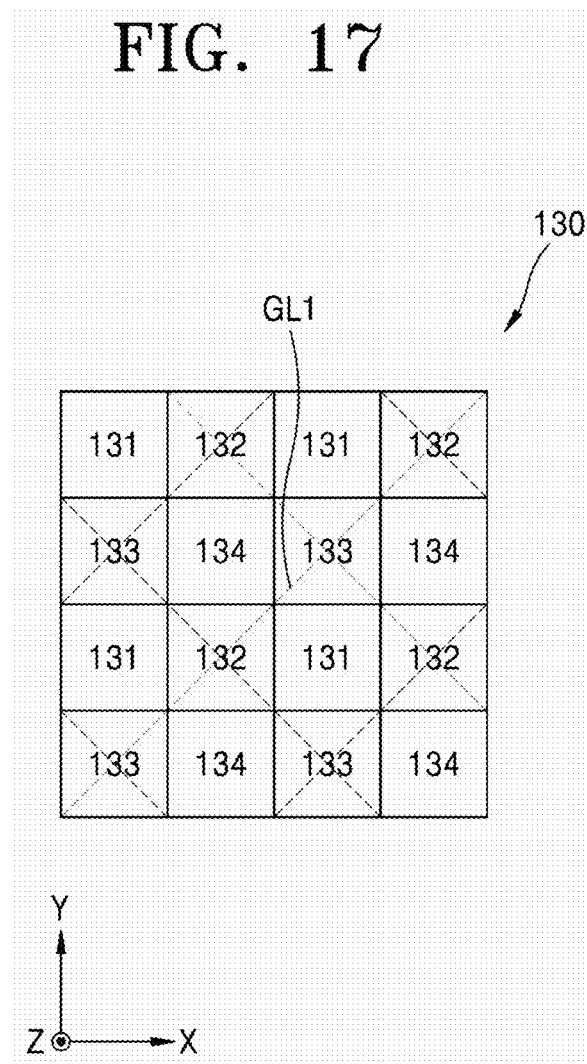
FIG. 17 is a diagram showing an array of a first green light condensing region according to an example embodiment.

FIG. 16 is a diagram showing an example of a proceeding direction of green light incident on a first green light condensing region according to an example embodiment. FIG. 17 is a diagram showing an array of a first green light condensing region according to an example embodiment.

Referring to FIG. 16, the green light incident on the vicinity of the first pixel corresponding region 131 is condensed to the first pixel 111 by the color separating lens array 130, and the green light from the second and third pixel corresponding regions 132 and 133, in addition to the first pixel corresponding region 131, is also incident on the first pixel 111. That is, according to the phase profile of the green light described above with reference to FIGS. 13 and 14, the green light that has passed through a first green light condensing region GL1 that is obtained by connecting centers of two second pixel corresponding regions 132 and two third pixel corresponding regions 133 that are adjacent to the first pixel corresponding region 131 is condensed onto the first pixel 111. Therefore, as shown in FIG. 17, the color separating lens array 130 may operate as a first green light condensing region GL1 array for condensing the green light onto the first pixel 111. The first green light condensing region GL1 may have a greater area than that of the corresponding first pixel 111, e.g., may be 1.2 times to two times greater than that of the first pixel 111.

Figure 18:
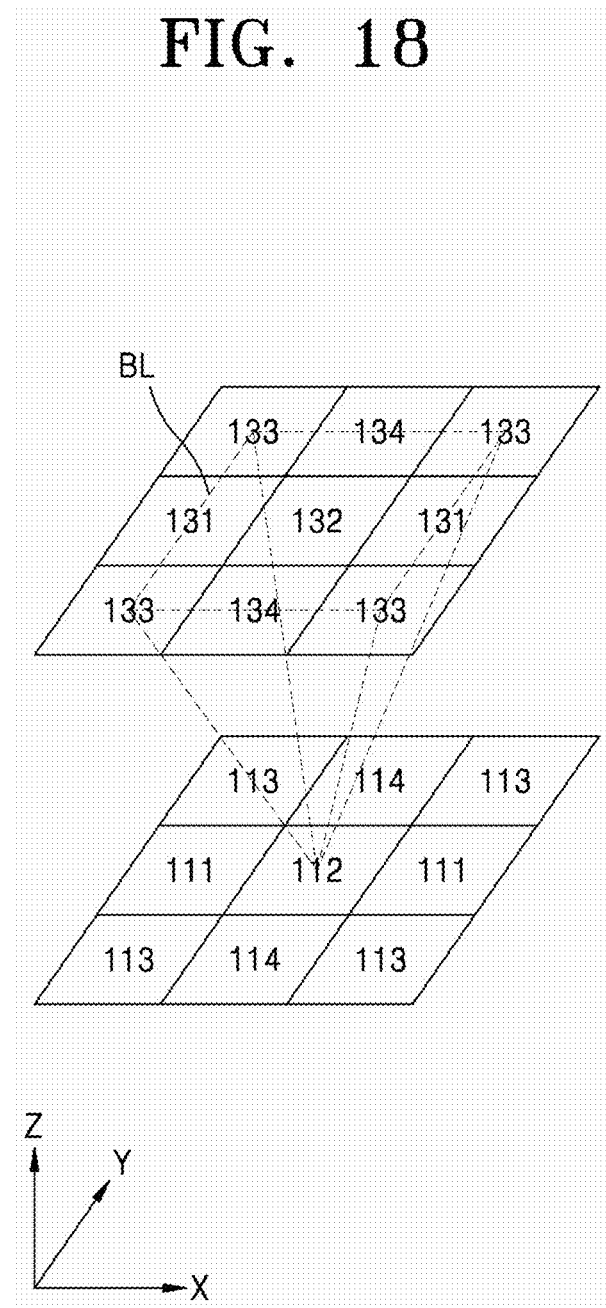
FIG. 18 is a diagram showing an example of a proceeding direction of blue light incident on a blue light condensing region according to an example embodiment.
Figure 19:
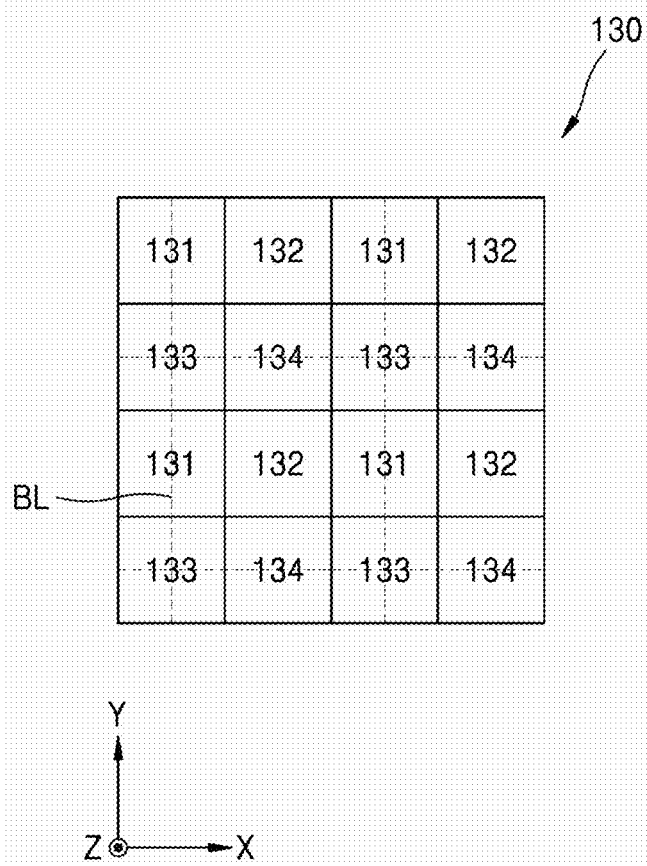
FIG. 19 is a diagram showing an array of a blue light condensing region according to an example embodiment.

FIG. 18 is a diagram showing an example of a proceeding direction of blue light incident on a blue light condensing region according to an example embodiment. FIG. 19 is a diagram showing an array of a blue light condensing region according to an example embodiment.

The blue light is condensed onto the second pixel 112 by the color separating lens array 130 as shown in FIG. 18, and the blue light from the pixel corresponding regions 131, 132, 133, and 134 is incident on the second pixel 112. In the phase profile of the blue light described above with reference to FIGS. 13 and 15, the blue light that has passed through a blue light condensing region BL that is obtained by connecting centers of four third pixel corresponding regions 133 adjacent to the second pixel corresponding region 132 at apexes is condensed onto the second pixel 112. Therefore, as shown in FIG. 19, the color separating lens array 130 may operate as a blue light condensing region array for condensing the blue light to the second pixel 112. The blue light condensing region BL has an area greater than that of the second pixel 112, e.g., may be 1.5 to 4 times greater. The blue light condensing region BL may partially overlap the first green light condensing region GL1 described above, and a second green light condensing region GL2 and a red light condensing region RL.

Figure 20:
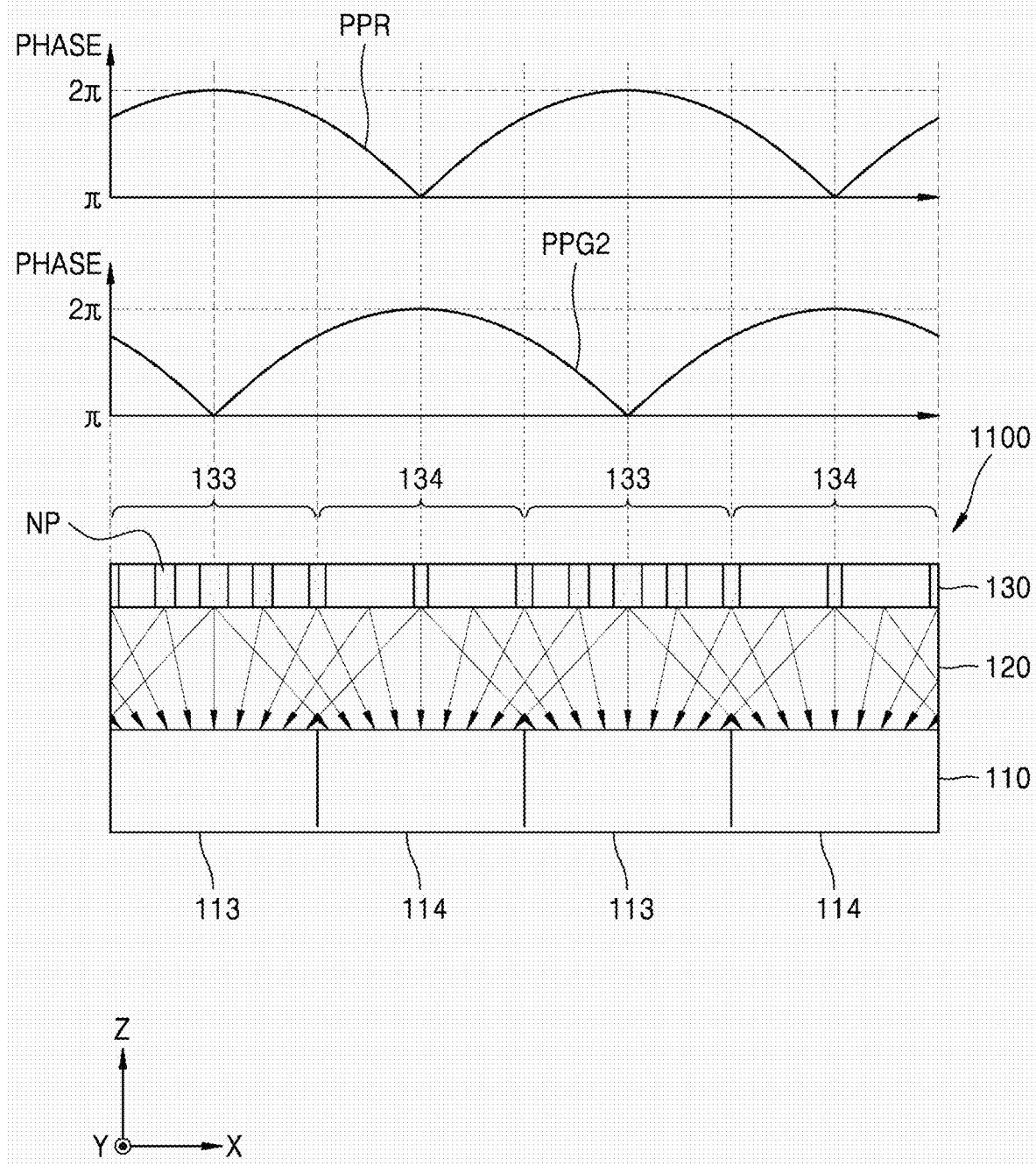
FIG. 20 is a diagram showing phase profiles of red light and green light that have passed through a color separating lens array along line II-II' of FIG. 8.
Figure 21:
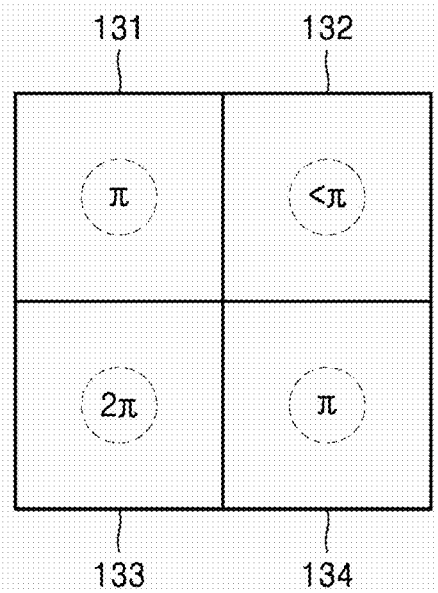
FIG. 21 is a diagram showing a phase of red light at a center of pixel corresponding regions, after passing through a color separating lens array, according to an example embodiment.
Figure 22:
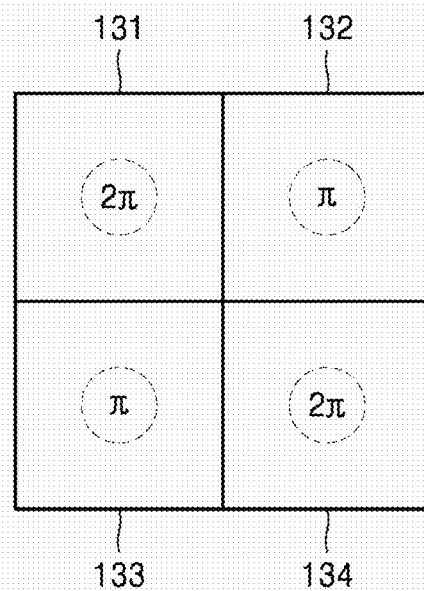
FIG. 22 is a diagram showing a phase of green light at a center of pixel corresponding regions, after passing through a color separating lens array, according to an example embodiment.

FIG. 20 is a diagram showing phase profiles of red light and green light that have passed through a color separating lens array 130 along line II-II' of FIG. 8. FIG. 21 is a diagram showing phases of red light at centers of the pixel corresponding regions 131, 132, 133, and 134, the red light passing through the color separating lens array 130. FIG. 22 is a diagram showing phases of green light at centers of the pixel corresponding regions 131, 132, 133, and 134, the green light passing through the color separating lens array 130.

Referring to FIGS. 20 and 21, the red light that has passed through the color separating lens array 130 may have a red light phase profile PPR that is the largest at the center of the third pixel corresponding region 133 and is reduced away from the center of the third pixel corresponding region 133. In detail, immediately after passing through the color separating lens array 130, the phase of the red light is the largest at the center of the third pixel corresponding region 133 and reduced as a concentric circle away from the center of the third pixel corresponding region 133, the phase is the smallest at the centers of the first and fourth pixel corresponding regions 131 and 134 in the first direction (X direction) and the second direction (Y direction) and the smallest at the center of the second pixel corresponding region 132 in the diagonal direction. When the phase of the red light at the center of the third pixel corresponding region 133 is $2\pi$, the phase at the centers of the first and fourth pixel corresponding regions 131 and 134 may be about, for example, about $0.9\pi$ to about $1.1\pi$, and the phase at the center of the second pixel corresponding region 132 may be less than that at the centers of the first and fourth pixel corresponding regions 131 and 134, for example, about $0.6\pi$ to about $0.9\pi$.

Referring to FIGS. 20 and 22, the green light that has passed through the color separating lens array 130 may have a second green light phase profile PPG2 that is the largest at the center of the fourth pixel corresponding region 134 and is reduced away from the center of the fourth pixel corresponding region 134. When comparing the first green light phase profile PPG1 of FIG. 13 with the second green light phase profile PPG2 of FIG. 20, the second green light phase profile PPG2 is obtained by moving the first green light phase profile PPG1 by one-pixel pitch in the first direction (X direction) and the second direction (Y direction). That is, the first green light phase profile PPG1 has the largest phase at the center of the first pixel corresponding region 131, but the second green light phase profile PPG2 has the largest phase at the center of the fourth pixel corresponding region 134 that is apart by one-pixel pitch from the center of the first pixel corresponding region 131 in the first direction (X direction) and the second direction (Y direction). The phase profiles in FIGS. 14 and 22 showing the phases at the centers of the pixel corresponding regions 131, 132, 133, and 134 may be the same as each other. Regarding the phase profile of the green light based on the fourth pixel corresponding region 134, when the phase of the green light emitted from the center of the fourth pixel corresponding region 134 is set as $2\pi$, the light having the phase of about $0.9\pi$ to about $1.1\pi$ may be emitted from the centers of the second and third pixel corresponding regions 132 and 133 and the light having the phase of about $1.1\pi$ to about $1.5\pi$ may be emitted from the contact point between the first pixel corresponding region 131 and the fourth pixel corresponding region 134.

Figure 23:
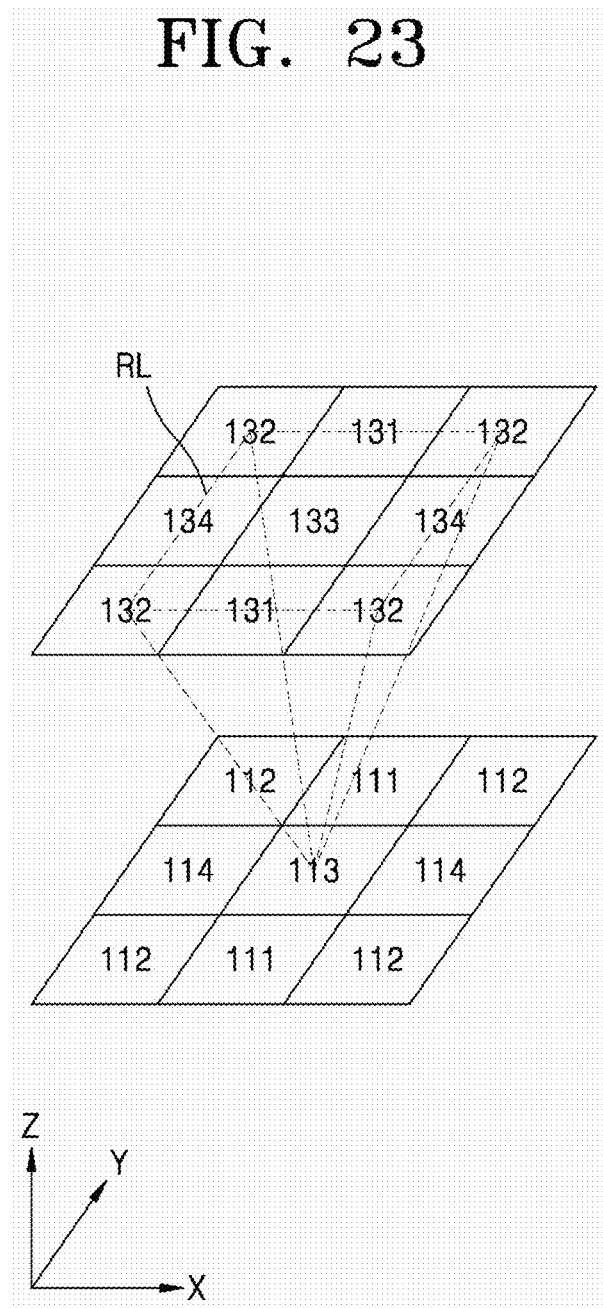
FIG. 23 is a diagram showing an example of a proceeding direction of red light incident on a red light condensing region according to an example embodiment.
Figure 24:
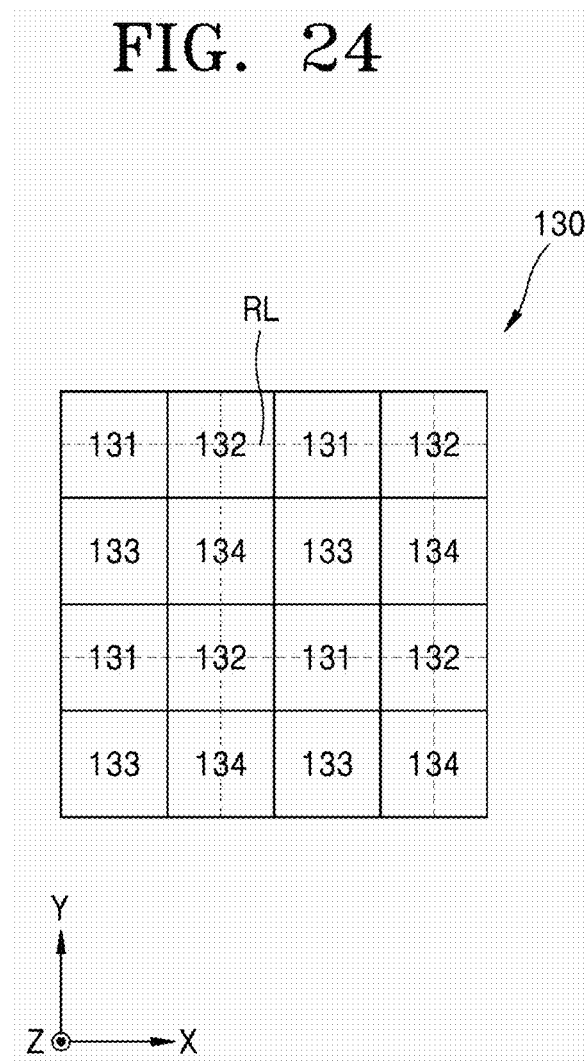
FIG. 24 is a diagram showing an array of a red light condensing region according to an example embodiment.
Figure 25:
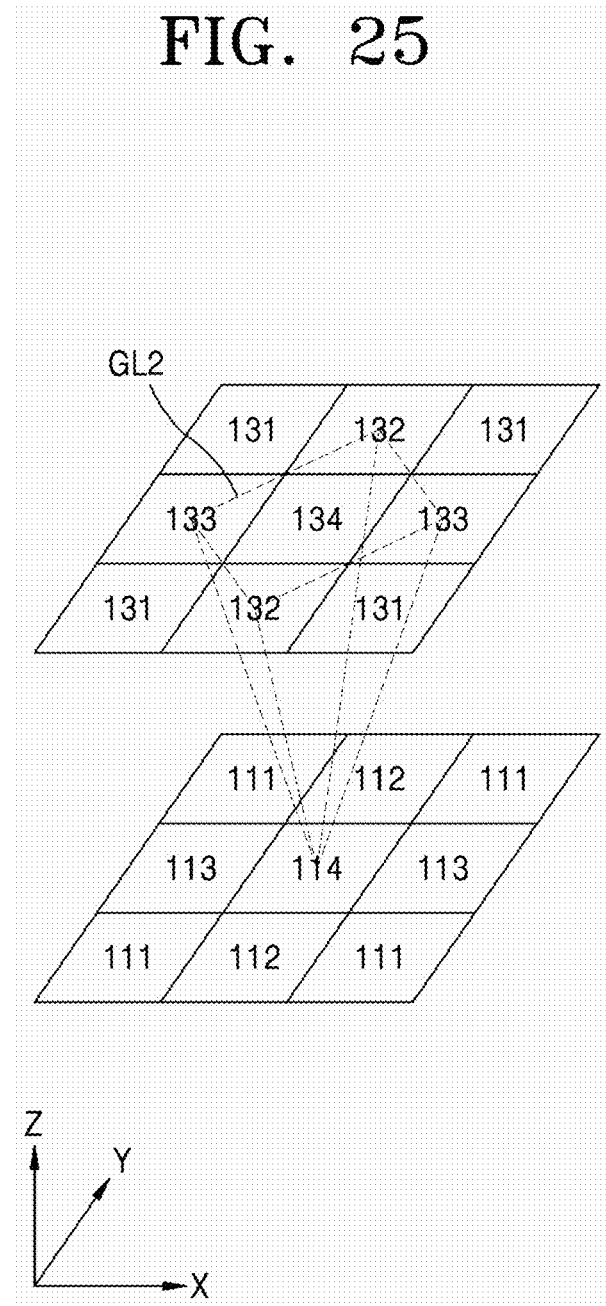
FIG. 25 is a diagram showing an example of a proceeding direction of green light incident on a second green light condensing region according to an example embodiment.
Figure 26:
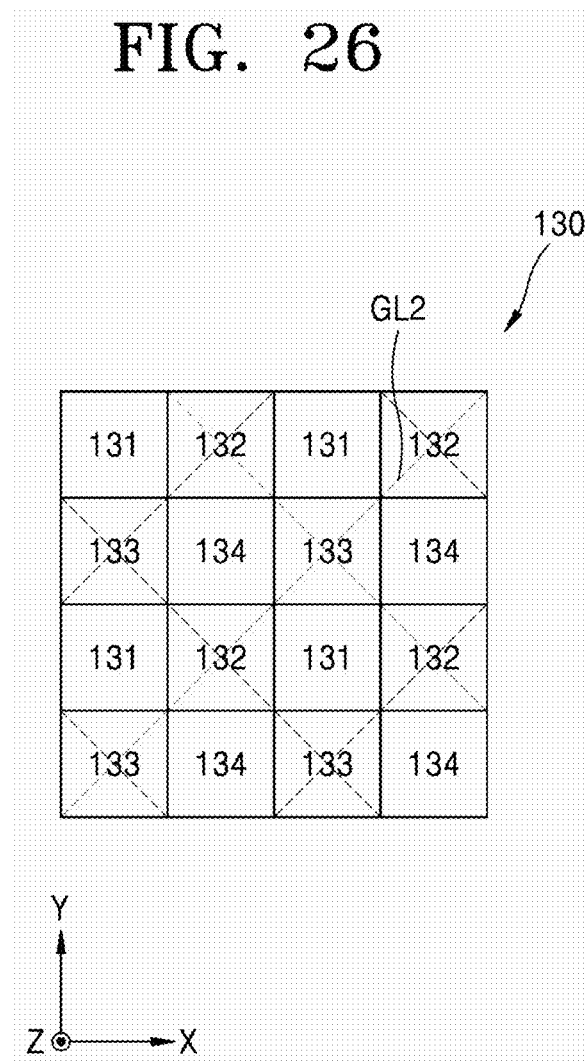
FIG. 26 is a diagram showing an array of a second green light condensing region according to an example embodiment.

FIG. 23 is a diagram showing an example of a proceeding direction of red light incident on a red light condensing region according to an example embodiment. FIG. 24 is a diagram showing an array of a red light condensing region. FIG. 25 is a diagram showing an example of a proceeding direction of green light incident on a second green light condensing region according to an example embodiment. FIG. 26 is a diagram showing an array of a second green light condensing region according to an example embodiment.

The red light is condensed onto the third pixel 113 by the color separating lens array 130 as shown in FIG. 23, and the red light from the pixel corresponding regions 131, 132, 133, and 134 is incident on the third pixel 113. In the phase profile of the red light described above with reference to FIGS. 20 and 21, the red light that has passed through a red light condensing region RL that is obtained by connecting centers of four second pixel corresponding regions 132 adjacent to the third pixel corresponding region 133 at apexes is condensed onto the third pixel 113. Therefore, as shown in FIG. 24, the color separating lens array 130 may operate as a red light condensing region array for condensing the red light to the third pixel 113. The red light condensing region RL has an area greater than that of the third pixel 113, e.g., may be 1.5 to 4 times greater. The red light condensing region RL may partially overlap the first and second green light condensing regions GL1 and GL2 and the blue light condensing region BL.

Referring to FIGS. 25 and 26, the green light incident on the vicinity of the fourth pixel corresponding region 134 proceeds similarly to the green light incident on the vicinity of the first pixel corresponding region 131, and as shown in FIG. 25, the green light is condensed onto the fourth pixel 114. Therefore, as shown in FIG. 26, the color separating lens array 130 may operate as a second green light condensing region array for condensing the green light onto the fourth pixel 114. The second green light condensing region GL2 may have a greater area than that of the corresponding fourth pixel 114, e.g., may be 1.2 times to twice greater.

The color separating lens array 130 satisfying the above phase profile and performance described above may be automatically designed through various types of computer simulations. For example, the structures of the pixel corresponding regions 131, 132, 133, and 134 may be optimized through a nature-inspired algorithm such as a genetic algorithm, a particle swarm optimization algorithm, an ant colony optimization algorithm, etc., or a reverse design based on an adjoint optimization algorithm.

The structures of the green, blue, and red pixel corresponding regions may be optimized while evaluating performances of a plurality of candidate color separating lens arrays based on evaluation factors such as color separation spectrum, optical efficiency, signal-to-noise ratio, etc. when designing the color separating lens array. For example, the structures of the green, blue, and red pixel corresponding regions may be optimized in a manner such that a target numerical value of each evaluation factor is determined in advance and the sum of the differences between the target numerical values of a plurality of evaluation factors is reduced. Alternatively, the performance may be indexed for each evaluation factor, and the structures of the green, blue, and red pixel corresponding regions may be optimized in a manner such that a value representing the performance may be maximized.

In addition, at least one or all of the first to fourth pixels 111, 112, 113, and 114 of the pixel array 1100 may include two or more independent photosensitive cells, and two or more photosensitive cells included in one pixel may share the condensing region of the color separating lens array 130. When a plurality of photosensitive cells that may independently sense light are included in one pixel, a resolution of the image sensor 1000 may be improved. In addition, an auto-focusing function of the image sensor 1000 and/or a camera device including the image sensor 1000 may be implemented by using differences among signals obtained from the photosensitive cells.

For example, a phase-detection auto-focusing method implements an auto-focusing function by using a difference between intensities of light respectively incident on two independent photosensitive cells in one pixel. For example, when a focus of a lens assembly of a camera is exactly located on a surface of the pixel array 1100, light beams that respectively pass through opposite edges of the lens assembly are collected on one point on the surface of the pixel array 1100. Then, the intensities of the light respectively incident on the two independent photosensitive cells in one pixel are equal to each other. However, when the focus of the lens assembly of the camera is not located on the surface of the pixel array 1100, the light beam that has passed through one edge of the lens assembly is incident on each pixel in the pixel array 1100, more than the light beam that has passed through another edge. Also, in this case, the incident angle of the light beam incident on each pixel in the pixel array 1100 may be more inclined than a chief ray angle (CRA). Then, the intensities of the light respectively incident on the two independent photosensitive cells in one pixel are different from each other. Therefore, the auto-focusing function may be implemented by comparing two focusing signals obtained respectively from two independent photosensitive cells in one pixel.

In the above phase difference-detection auto-focusing method, the auto-focusing performance may be improved as a contrast ratio between two focusing signals increases. To improve the auto-focusing performance in the image sensor 1000 including the color separating lens array 130, a direction in which the photosensitive cells are arranged may be optimized to increase the contrast ratio of the auto-focusing signals with respect to each pixel.

Figure 27:
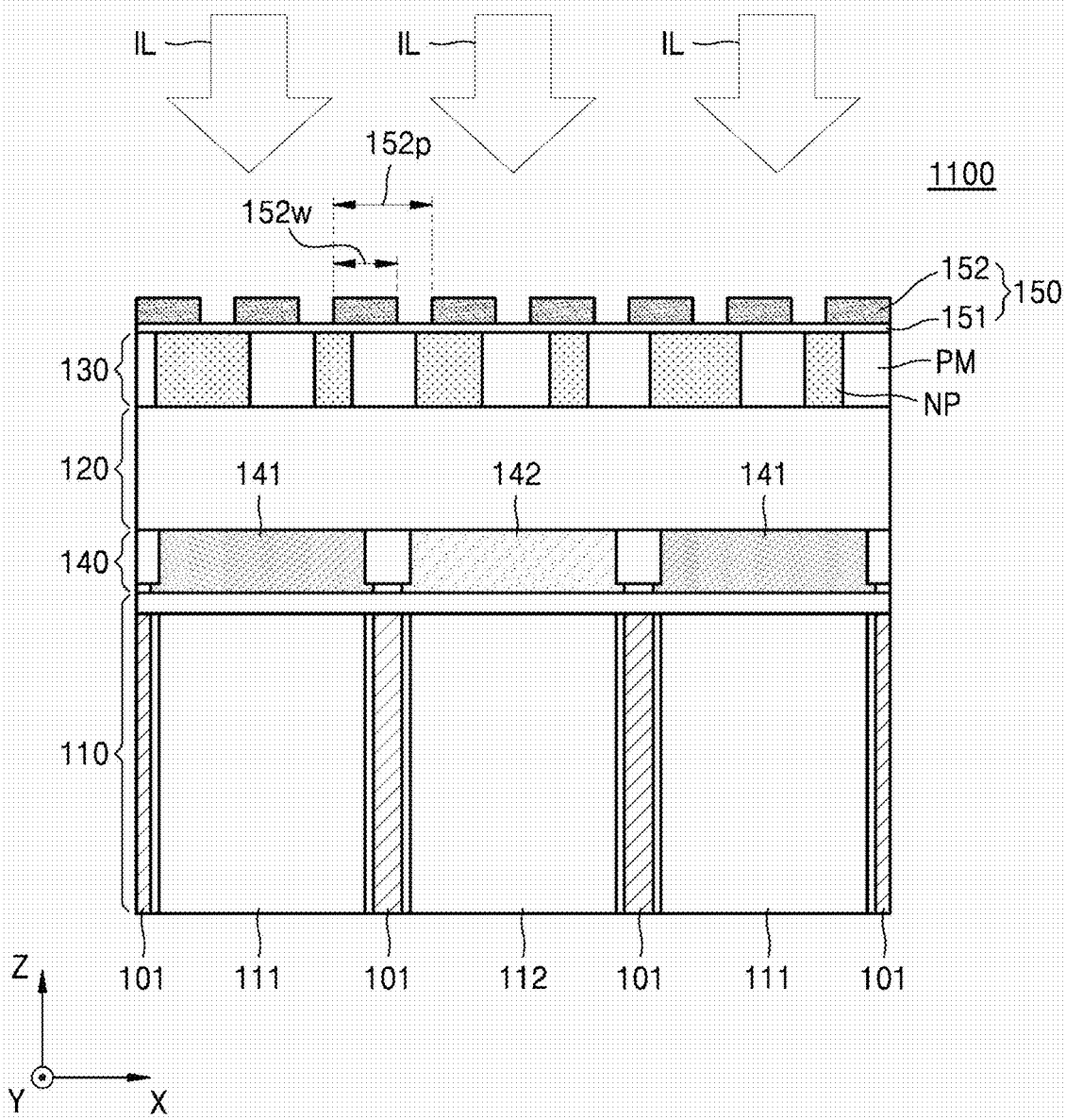
FIG. 27 is a cross-sectional view showing an example structure of a pixel array at a center portion of a pixel array according to an example embodiment.
Figure 28:
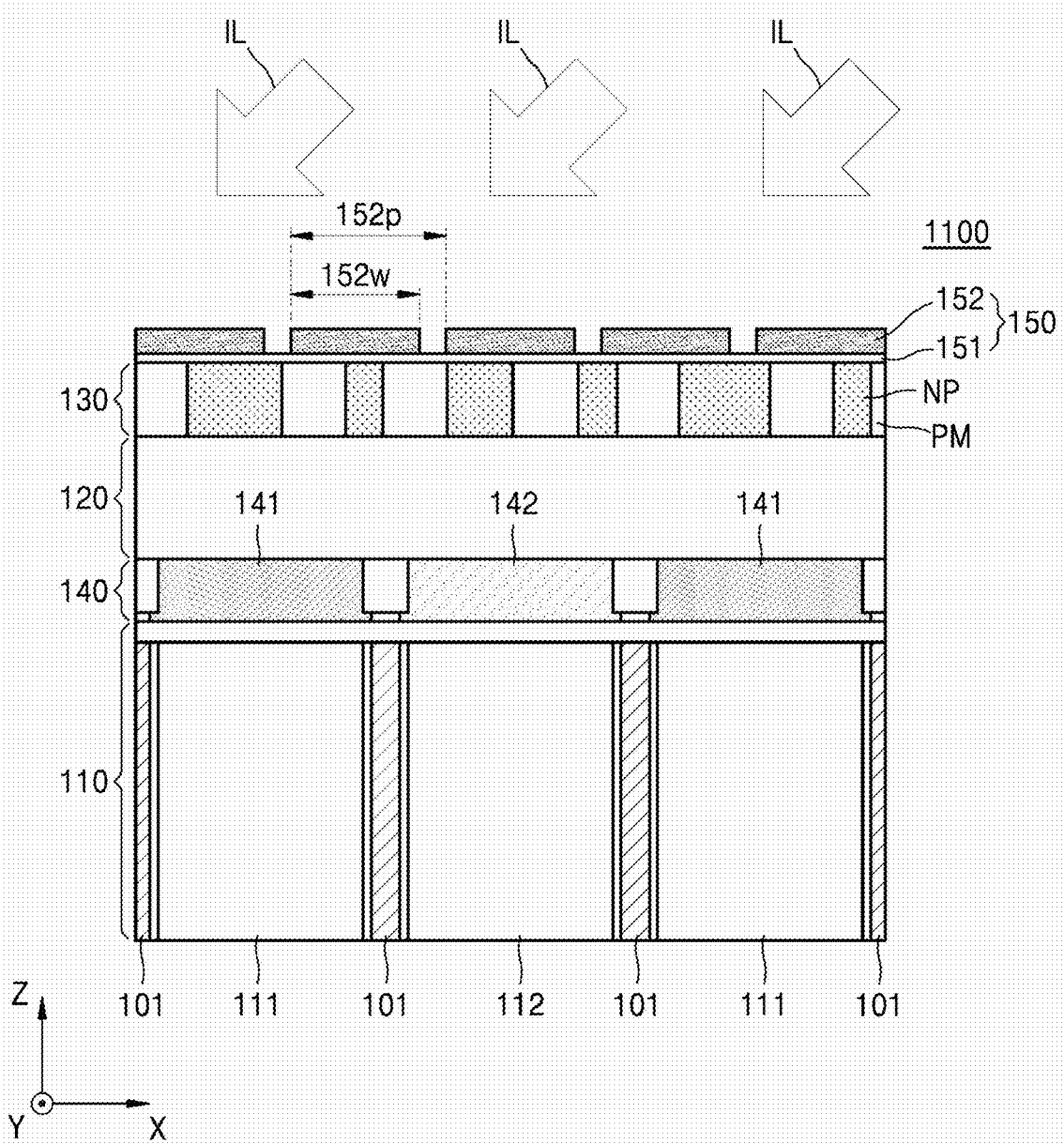
FIG. 28 is a cross-sectional view showing an example structure of a pixel array at a boundary portion of a pixel array according to an example embodiment.

FIG. 27 is a cross-sectional view showing an example structure of a pixel array at a center portion of a pixel array according to an example embodiment. FIG. 28 is a cross-sectional view showing an example structure of a pixel array at a boundary portion of a pixel array according to an example embodiment. For the brevity of description, differences from the pixel array described above with reference to FIGS. 3 and 4 will be described below.

Referring to FIG. 27, at the center portion of the pixel array 1100, the light is perpendicularly incident on a surface of the pixel array 1100 at a CRA of 0°. The low-refractive index patterns 152 may each have a first width 152*w*. The low-refractive index patterns 152 are arranged with a first period 152*p* and may have a first fill factor.

Referring to FIG. 28, at the edge portion of the image sensor 1000, the light may be obliquely incident on the surface of the pixel array 1100 at the CRA that is greater than 0°. The low-refractive index patterns 152 may each have a second width 152*w*. The low-refractive index patterns 152 are arranged with a second period 152*p* that is greater than the first period 152*p* and may have a second fill factor that is greater than the first fill factor.

Figure 29:
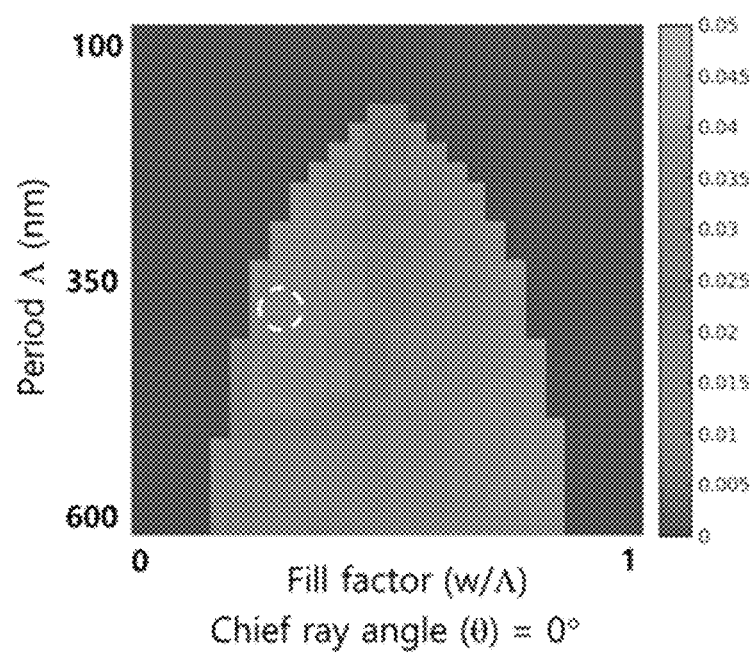
FIGS. 29 to 31 are graphs of reflectivities according to a period of low-refractive index patterns and a fill factor described with reference to FIGS. 27 and 28.
Figure 30:
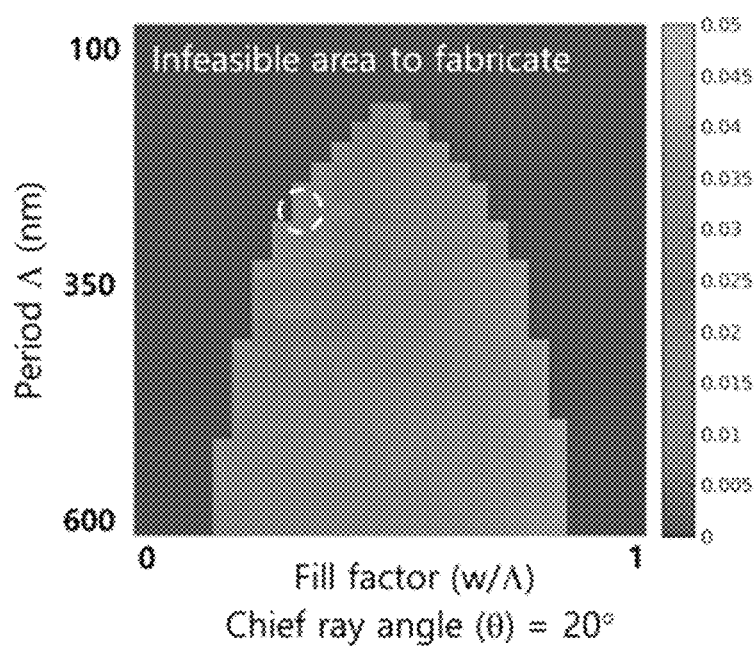
Figure 31:
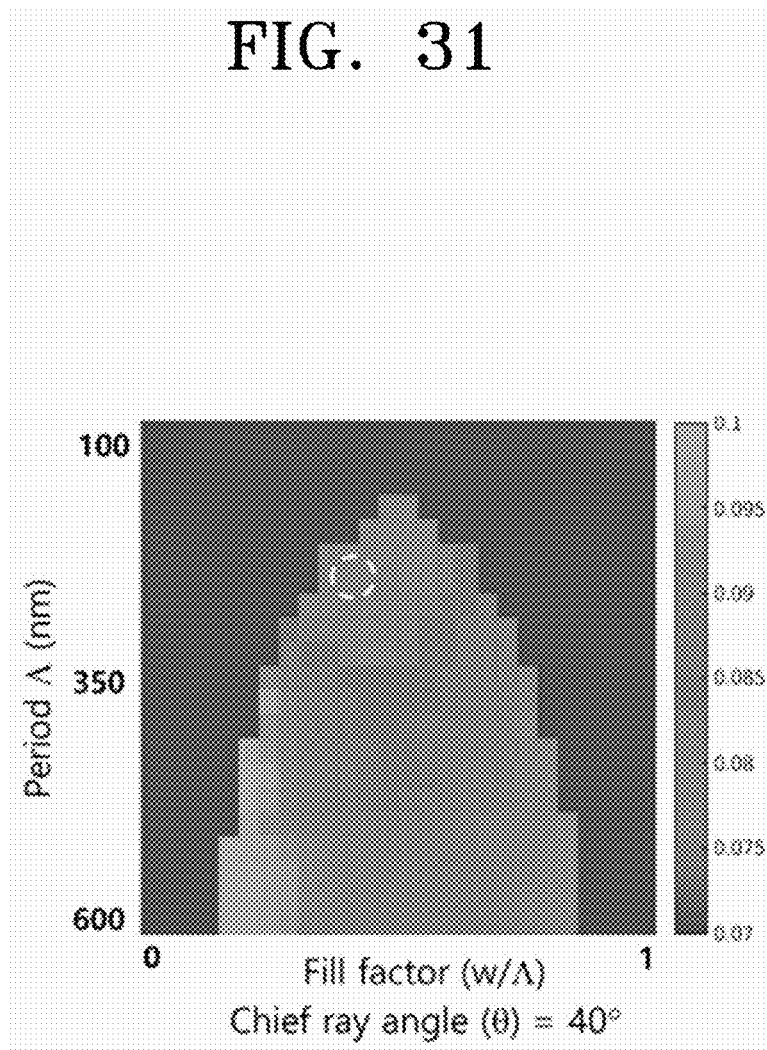

FIGS. 29 to 31 are reflectivity graphs according to a period of low-refractive index patterns and a fill factor described above with reference to FIGS. 27 and 28.

Referring to FIGS. 29 to 31, a reflectivity graph when the CRA is 0° (FIG. 29), a reflectivity graph when the CRA is 20° (FIG. 30), and a reflectivity graph when the CRA is 40° (FIG. 31) are shown. A circle with dashed line denotes a portion having the lowest reflectivity. When the CRA is 0°, for example, the incident light may be incident on the center portion of the pixel array 1100. When the CRA is 20°, for example, the incident light may be incident on a first edge of the pixel array 1100. When the CRA is 40°, for example, the incident light may be incident on a second edge of the pixel array 1100, which is farther from the center portion than the first edge of the pixel array 1100 is.

The arrangement period and the fill factor of the low-refractive index patterns 152 which allow the reflectivity to be the lowest when the CRA is 20° may be greater than those of the low-refractive index patterns 152 which allow the reflectivity to be the lowest when the CRA is 0°. The arrangement period and the fill factor of the low-refractive index patterns 152 which allow the reflectivity to be the lowest when the CRA is 40° may be greater than those of the low-refractive index patterns 152 which allow the reflectivity to be the lowest when the CRA is 20°. That is, as the CRA is increased, the period and the fill factor of the low-refractive index patterns 152, which make the reflectivity to be the lowest, may be increased.

In an example embodiment, the CRA at the center portion of the pixel array 1100 is 0°, and the CRA may increase away from the center portion. Therefore, the arrangement period and the fill factor of the low-refractive index patterns 152 are set to be increased away from the center portion of the pixel array 1100, and thus, the pixel array 1100 and the image sensor 1000 having low reflectivity and improved quantum efficiency may be provided.

Figure 32:
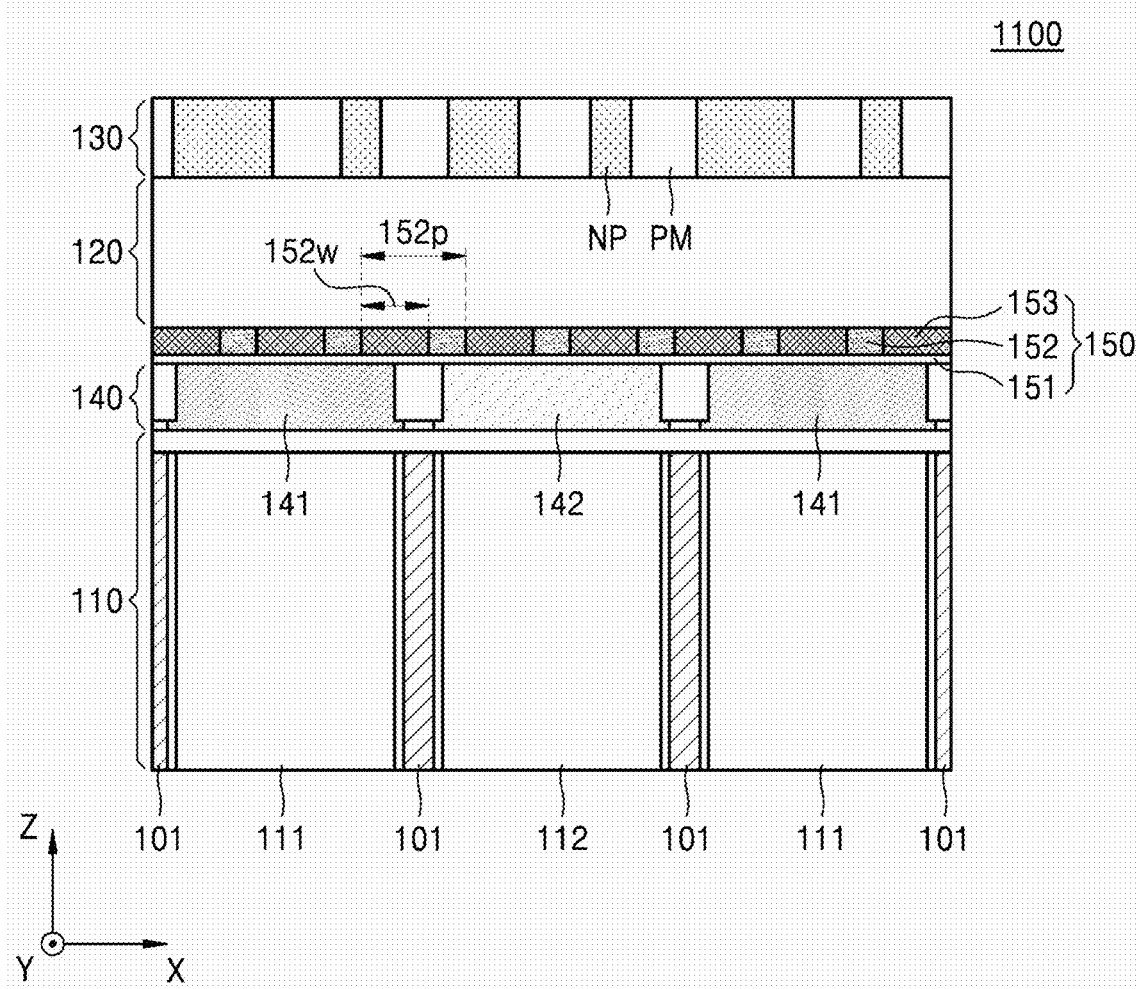
FIG. 32 is a cross-sectional view of a pixel array in an image sensor according to an example embodiment.

FIG. 32 is a cross-sectional view of a pixel array in an image sensor according to an example embodiment. For the brevity of description, differences from the pixel array described above with reference to FIG. 3 will be described below.

Referring to FIG. 32, unlike the example shown in FIG. 3, the anti-reflection element 150 may be provided between the color filter array 140 and the spacer layer 120. The anti-reflection element 150 may further include gap-fill patterns 153 filled among the low-refractive index patterns 152. The refractive index of the gap-fill patterns 153 may have a value between the refractive index of the low-refractive index patterns 152 and the refractive index of the high-refractive index film 151.

The anti-reflection element 150 of the present embodiment may be also applied to the pixel array 1100 shown in FIG. 4.

According to the disclosure, the pixel array 1100 and the image sensor 1000 having the low reflectivity and improved quantum efficiency may be provided.

Figure 33:
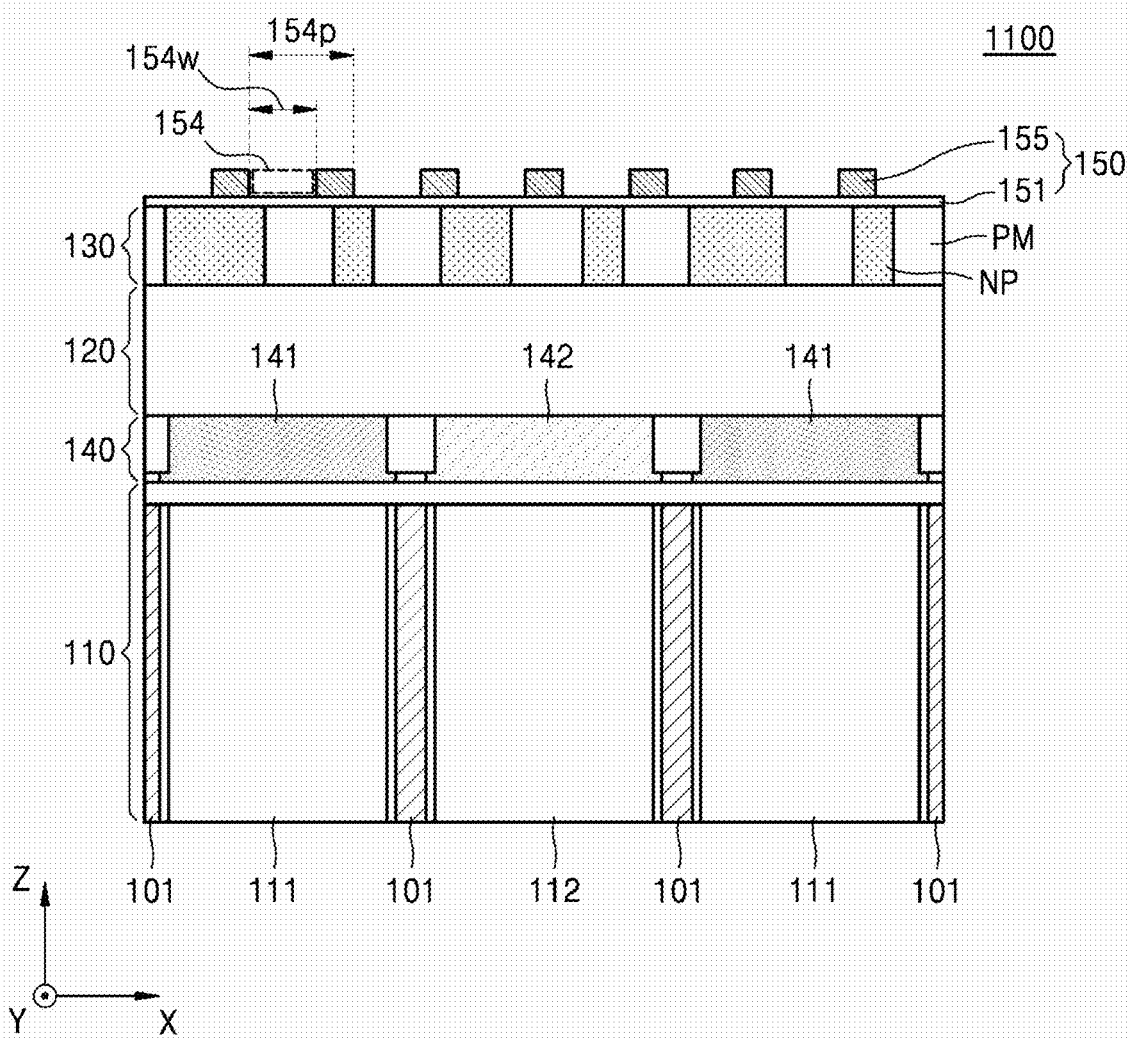
FIG. 33 is a cross-sectional view of a pixel array in an image sensor according to an example embodiment.
Figure 34:
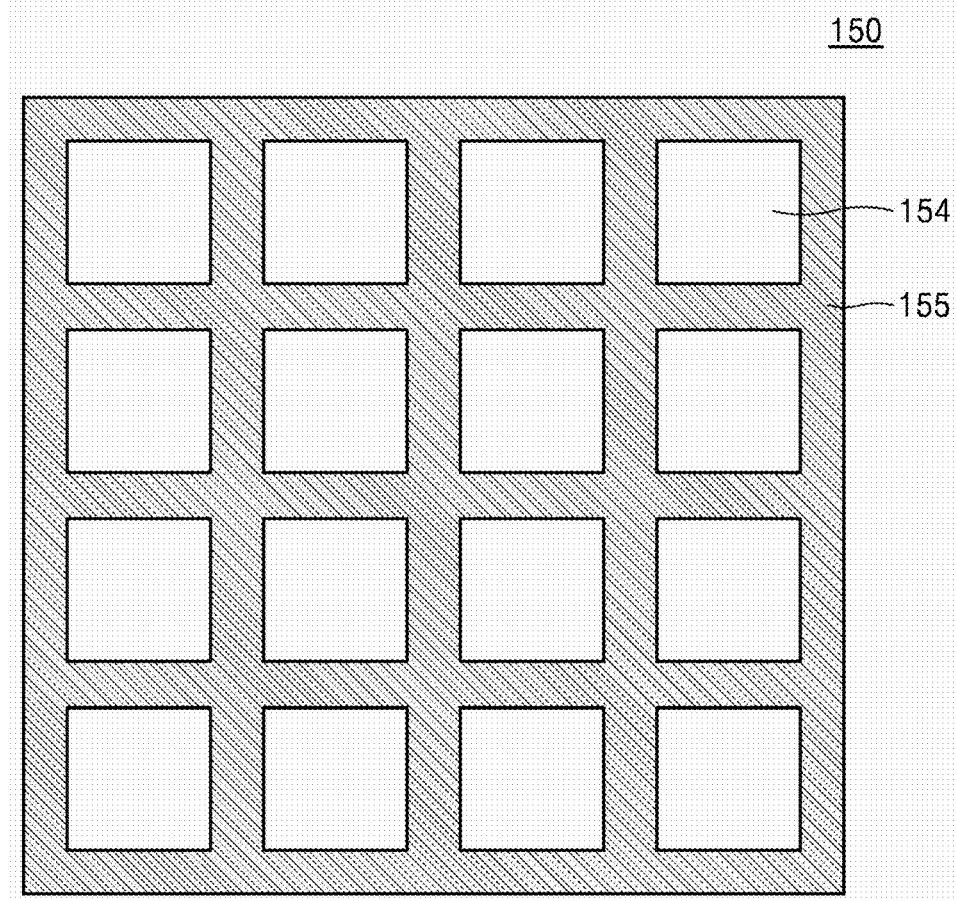
FIGS. 34 and 35 are plan views showing examples of an anti-reflection element of FIG. 33.
Figure 35:
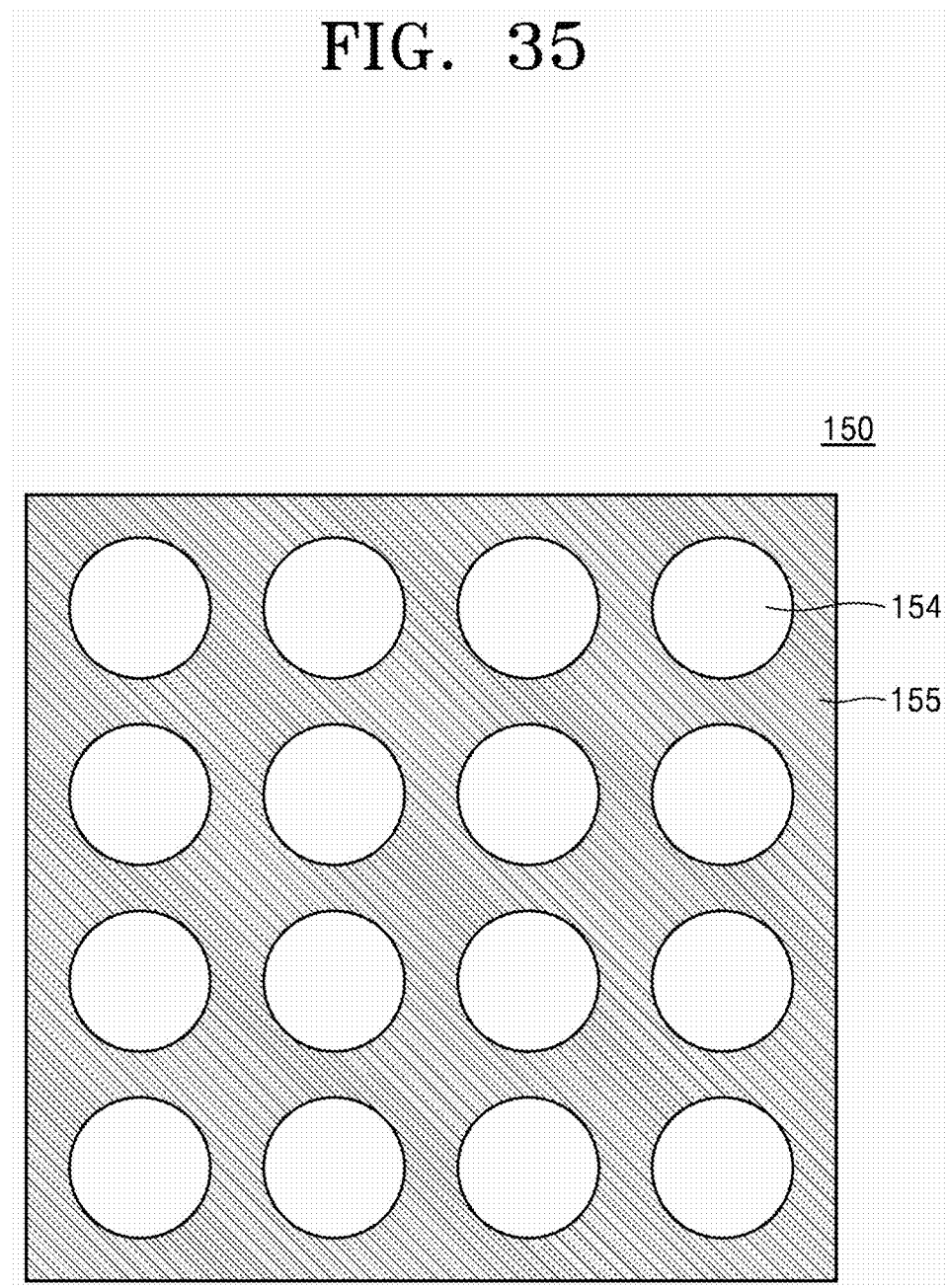

FIG. 33 is a cross-sectional view of a pixel array in an image sensor according to an example embodiment. FIGS. 34 and 35 are plan views showing examples of an anti-reflection element of FIG. 33. For the brevity of description, differences from the pixel array described above with reference to FIG. 3 will be described below.

Referring to FIG. 33, unlike the example shown in FIG. 3, the anti-reflection element 150 may include a low-refractive index layer 155 including anti-reflection holes 154, instead of the low-refractive index patterns 152. The low-refractive index layer 155 may include a material having a lower refractive index than that of the high-refractive index film 151. For example, the low-refractive index layer 155 may include $SiO_2$. A thickness of the low-refractive index layer 155 may be greater than that of the high-refractive index film 151. For example, the thickness of the high-refractive index film 151 may be about 50 nm, and the thickness of the low-refractive index layer 155 may be about 100 nm.

The anti-reflection holes 154 may penetrate through the low-refractive index layer 155. The anti-reflection holes 154 may expose the high-refractive index film 151. The anti-reflection holes 154 may be arranged on the high-refractive index film 151. The anti-reflection holes 154 may be arranged in the first direction (X direction) and the second direction (Y direction). However, one or more embodiments are not limited to the above example. The arrangement type of the anti-reflection holes 154 may be determined as appropriate. The anti-reflection holes 154 may each have a column shape. For example, the anti-reflection holes 154 may each have a square column shape as shown in FIG. 34 or a circular column shape as shown in FIG. 35. However, one or more embodiments are not limited to the above example. In another example embodiment, the anti-reflection holes 154 may each have a polygonal column shape (e.g., a triangular column shape or a pentagonal column shape), rather than the square column shape.

An effective refractive index of the low-refractive index layer 155 may be substantially equal to a square root of the effective refractive index of the color separating lens array 130. In an example embodiment, the effective refractive index of the low-refractive index layer 155 may be defined by the fill factor of the anti-reflection holes 154. The fill factor of the anti-reflection holes 154 may denote a ratio of a width 154w of the anti-reflection hole 154 to the arrangement period 154p of the anti-reflection holes 154. As an area occupied by the anti-reflection holes 154 in the low-refractive index layer 155 increases, the fill factor of the anti-reflection holes 154 may increase.

The effective refractive index of the low-refractive index layer 155 may be less than an effective refractive index of the low-refractive index material layer that is not patterned. As described above, the effective refractive index of the low-refractive index layer 155 may be determined by the fill factor of the anti-reflection holes 154. For example, the effective refractive index of the color separating lens array 130 may be about 1.6. In this case, the fill factor of the anti-reflection holes 154 may be determined as about 1.26 that is the square root of the effective refractive index, e.g., 1.6, of the low-refractive index material layer that is not patterned. For example, when the low-refractive index layer 155 includes $SiO_2$, a $SiO_2$ layer having an effective refractive index of about 1.48 is patterned to form the anti-reflection holes 154 having the fill factor of about 0.5 (that is, the low-refractive index layer 155 remaining after removing about half the $SiO_2$ layer that is not patterned). However, in an example embodiment, the fill factor of the anti-reflection holes 154 may vary depending on the position thereof.

The anti-reflection element 150 of the present embodiment may be also applied to the pixel array 1100 shown in FIG. 4.

According to the disclosure, the pixel array 1100 and the image sensor 1000 having the low reflectivity and improved quantum efficiency may be provided.

Figure 36:
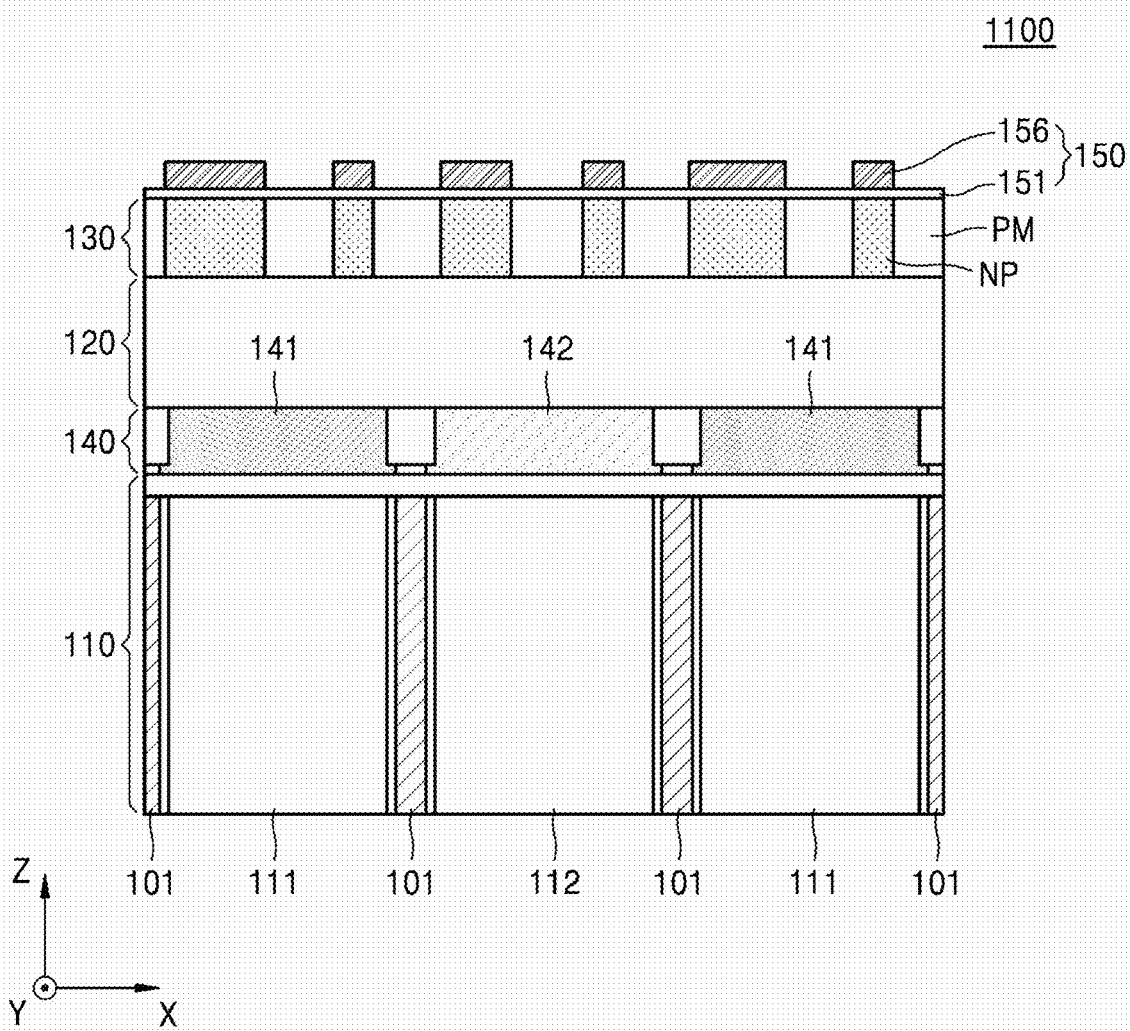
FIG. 36 is a cross-sectional view of a pixel array in an image sensor according to an example embodiment.

FIG. 36 is a cross-sectional view of a pixel array in an image sensor according to an example embodiment. For the brevity of description, differences from the pixel array described above with reference to FIG. 3 will be described below.

Referring to FIG. 36, unlike the example of FIG. 3, low-refractive index patterns 156 of the anti-reflection element 150 may be aligned with adjacent nanoposts NP in the third direction (Z direction), respectively. The low-refractive index patterns 156 may have substantially the same shapes as those of the nanoposts NP. For example, when the nanoposts NP have the circular column shapes, the low-refractive index patterns 156 may each have a circular column shape having the same cross-sectional area as that of a corresponding nanopost NP. In an example embodiment, the low-refractive index patterns 156 may be formed by using an etching mask that is used in the process of forming the nanoposts NP. When the low-refractive index patterns 156 and the nanoposts NP are formed by using the same etching mask, processing costs (or processing unit price) required when an additional etching mask is used may be reduced. The anti-reflection element 150 of the present embodiment may be also applied to the pixel array 1100 shown in FIG. 4.

Figure 37:
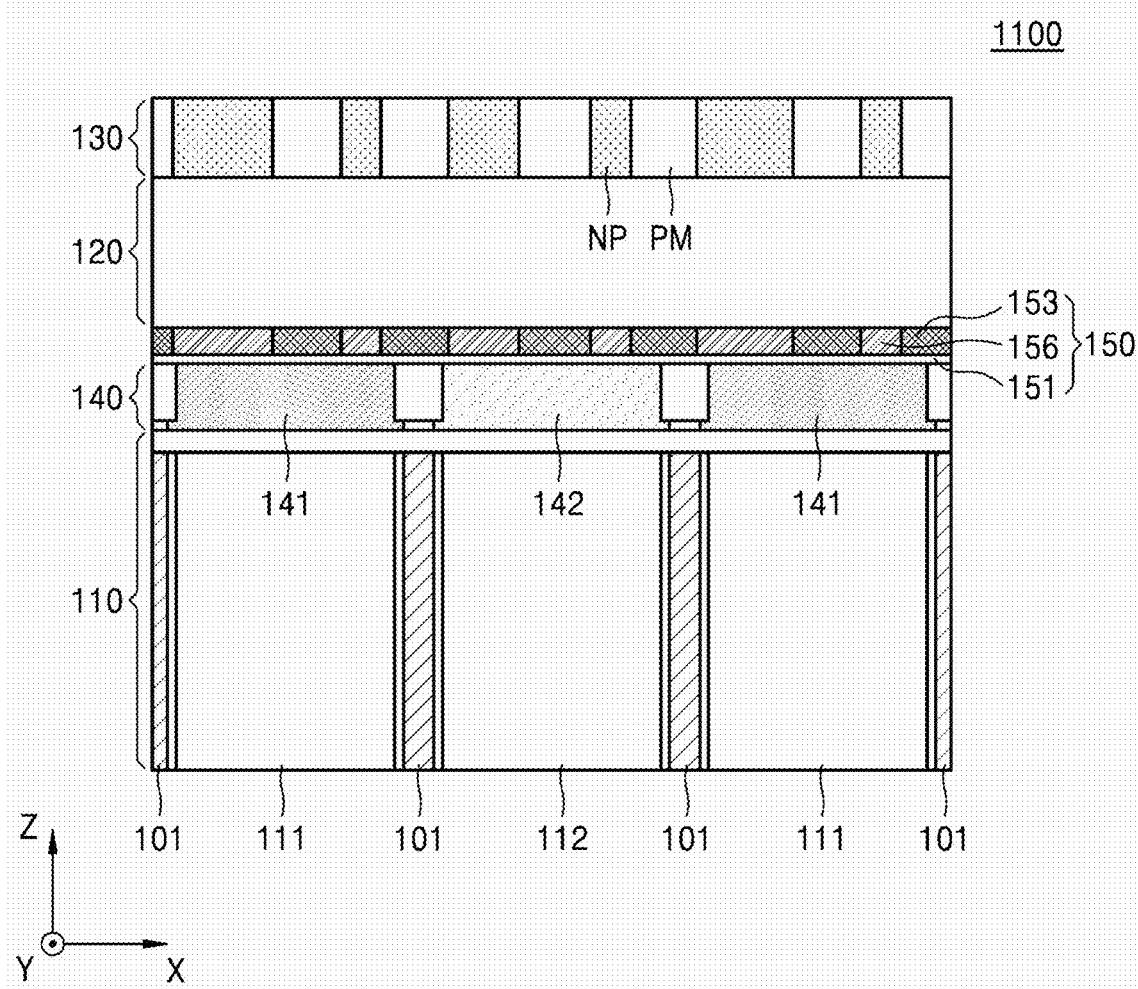
FIG. 37 is a cross-sectional view of a pixel array in an image sensor according to an example embodiment.

FIG. 37 is a cross-sectional view of a pixel array in an image sensor according to an example embodiment. For the brevity of description, differences from the pixel array described above with reference to FIG. 32 will be described below.

Referring to FIG. 37, unlike the example of FIG. 32, low-refractive index patterns 156 of the anti-reflection element 150 may be aligned with adjacent nanoposts NP in the third direction (Z direction), respectively. The low-refractive index patterns 156 may have substantially the same shapes as those of the nanoposts NP. For example, when the nanoposts NP have the circular column shapes, the low-refractive index patterns 156 may each have a circular column shape having the same cross-sectional area as that of a corresponding nanopost NP. In an example embodiment, the nanoposts NP may be formed by using an etching mask that is used in the process of forming the low-refractive index patterns 156. When the low-refractive index patterns 156 and the nanoposts NP are formed by using the same etching mask, processing costs (or processing unit price) required when an additional etching mask is used may be reduced.

Figure 38:
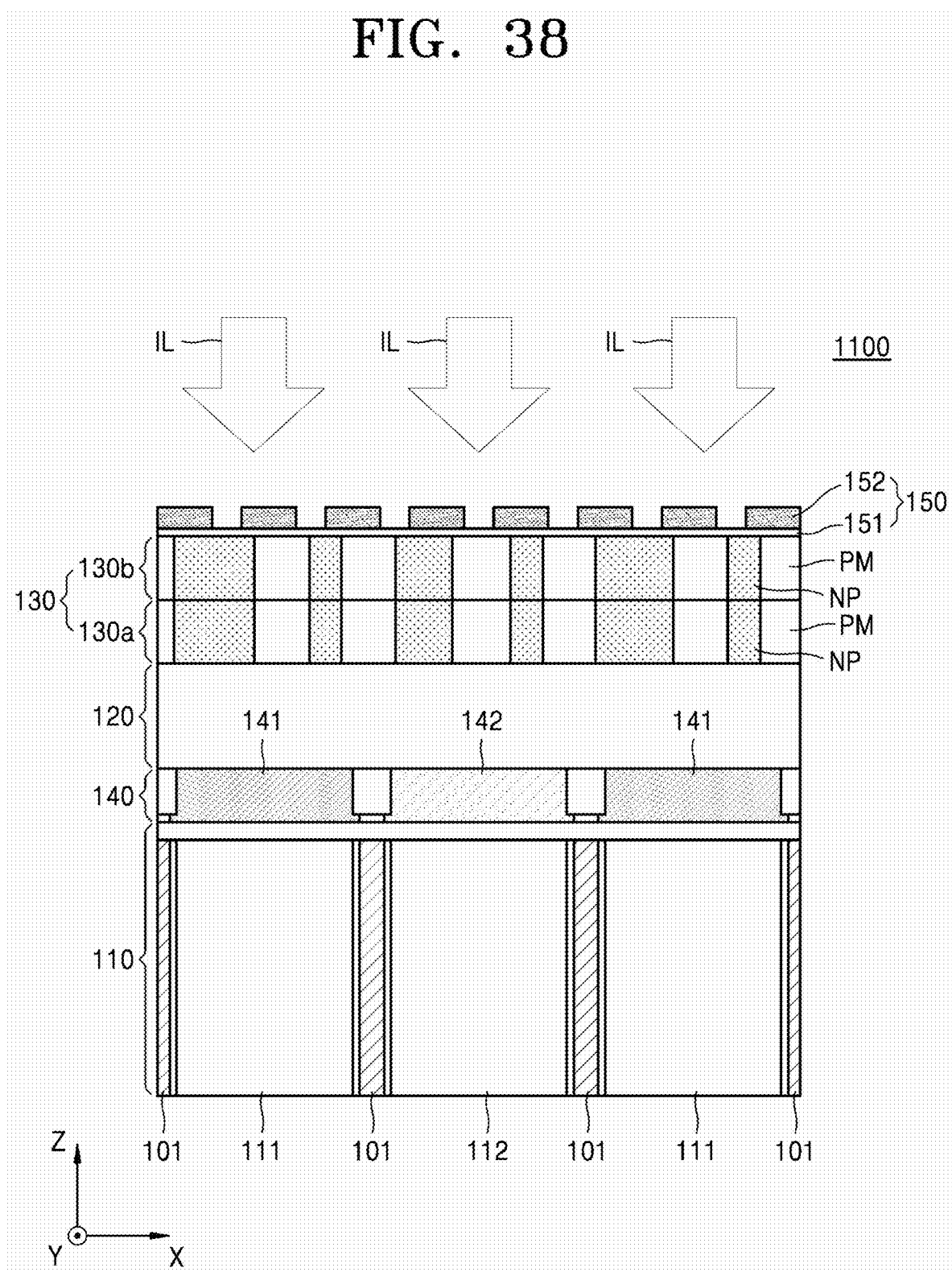
FIG. 38 is a cross-sectional view showing an example structure of a pixel array at a center portion of a pixel array according to an example embodiment.
Figure 39:
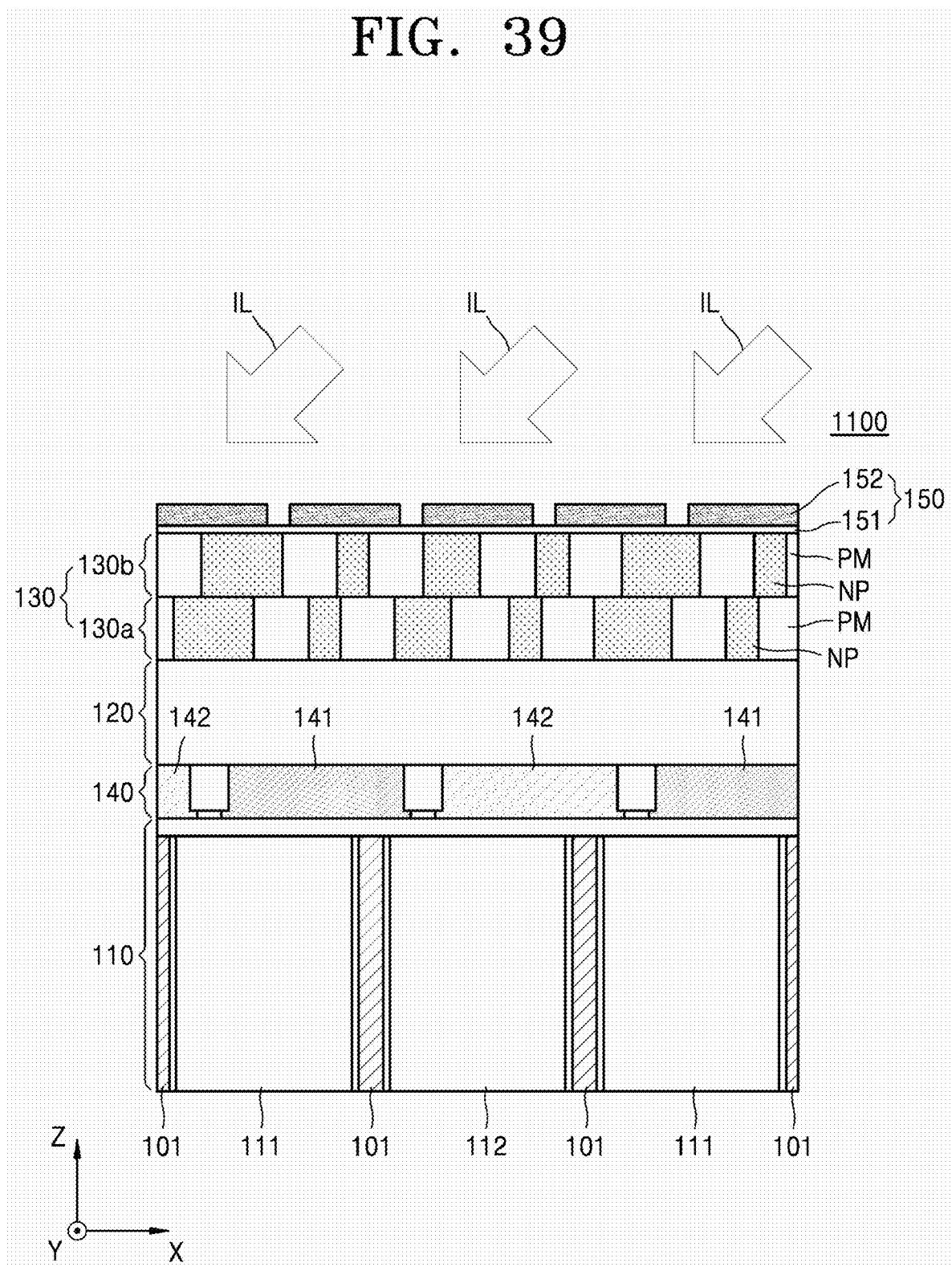
FIG. 39 is a cross-sectional view showing an example structure of a pixel array at a boundary portion of a pixel array according to an example embodiment.

FIG. 38 is a cross-sectional view showing an example structure of a pixel array at a center portion of a pixel array according to an example embodiment. FIG. 39 is a cross-sectional view showing an example structure of a pixel array at a boundary portion of a pixel array according to an example embodiment. For the brevity of description, differences from the pixel array described above with reference to FIGS. 27 and 28 will be described below.

Referring to FIGS. 38 and 39, unlike the example shown in FIGS. 27 and 28, the color separating lens array 130 may include a lower array 130a and an upper array 130b that is provided on the lower array 130a. Each of the lower array 130a and the upper array 130b may include the nanoposts NP that change the phase of incident light and a peripheral material layer PM surrounding the nanoposts NP. The peripheral material layer PM may include a dielectric material having a lower refractive index than that of the nanoposts NP, e.g., air or $SiO_2$. In an example embodiment, the lower array 130a and the upper array 130b may be equal to each other. In an example embodiment, each of the lower array 130*a* and the lower array 130*b* may be substantially the same as the color separating lens array 130 shown in FIGS. 3 and 4.

As shown in FIG. 38, the nanoposts NP of the lower array 130*a* and the nanoposts NP of the upper array 130*b* may be aligned with each other in the third direction (Z direction) in the center portion of the pixel array 1100. The nanoposts NP of the lower array 130*a* and the nanoposts NP of the upper array 130*b* may have substantially the same shapes. For example, when the nanoposts NP of the lower array 130*a* have the circular column shapes, the nanoposts NP of the upper array 130*b* may each have the circular column shape having the same cross-sectional area as that of corresponding nanopost NP of the lower array 130*a*. Color filters 141 and 142 and corresponding pixels 111 and 112 may be aligned with each other in the third direction (Z direction) on the center portion of the pixel array 1100. In other words, the first color filter 141 and the second color filter 142 may be respectively aligned with the first pixel 111 and the second pixel 112 in the third direction (Z direction). Although not shown in the drawings, a third color filter 143 and a fourth color filter 144 may be aligned with the third pixel 113 and the fourth pixel 114 corresponding thereto in the third direction (Z direction), on the center portion of the pixel array 1100.

As shown in FIG. 39, the lower array 130*a* and the upper array 130*b* may be shifted toward the center portion of the pixel array 1100 at the edge of the pixel array 1100. In an example embodiment, the upper array 130*b* may be further shifted toward the center portion of the pixel array 1100 than the lower array 130*a*. Accordingly, the nanoposts NP of the upper array 130*a* and the nanoposts NP of the upper array 130*b* may be arranged in the third direction (Z direction) to be deviated from each other. In other words, the nanoposts NP of the lower array 130*a* and the nanoposts NP of the upper array 130*b* may not be aligned with each other in the third direction (Z direction). The color filter array 140 may be shifted toward the center portion of the pixel array 1100 at the edge of the pixel array 1100. Accordingly, the color filters 141 and 142 and the corresponding pixels 111 and 112 may be arranged in the third direction (Z direction) to be deviated from each other. In other words, the color filters 141 and 142 and the corresponding pixels 111 and 112 may not be aligned with each other in the third direction (Z direction).

Figure 40:
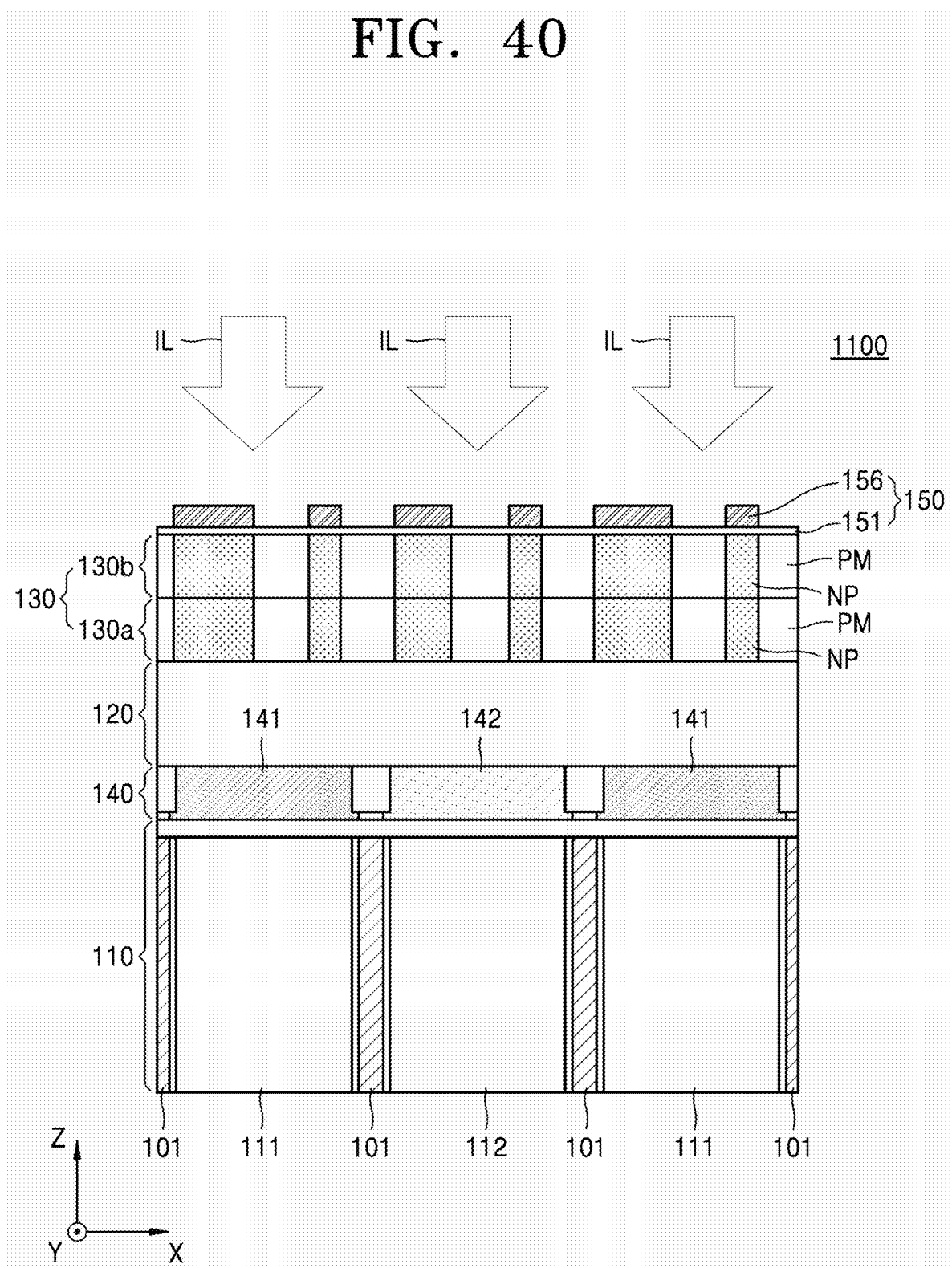
FIG. 40 is a cross-sectional view showing an example structure of a pixel array at a center portion of a pixel array according to an example embodiment.
Figure 41:
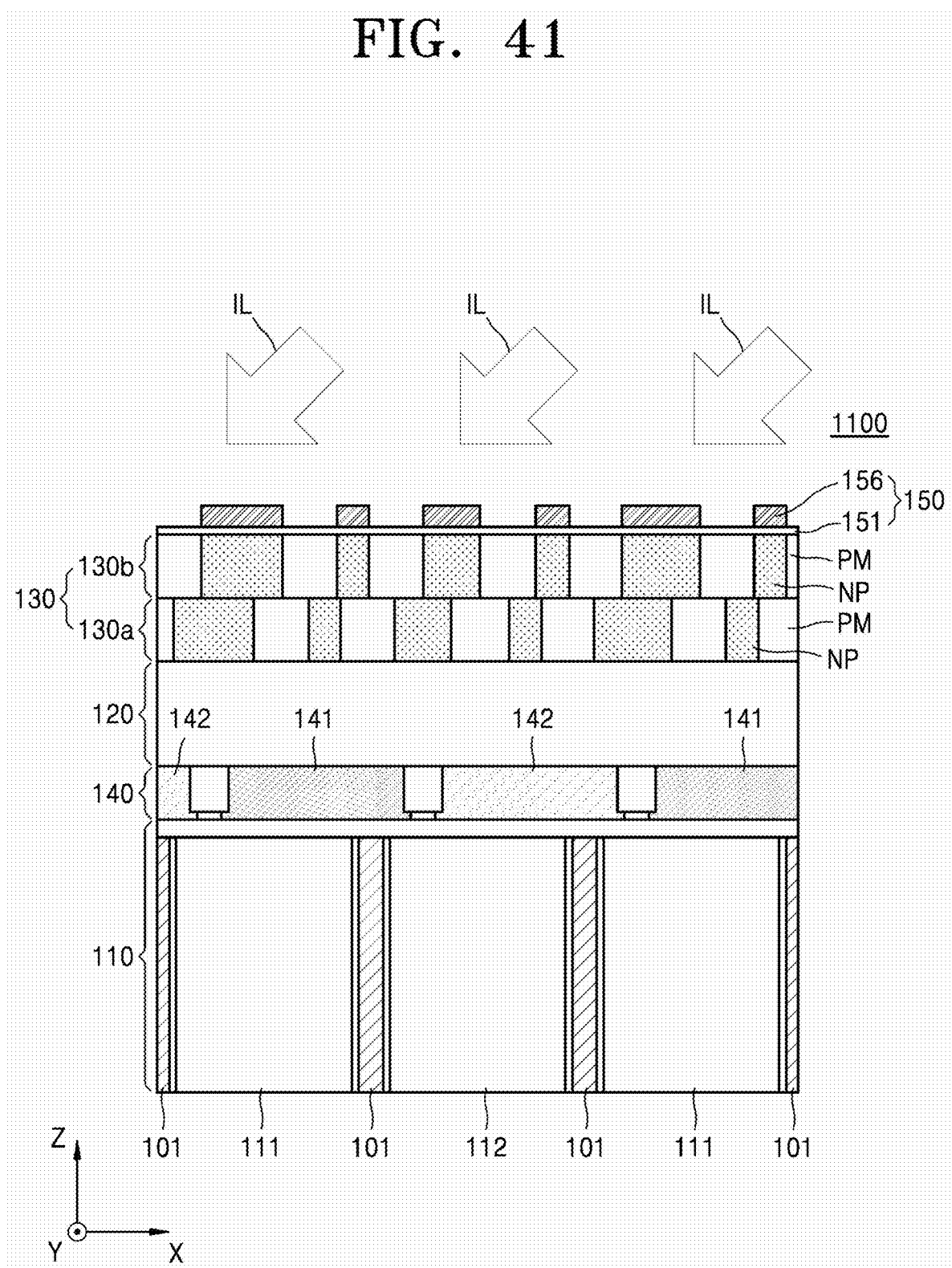
FIG. 41 is a cross-sectional view showing an example structure of a pixel array at a boundary portion of a pixel array according to an example embodiment.

FIG. 40 is a cross-sectional view showing an example structure of a pixel array at a center portion of a pixel array according to an example embodiment. FIG. 41 is a cross-sectional view showing an example structure of a pixel array at a boundary portion of a pixel array according to an example embodiment. For the brevity of description, differences from the pixel array described above with reference to FIGS. 38 and 39 will be described below.

Referring to FIGS. 40 and 41, unlike the example of FIGS. 38 and 39, the anti-reflection element 150 and the low-refractive index patterns 156 may be aligned with the nanoposts NP of the upper array 130*b* in the third direction (Z direction). The low-refractive index patterns 156 may have substantially the same shapes as those of the nanoposts NP of the upper array 130*b*. For example, when the nanoposts NP of the upper array 130*b* have the circular column shapes, the low-refractive index patterns 156 may each have a circular column shape having the same cross-sectional area as that of a corresponding nanopost NP. In an example embodiment, the low-refractive index patterns 156 may be formed by using an etching mask that is used in the process of forming the nanoposts NP of the upper array 130*b*. When the low-refractive index patterns 156 and the nanoposts NP of the upper array 130*b* are formed by using the same etching mask, processing costs (or processing unit price) required when an additional etching mask is used may be reduced.

Figure 42:
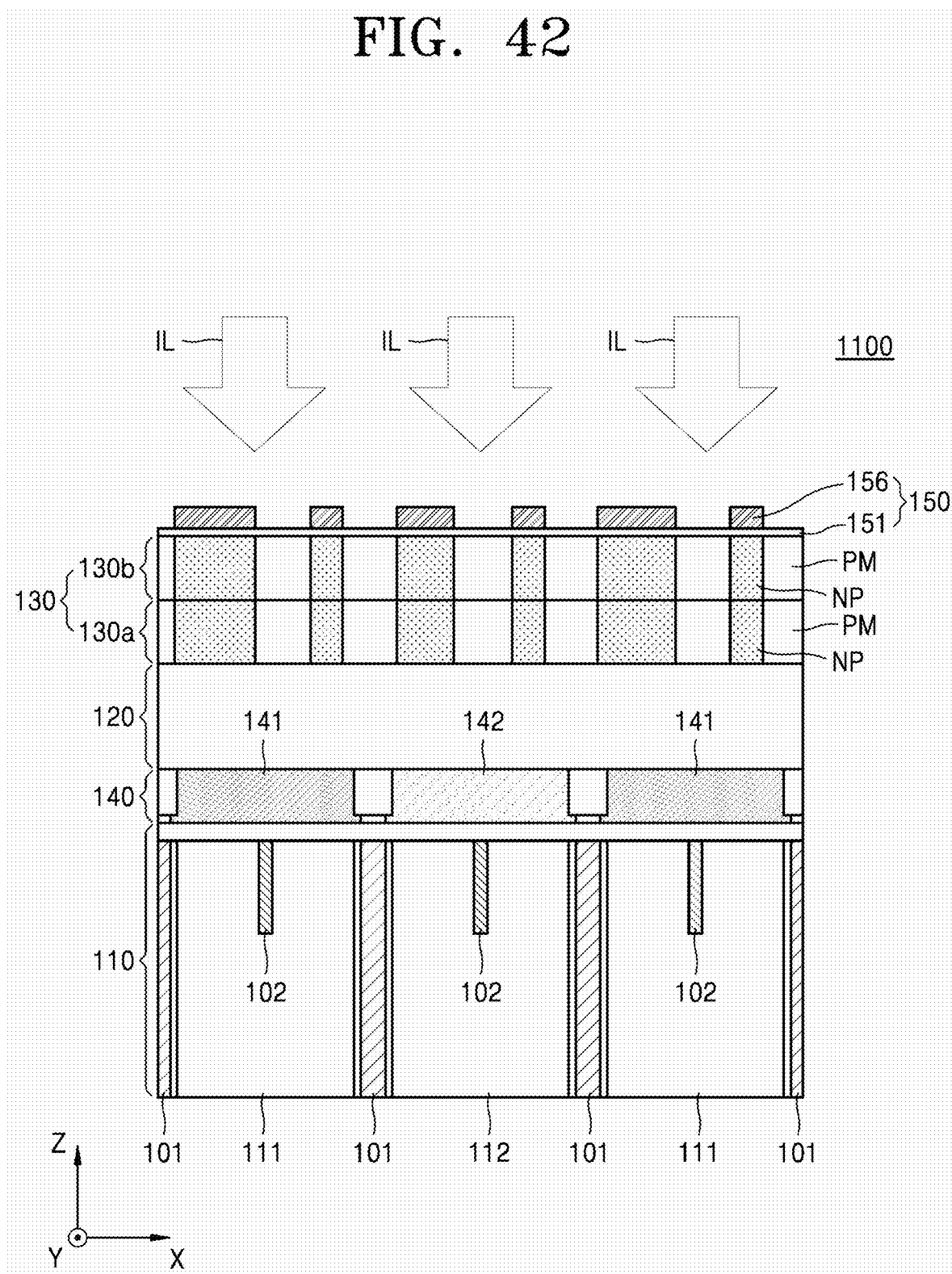
FIG. 42 is a cross-sectional view showing an example structure of a pixel array at a center portion of a pixel array according to an example embodiment.
Figure 43:
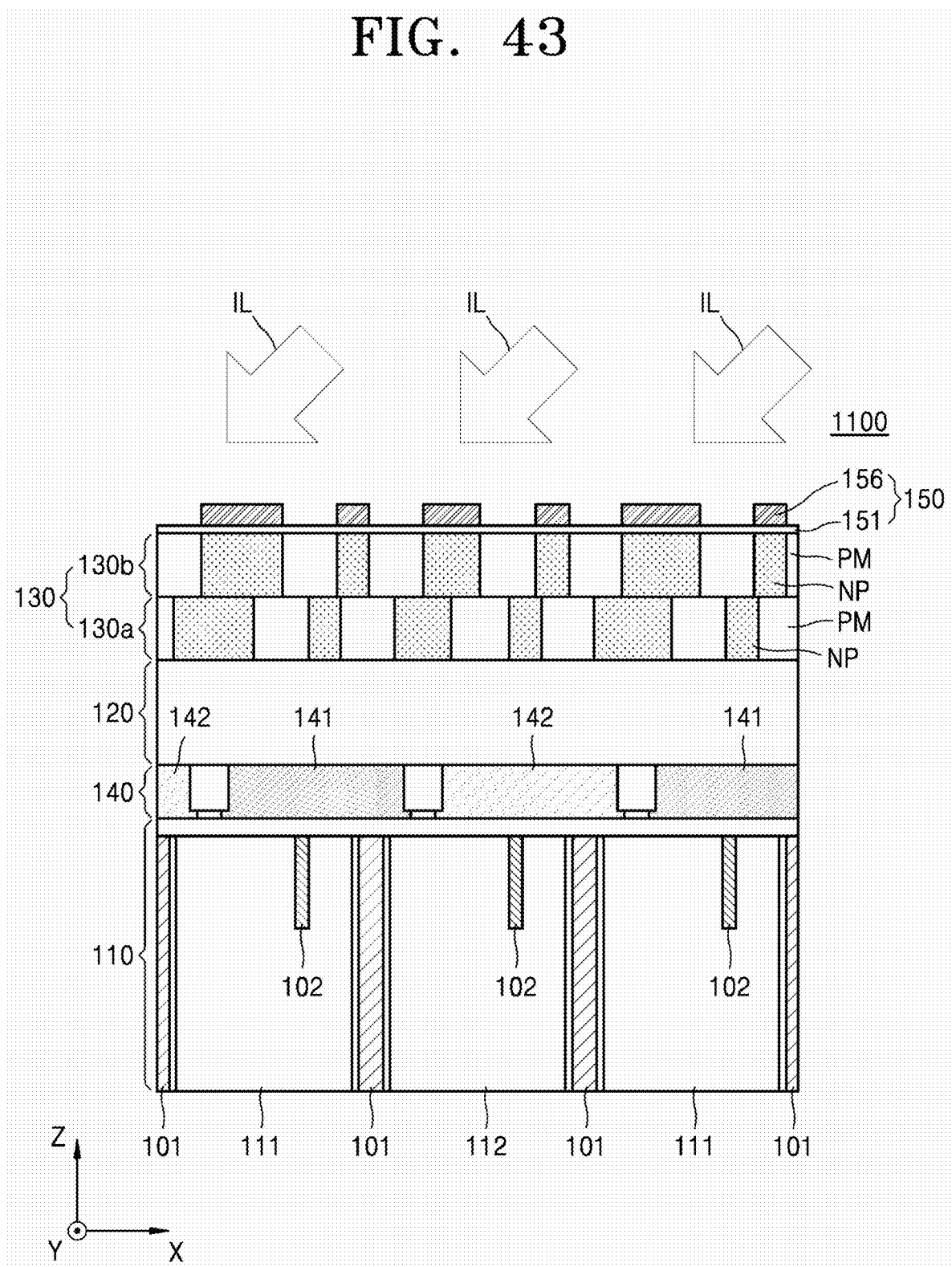
FIG. 43 is a cross-sectional view showing an example structure of a pixel array at a boundary portion of a pixel array according to an example embodiment.

FIG. 42 is a cross-sectional view showing an example structure of a pixel array at a center portion of a pixel array according to an example embodiment. FIG. 43 is a cross-sectional view showing an example structure of a pixel array at a boundary portion of a pixel array according to an example embodiment. For the brevity of description, differences from the pixel array described above with reference to FIGS. 40 and 41 will be described below.

Referring to FIGS. 42 and 43, unlike the example of FIGS. 40 and 41, the sensor substrate 110 may further include cell isolation films 102 for separating adjacent photosensitive cells from each other. The cell isolation film 102 may have a height that is less than that of the pixel isolation layer 101. For example, the height of the cell isolation film 102 may be about ¼ to ½ of the height of the pixel isolation layer 101. The cell isolation film 102 may extend in the third direction (Z direction) from the upper surface of the sensor substrate 110 to an intermediate portion in a light transferring layer 103 of the sensor substrate 110. The cell isolation film 102 may further improve a contrast ratio of an automatic focusing signal by reducing the crosstalk between adjacent photosensitive cells. However, the cell isolation film 102 may absorb and/or reflect the light and generate loss of light, and thus, may be omitted in an embodiment. For example, in the third pixel 113 that is the red pixel having a relatively low quantum efficiency, the cell isolation film 102 may not be arranged.

As shown in FIG. 42, the cell isolation film 102 may be located at the center of each pixel on the center portion of the pixel array 1100. For example, in the first pixel 111 located at the center portion of the pixel array 1100, the cell isolation film 102 may be located to pass through the center of the first pixel 111, and in the second pixel 112 located at the center portion of the pixel array 1100, the cell isolation film 102 may be located to pass through the center of the second pixel 112.

As shown in FIG. 43, the cell isolation film 102 in each pixel located at the edge of the pixel array 1100 may be shifted toward the center portion of the pixel array 1100. Accordingly, the cell isolation film 102 may be located at the edge of each pixel, on the edge portion of the pixel array 1100. In an example embodiment, a degree of deviating the cell isolation film 102 from the center of each pixel at the edge portion of the pixel array 1100 may be increased as the CRA increases.

Figure 44:
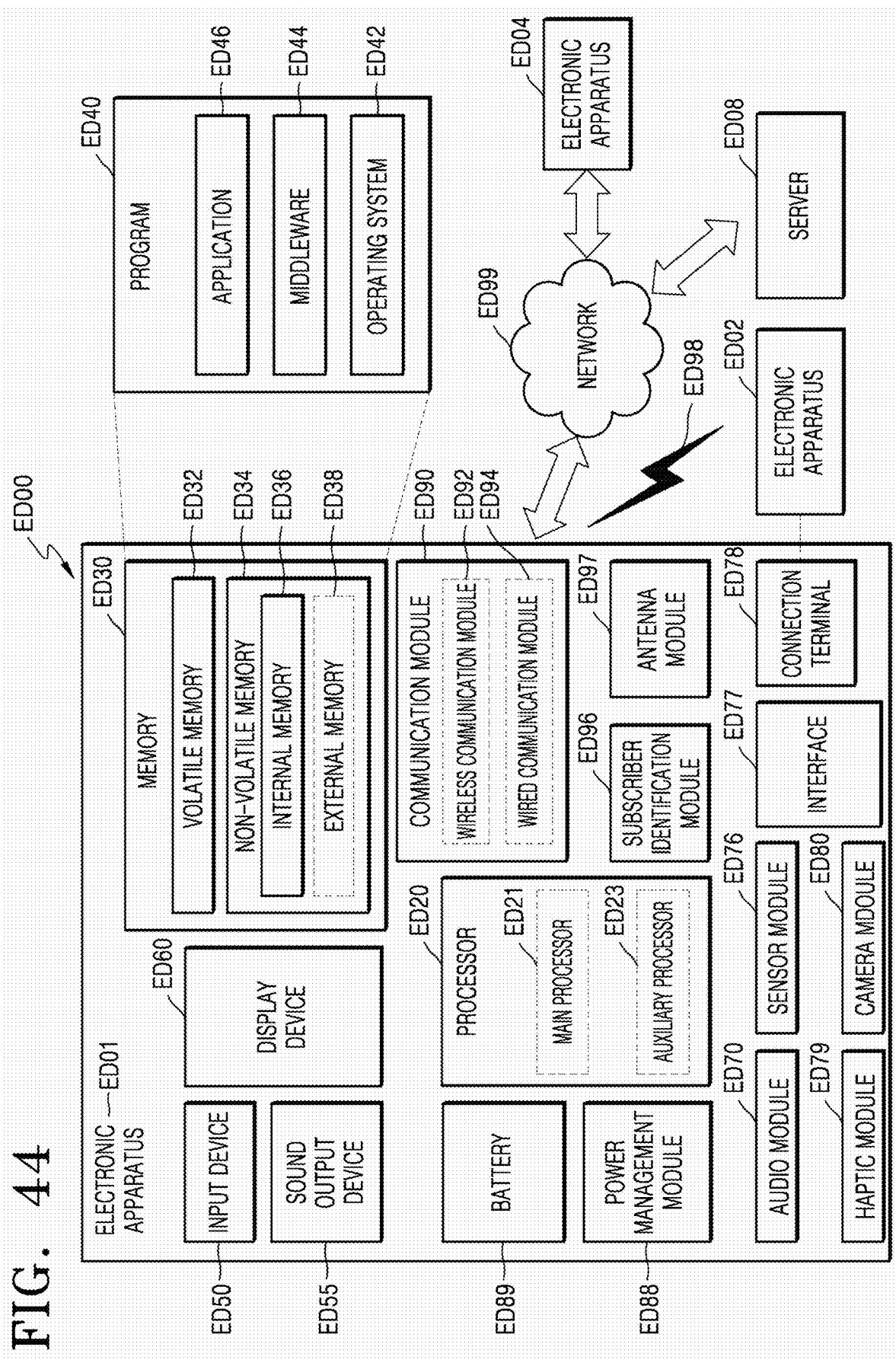
FIG. 44 is a block diagram showing an example of an electronic apparatus including an image sensor according to an example embodiment.

FIG. 44 is a block diagram showing an example of an electronic apparatus ED01 including the image sensor 1000. Referring to FIG. 44, in a network environment ED00, the electronic apparatus ED01 may communicate with another electronic apparatus ED02 via a first network ED98 (short-range wireless communication network, etc.), or may communicate with another electronic apparatus ED04 and/or a server ED08 via a second network ED99 (long-range wireless communication network, etc.) The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60, etc.) of the elements may be omitted or another element may be added. Some of the elements may be configured as one integrated circuit. For example, the sensor module ED76 (a fingerprint sensor, an iris sensor, an illuminance sensor, etc.) may be embedded and implemented in the display device ED60 (display, etc.)

The processor ED20 may control one or more elements (hardware, software elements, etc.) of the electronic apparatus ED01 connected to the processor ED20 by executing software (program ED40, etc.), and may perform various data processes or operations. As a part of the data processing or operations, the processor ED20 may load a command and/or data received from another element (sensor module ED76, communication module ED90, etc.) to a volatile memory ED32, may process the command and/or data stored in the volatile memory ED32, and may store result data in a non-volatile memory ED34. The processor ED20 may include a main processor ED21 (central processing unit, application processor, etc.) and an auxiliary processor ED23 (graphic processing unit, image signal processor, sensor hub processor, communication processor, etc.) that may be operated independently from or along with the main processor ED21. The auxiliary processor ED23 may use less power than that of the main processor ED21, and may perform specified functions.

The auxiliary processor ED23, on behalf of the main processor ED21 while the main processor ED21 is in an inactive state (sleep state) or along with the main processor ED21 while the main processor ED21 is in an active state (application executed state), may control functions and/or states related to some (display device ED60, sensor module ED76, communication module ED90, etc.) of the elements in the electronic apparatus ED01. The auxiliary processor ED23 (image signal processor, communication processor, etc.) may be implemented as a part of another element (camera module ED80, communication module ED90, etc.) that is functionally related thereto.

The memory ED30 may store various data required by the elements (processor ED20, sensor module ED76, etc.) of the electronic apparatus ED01. The data may include, for example, input data and/or output data about software (program ED40, etc.) and commands related thereto. The memory ED30 may include the volatile memory ED32 and/or the non-volatile memory ED34. The non-volatile memory ED34 may include an internal memory ED36 fixedly installed in the electronic apparatus ED01, and an external memory ED38 that is detachable.

The program ED40 may be stored as software in the memory ED30, and may include an operation system ED42, middle ware ED44, and/or an application ED46.

The input device ED50 may receive commands and/or data to be used in the elements (processor ED20, etc.) of the electronic apparatus ED01, from outside (user, etc.) of the electronic apparatus ED01. The input device ED50 may include a microphone, a mouse, a keyboard, and/or a digital pen (stylus pen).

The sound output device ED55 may output a sound signal to outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a part of the speaker or may be implemented as an independent device.

The display device ED60 may provide visual information to outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (pressure sensor, etc.) that is set to measure a strength of a force generated by the touch.

The audio module ED70 may convert sound into an electrical signal or vice versa. The audio module ED70 may acquire sound through the input device ED50, or may output sound via the sound output device ED55 and/or a speaker and/or a headphone of another electronic apparatus (electronic apparatus ED02, etc.) connected directly or wirelessly to the electronic apparatus ED01.

The sensor module ED76 may sense an operating state (power, temperature, etc.) of the electronic apparatus ED01, or an outer environmental state (user state, etc.), and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (electronic apparatus ED02, etc.) The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (electronic apparatus ED02, etc.). The connection terminal ED78 may include an HDMI connector, a USB connector, an SD card connector, and/or an audio connector (headphone connector, etc.).

The haptic module ED79 may convert the electrical signal into a mechanical stimulation (vibration, motion, etc.) or an electric stimulation that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 of FIG. 1, image signal processors, and/or flashes. The lens assembly included in the camera module ED80 may collect light emitted from an object that is an object to be captured.

The power management module ED88 may manage the power supplied to the electronic apparatus ED01. The power management module ED88 may be implemented as a part of a power management integrated circuit (PMIC).

The battery ED89 may supply electric power to components of the electronic apparatus ED01. The battery ED89 may include a primary battery that is not rechargeable, a secondary battery that is rechargeable, and/or a fuel cell.

The communication module ED90 may support the establishment of a direct (wired) communication channel and/or a wireless communication channel between the electronic apparatus ED01 and another electronic apparatus (electronic apparatus ED02, electronic apparatus ED04, server ED08, etc.), and execution of communication through the established communication channel. The communication module ED90 may be operated independently from the processor ED20 (application processor, etc.), and may include one or more communication processors that support the direct communication and/or the wireless communication. The communication module ED90 may include a wireless communication module ED92 (cellular communication module, a short-range wireless communication module, a global navigation satellite system (GNSS) communication module) and/or a wired communication module ED94 (local area network (LAN) communication module, a power line communication module, etc.). From among the communication modules, a corresponding communication module may communicate with another electronic apparatus via a first network ED09 (short-range communication network such as Bluetooth, WiFi direct, or infrared data association (IrDA)) or a second network ED99 (long-range communication network such as a cellular network, Internet, or computer network (LAN, WAN, etc.)). Such above various kinds of communication modules may be integrated as one element (single chip, etc.) or may be implemented as a plurality of elements (a plurality of chips) separately from one another. The wireless communication module ED92 may identify and authenticate the electronic apparatus ED01 in a communication network such as the first network ED98 and/or the second network ED99 by using subscriber information (international mobile subscriber identifier (IMSI), etc.) stored in the subscriber identification module ED96.

The antenna module ED97 may transmit or receive the signal and/or power to and/or from outside (another electronic apparatus, etc.). An antenna may include a radiator formed as a conductive pattern formed on a substrate (PCB, etc.). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (RFIC, etc.) other than the antenna may be included as a part of the antenna module ED97.

Some of the elements may be connected to one another via the communication method among the peripheral devices (bus, general purpose input and output (GPIO), serial peripheral interface (SPI), mobile industry processor interface (MIPI), etc.) and may exchange signals (commands, data, etc.).

The command or data may be transmitted or received between the electronic apparatus ED01 and the external electronic apparatus ED04 via the server ED08 connected to the second network ED99. Other electronic apparatuses ED02 and ED04 may be the devices that are the same as or different kinds from the electronic apparatus ED01. All or some of the operations executed in the electronic apparatus ED01 may be executed in one or more devices among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request execute an additional function or service related to the request and may transfer a result of the execution to the electronic apparatus ED01. To do this, for example, a cloud computing, a distributed computing, or a client-server computing technique may be used.

Figure 45:
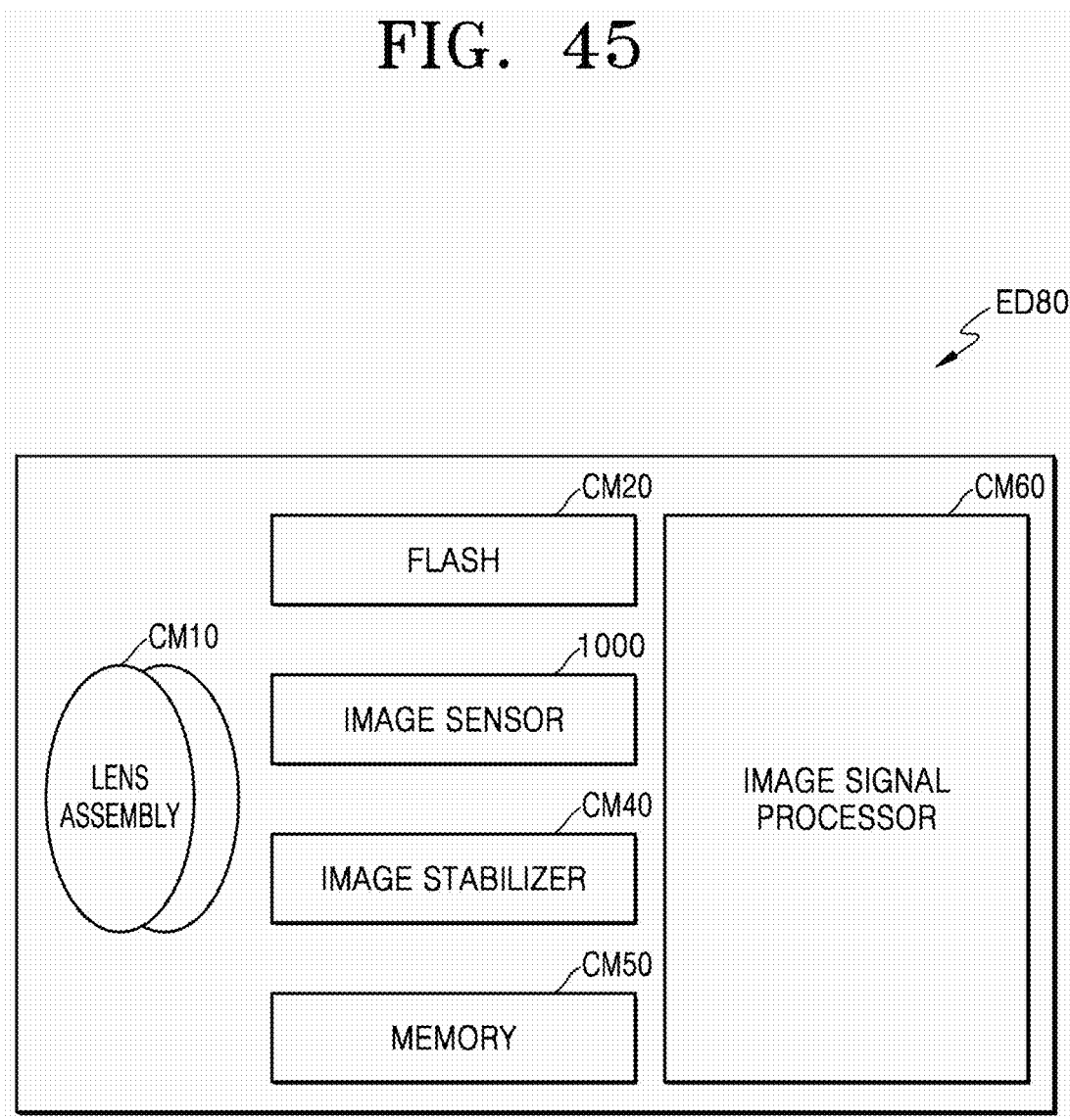
FIG. 45 is a block diagram showing a camera module of FIG. 44.

FIG. 45 is a block diagram showing the camera module ED80 of FIG. 44.

Referring to FIG. 45, the camera module ED80 may include a lens assembly CM10, a flash CM20, an image sensor 1000 (the image sensor 1000 of FIG. 1), an image stabilizer CM40, a memory CM50 (buffer memory, etc.), and/or an image signal processor CM60. The lens assembly CM10 may collect light emitted from an object, that is, an object to be captured. The camera module ED80 may include a plurality of lens assemblies CM10, and in this case, the camera module ED80 may include a dual camera module, a 360-degree camera, or a spherical camera. Some of the plurality of lens assemblies CM10 may have the same lens properties (viewing angle, focal distance, auto-focus, F number, optical zoom, etc.) or different lens properties. The lens assembly CM10 may include a wide-angle lens or a telephoto lens.

The flash CM20 may emit light that is used to strengthen the light emitted or reflected from the object. The flash CM20 may include one or more light-emitting diodes (red-green-blue (RGB) LED, white LED, infrared LED, ultra-violet LED, etc.), and/or a Xenon lamp. The image sensor 1000 may be the image sensor described above with reference to FIG. 1, and converts the light emitted or reflected from the object and transferred through the lens assembly CM10 into an electrical signal to obtain an image corresponding to the object. The image sensor 1000 may include one or more selected sensors from among image sensors having different properties such as an RGB sensor, a black-and-white (BW) sensor, an IR sensor, and a UV sensor. Each of the sensors included in the image sensor 1000 may be implemented as a charge coupled device (CCD) sensor and/or a complementary metal oxide semiconductor (CMOS) sensor.

The image stabilizer CM40, in response to a motion of the camera module ED80 or the electronic apparatus ED01 including the camera module ED80, moves one or more lenses included in the lens assembly CM10 or the image sensor 1000 in a certain direction or controls the operating characteristics of the image sensor 1000 (adjusting of a read-out timing, etc.) to compensate for a negative influence of the motion. The image stabilizer CM40 may sense the movement of the camera module ED80 or the electronic apparatus ED01 by using a gyro sensor or an acceleration sensor arranged in or out of the camera module ED80. The image stabilizer CM40 may be implemented as an optical type.

The memory CM50 may store some or entire data of the image obtained through the image sensor 1000 for next image processing operation. For example, when a plurality of images are obtained at a high speed, obtained original data (Bayer-patterned data, high resolution data, etc.) is stored in the memory CM50, and a low resolution image is only displayed. Then, original data of a selected image (user selection, etc.) may be transferred to the image signal processor CM60. The memory CM50 may be integrated with the memory ED30 of the electronic apparatus ED01, or may include an additional memory that is operated independently.

The image signal processor CM60 may perform image treatment on the image obtained through the image sensor 1000 or the image data stored in the memory CM50. The image treatments may include a depth map generation, a three-dimensional modeling, a panorama generation, extraction of features, an image combination, and/or an image compensation (noise reduction, resolution adjustment, brightness adjustment, blurring, sharpening, softening, etc.). The image signal processor CM60 may perform controlling (exposure time control, read-out timing control, etc.) of the elements (image sensor 1000, etc.) included in the camera module ED80. The image processed by the image signal processor CM60 may be stored again in the memory CM50 for additional process, or may be provided to an external element of the camera module ED80 (e.g., the memory ED30, the display device ED60, the electronic apparatus ED02, the electronic apparatus ED04, the server ED08, etc.). The image signal processor CM60 may be integrated with the processor ED20, or may be configured as an additional processor that is independently operated from the processor ED20. When the image signal processor CM60 is configured as an additional processor separately from the processor ED20, the image processed by the image signal processor CM60 undergoes through an additional image treatment by the processor ED20 and then may be displayed on the display device ED60.

Also, the image signal processor CM60 may receive two focusing signals independently from each of the pixels in the image sensor 1000, and may generate an auto-focusing signal from a difference between the two focusing signals in the phase-detection auto-focusing method. The image signal processor CM60 may control the lens assembly CM10 so that the focus of the lens assembly CM10 may be accurately formed on the surface of the image sensor 1000 based on the auto-focusing signal.

The electronic apparatus ED01 may include a plurality of camera modules ED80 having different properties or functions. In this case, one of the plurality of camera modules ED80 may include a wide-angle camera and another camera module ED80 may include a telephoto camera. Similarly, one of the plurality of camera modules ED80 may include a front camera and another camera module ED80 may include a rear camera.

FIGS. 46 to 55 are diagrams showing various examples of an electronic apparatus including an image sensor according to one or more embodiments.

Figure 46:
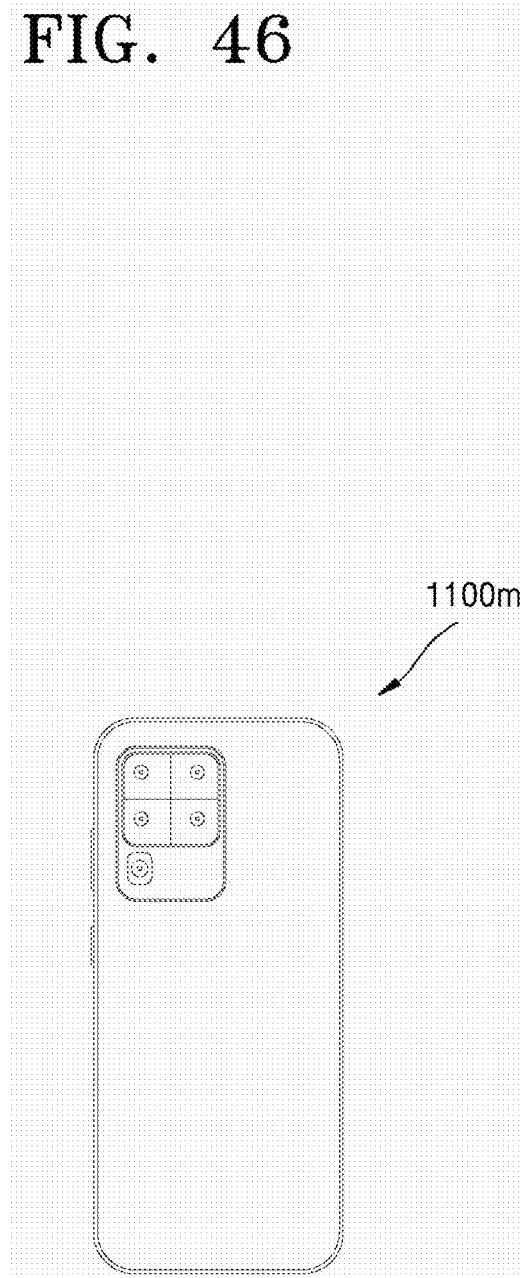
FIGS. 46 to 55 are diagrams showing various examples of an electronic apparatus including an image sensor according to one or more example embodiments.
Figure 47:
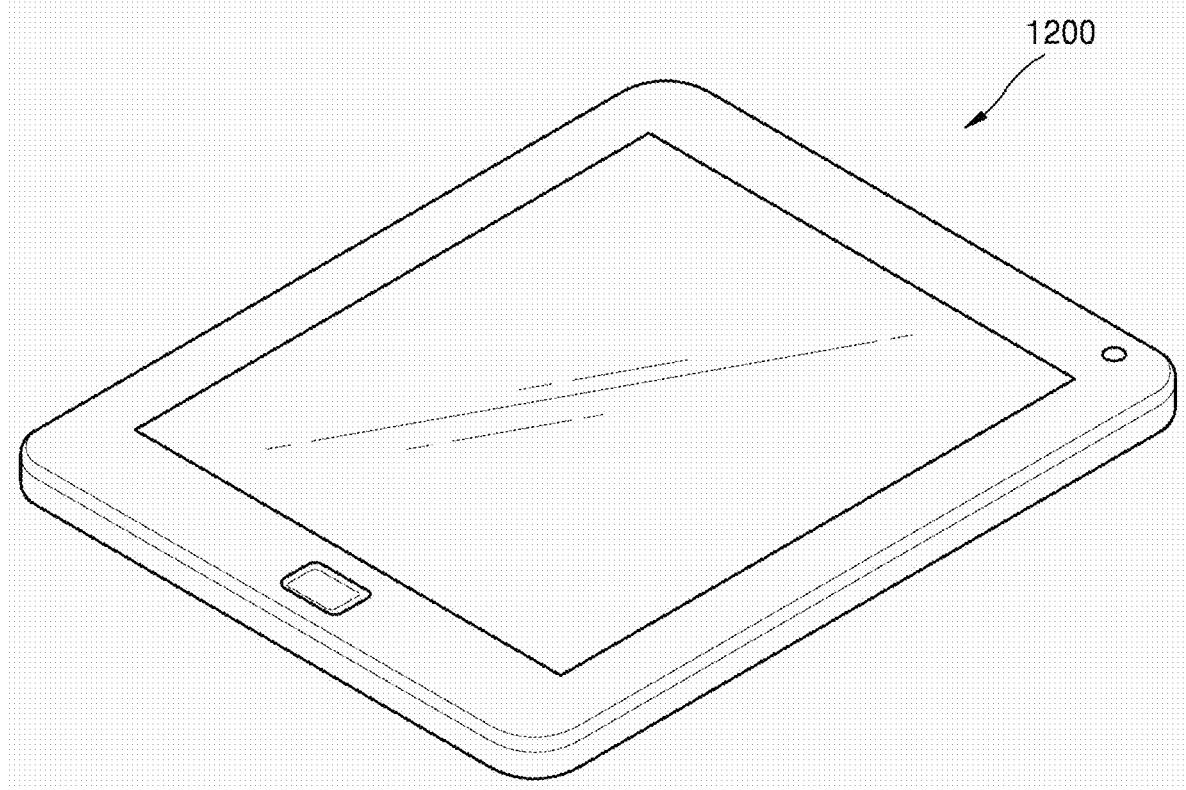
Figure 48:
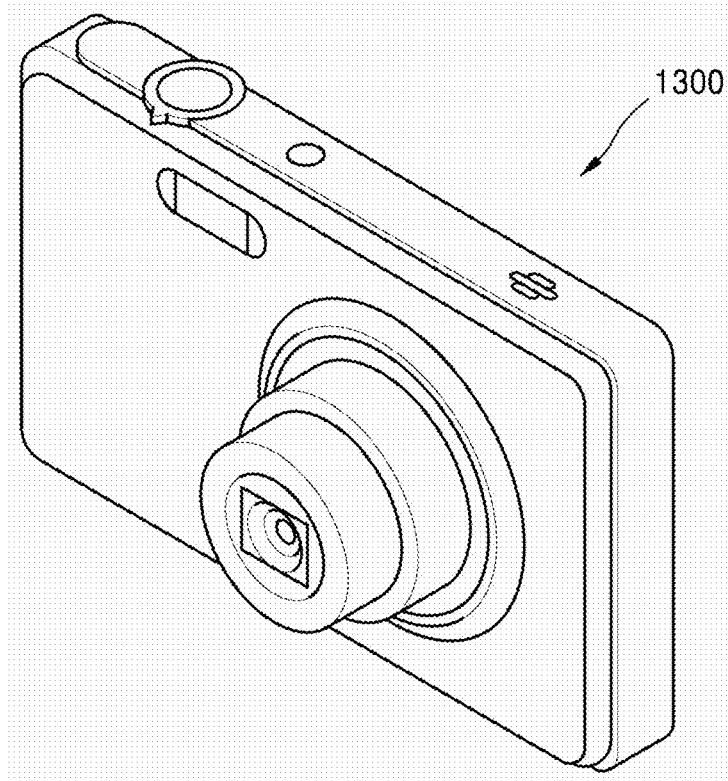
Figure 49:
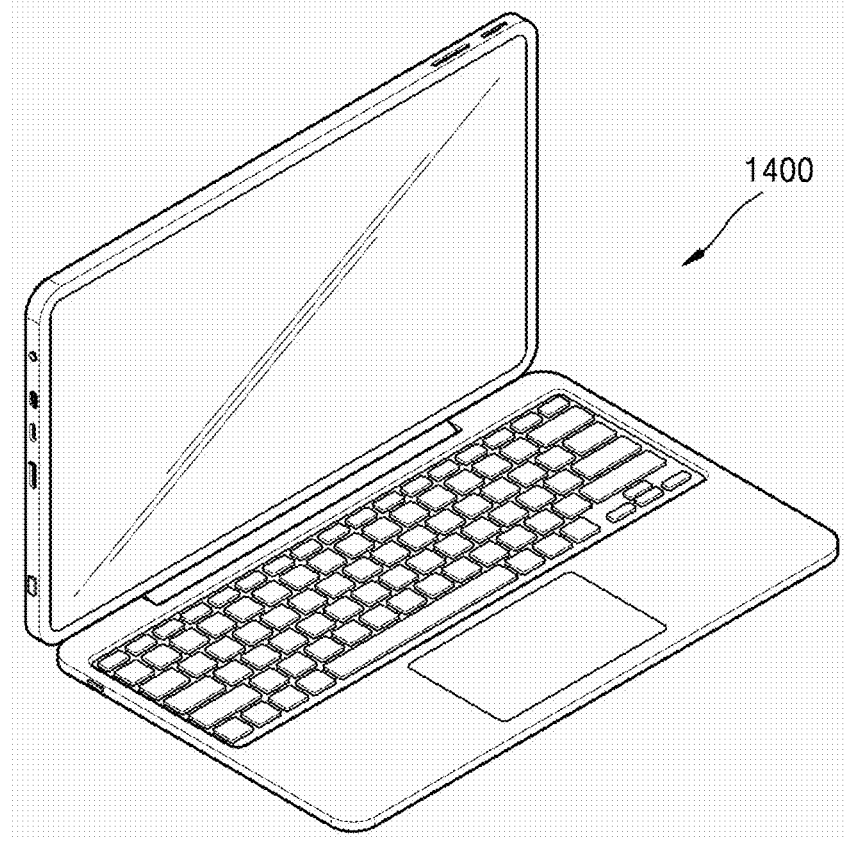
Figure 50:
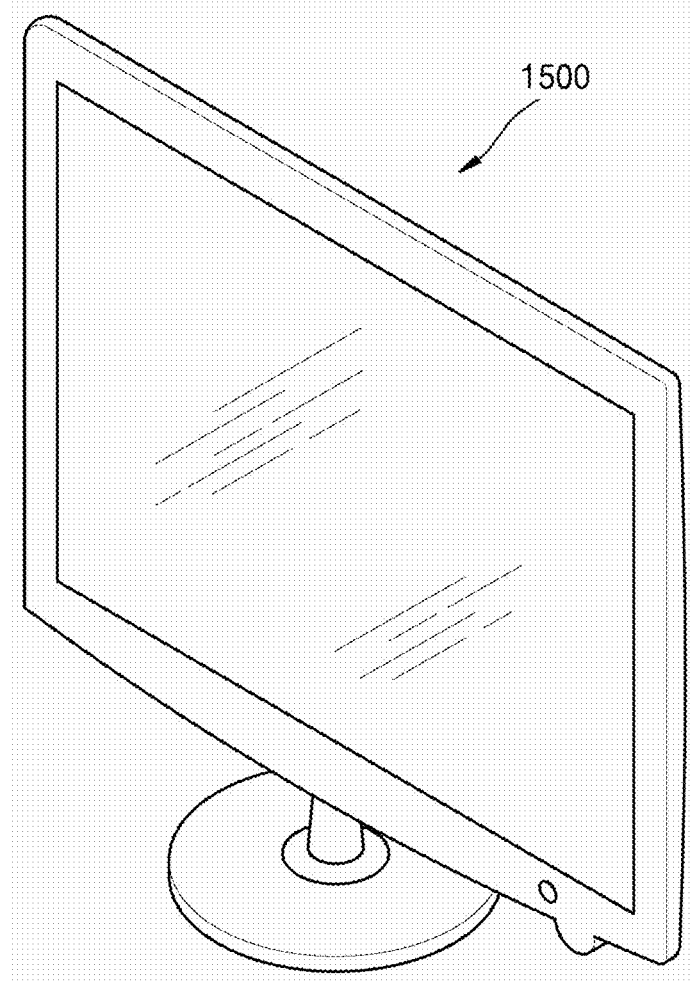

The image sensor 1000 according to the embodiments may be applied to a mobile phone or a smartphone 1100m shown in FIG. 46, a tablet or a smart tablet 1200 shown in FIG. 47, a digital camera or a camcorder 1300 shown in FIG. 48, a laptop computer 1400 shown in FIG. 49, or a television or a smart television 1500 shown in FIG. 50. For example, the smartphone 1100m or the smart tablet 1200 may include a plurality of high-resolution cameras each including a high-resolution image sensor. Depth information of objects in an image may be extracted, out focusing of the image may be adjusted, or objects in the image may be automatically identified by using the high-resolution cameras.

Figure 51:
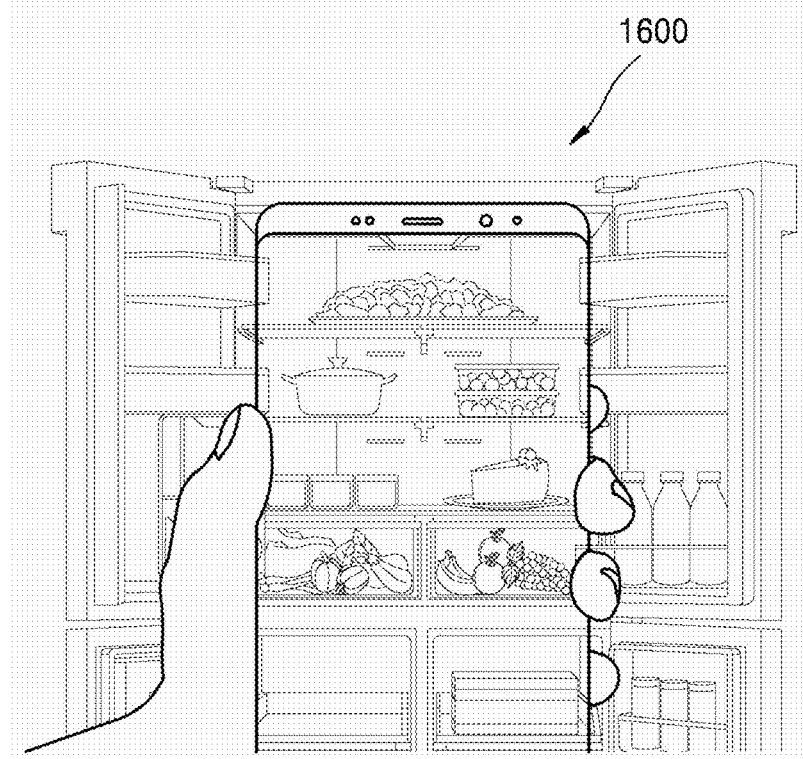
Figure 52:
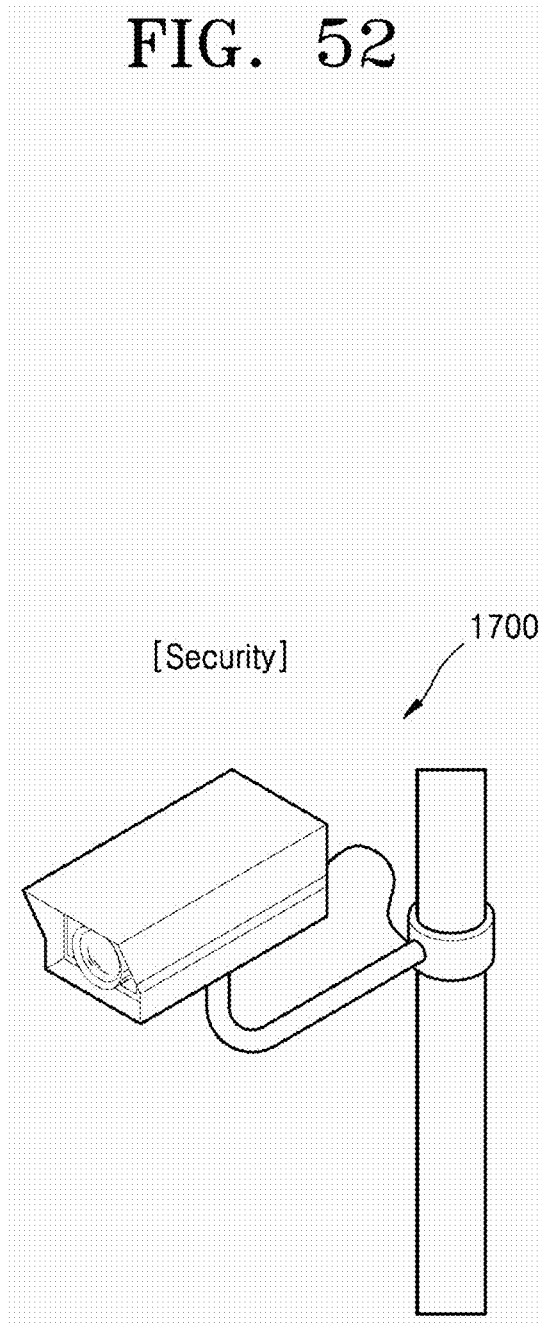
Figure 53:
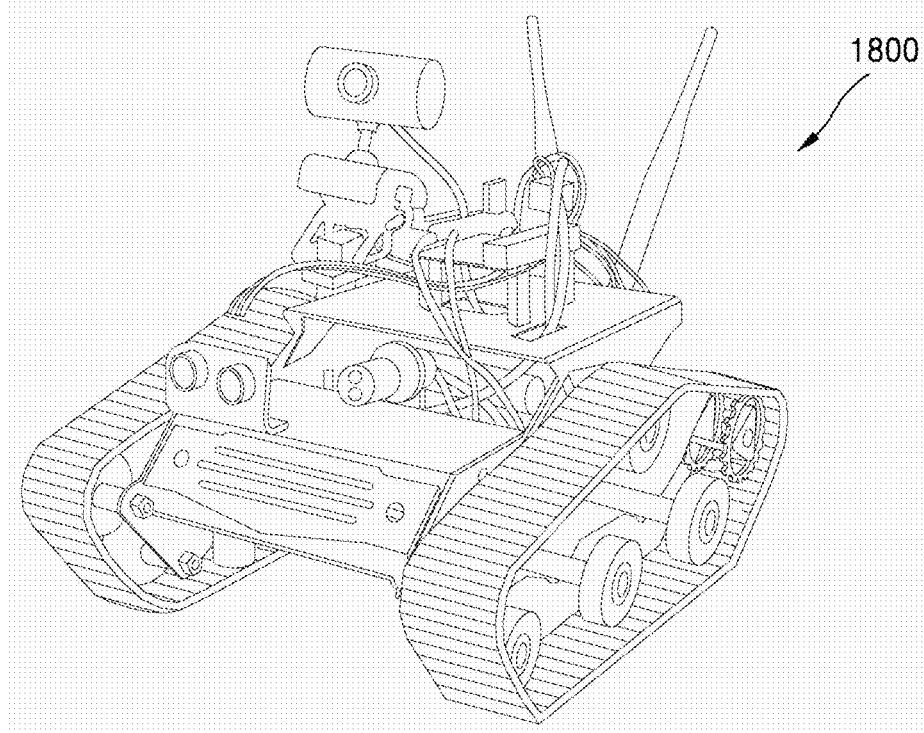
Figure 54:
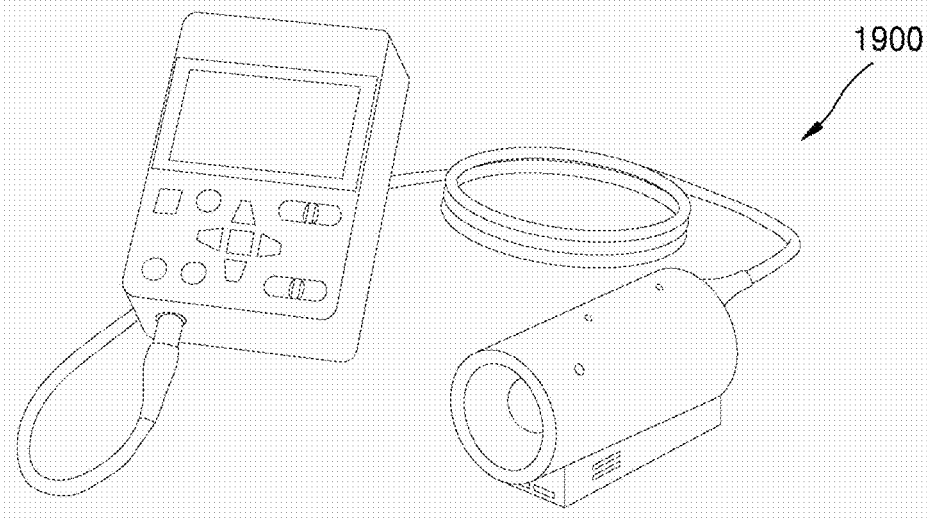

Also, the image sensor 1000 may be applied to a smart refrigerator 1600 shown in FIG. 51, a surveillance camera 1700 shown in FIG. 52, a robot 1800 shown in FIG. 53, a medical camera 1900 shown in FIG. 54, etc. For example, the smart refrigerator 1600 may automatically recognize food in the refrigerator by using the image sensor, and may notify the user of an existence of a certain kind of food, kinds of food put into or taken out, etc. through a smartphone. Also, the surveillance camera 1700 may provide an ultra-high-resolution image and may allow the user to recognize an object or a person in the image even in dark environment by using high sensitivity. The robot 1900 may be input to a disaster or industrial site that a person may not directly access, to provide the user with high-resolution images. The medical camera 1900 may provide high-resolution images for diagnosis or surgery, and may dynamically adjust a field of view.

Figure 55:
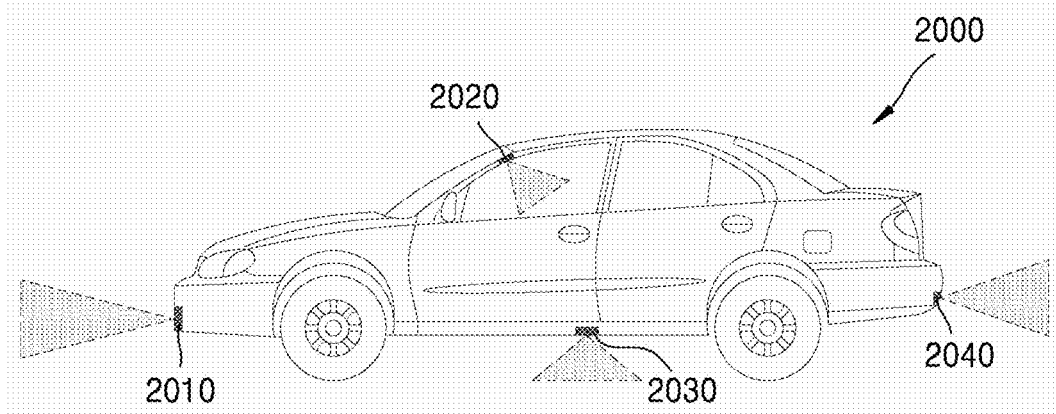

Also, the image sensor 1000 may be applied to a vehicle 2000 as shown in FIG. 55. The vehicle 2000 may include a plurality of vehicle cameras 2010, 2020, 2030, and 2040 at various locations. Each of the vehicle cameras 2010, 2020, 2030, and 2040 may include the image sensor according to the one or more example embodiments. The vehicle 2000 may provide a driver with various information about the interior of the vehicle 2000 or the periphery of the vehicle 2000 by using the plurality of vehicle cameras 2010, 2020, 2030, and 2040, and may provide the driver with the information related to the autonomous travel by automatically recognizing an object or a person in the image.

The disclosure may provide an image sensor having a low reflectivity and an improved quantum efficiency and an electronic apparatus including the image sensor.

The disclosure may provide an image sensor manufactured at low costs and an electronic apparatus including the image sensor.

However, effects of the disclosure are not limited to the above disclosure.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

It should be understood that embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
a sensor substrate including a plurality of first pixels, configured to sense light of a first wavelength, and a plurality of second pixels, configured to sense light of a second wavelength; and
an anti-reflection element provided on the sensor substrate,
wherein the anti-reflection element includes:
a plurality of low-refractive index patterns; and
a high-refractive index layer provided between the plurality of low-refractive index patterns and the sensor substrate,
wherein each of the plurality of low-refractive index patterns is provided directly on the high-refractive index layer, and
wherein the plurality of low-refractive index patterns are two-dimensionally arranged, in a plan view, on the high-refractive index layer.

2. The image sensor of claim 1, wherein a thickness of the high-refractive index layer is in a range from about 5 nm to about 50 nm.

3. The image sensor of claim 1, wherein
the sensor substrate includes a first region, on which light is incident at a first chief ray angle (CRA), and a second region, on which light is incident at a second CRA that is greater than the first CRA,
an arrangement period and a fill factor of the plurality of low-refractive index patterns on the second region are greater than an arrangement period and a fill factor of the plurality of low-refractive index patterns on the first region, respectively, and
the fill factor of the plurality of low-refractive index patterns is defined as a ratio of a width of a low-refractive index pattern to the arrangement period of the plurality of low-refractive index patterns.

4. The image sensor of claim 1, further comprising a color separating lens array configured to condense the light of the first wavelength on the plurality of first pixels after changing a phase of the light of the first wavelength and condense the light of the second wavelength on the plurality of second pixels after changing a phase of the light of the second wavelength.

5. The image sensor of claim 4, wherein the color separating lens array is provided between the sensor substrate and the anti-reflection element.

6. The image sensor of claim 4, wherein the anti-reflection element is provided between the color separating lens array and the sensor substrate.

7. The image sensor of claim 6, further comprising
a color filter array provided between the anti-reflection element and the color separating lens array,
wherein the color filter array comprises:
a plurality of first color filters arranged to respectively correspond to the plurality of first pixels and configured to selectively transmit the light of the first wavelength; and
a plurality of second color filters arranged to respectively correspond to the plurality of second pixels and configured to selectively transmit the light of the second wavelength.

8. The image sensor of claim 4, wherein
the color separating lens array includes a plurality of nanoposts and a peripheral material layer surrounding the plurality of nanoposts, and
the plurality of nanoposts and the plurality of low-refractive index patterns are aligned with each other in a direction perpendicular to an upper surface of the sensor substrate.

9. The image sensor of claim 4, wherein
the color separating lens array includes a plurality of nanoposts and a peripheral material layer surrounding the plurality of nanoposts, and
the plurality of nanoposts and the plurality of low-refractive index patterns are arranged to be deviated from each other in a direction perpendicular to an upper surface of the sensor substrate.

10. The image sensor of claim 4, wherein
the color separating lens array includes a lower array and an upper array provided on the lower array, and
each of the lower array and the upper array includes a plurality of nanoposts and a peripheral material layer surrounding the plurality of nanoposts.

11. The image sensor of claim 10, wherein
the plurality of nanoposts of the upper array and the plurality of low-refractive index patterns are aligned with each other in a direction perpendicular to an upper surface of the sensor substrate.

12. The image sensor of claim 1, wherein
the plurality of low-refractive index patterns include $SiO_2$, and
the high-refractive index layer includes at least one from AlO, SiN, and HfO.

13. The image sensor of claim 1, further comprising a plurality of cell isolation films provided on each of the plurality of first pixels and each of the plurality of second pixels.

14. The image sensor of claim 13, wherein
cell isolation films provided on corresponding first pixels or second pixels, which are at a center portion of the sensor substrate, are respectively on centers of corresponding pixels, and
cell isolation films provided on corresponding first pixels or second pixels, which are at an edge portion of the sensor substrate, are respectively shifted toward the center portion of the sensor substrate from centers of corresponding pixels.

15. An image sensor comprising:
a sensor substrate including a plurality of first pixels, configured to sense light of a first wavelength, and a plurality of second pixels, configured to sense light of a second wavelength; and
an anti-reflection element provided on the sensor substrate,
wherein the anti-reflection element includes:
a low-refractive index layer having a plurality of anti-reflection holes; and
a high-refractive index layer provided between the low-refractive index layer and the sensor substrate,
wherein each of plurality of anti-reflection holes is provided directly on the high-refractive index layer, and
wherein the plurality of anti-reflection holes are two-dimensionally arranged, in a plan view, on the high-refractive index layer.

16. The image sensor of claim 15, wherein a thickness of the high-refractive index layer is in a range from about 5 nm to about 50 nm.

17. The image sensor of claim 15, wherein
the sensor substrate includes a first region on which light is incident at a first chief ray angle (CRA), and a second region on which light is incident at a second CRA that is greater than the first CRA,
an arrangement period and a fill factor of the plurality of anti-reflection holes in the second region are greater than an arrangement period and a fill factor of the plurality of anti-reflection holes in the first region, respectively, and
the fill factor of the plurality of anti-reflection holes is defined as a ratio of a width of an anti-reflection hole to the arrangement period of the plurality of anti-reflection holes.

18. An electronic apparatus comprising:
an image sensor configured to convert an optical image into an electrical signal;
a processor configured to control operations of the image sensor and configured to store and output a signal generated by the image sensor; and
a lens assembly configured to provide light to the image sensor,
wherein the image sensor comprises:
a sensor substrate including a plurality of first pixels, configured to sense light of a first wavelength, and a plurality of second pixels, configured to sense light of a second wavelength; and
an anti-reflection element provided on the sensor substrate,
wherein the anti-reflection element includes:
a plurality of low-refractive index patterns; and
a high-refractive index layer provided between the plurality of low-refractive index patterns and the sensor substrate,
wherein each of the plurality of low-refractive index patterns is provided directly on the high-refractive index layer, and
wherein the plurality of low-refractive index patterns are two-dimensionally arranged, in a plan view, on the high-refractive index layer.

19. The electronic apparatus of claim 18, wherein a thickness of the high-refractive index layer is in a range from about 5 nm to about 50 nm.

20. The electronic apparatus of claim 18, wherein
the sensor substrate includes a first region on which light is incident at a first chief ray angle (CRA), and a second region on which light is incident at a second CRA that is greater than the first CRA,
an arrangement period and a fill factor of the plurality of low-refractive index patterns on the second region are greater than an arrangement period and a fill factor of the plurality of low-refractive index patterns on the first region, respectively, and
the fill factor of the plurality of low-refractive index patterns is defined as a ratio of a width of a low-refractive index pattern to the arrangement period of the plurality of low-refractive index patterns.

* * * * *